(12) United States Patent
Luther et al.

(10) Patent No.: US 12,104,106 B2
(45) Date of Patent: Oct. 1, 2024

(54) COMPOSITIONS OF CHIRAL MOLECULES AND PEROVSKITE NANOCRYSTALS AND METHODS OF MAKING THE SAME

(71) Applicant: Alliance for Sustainable Energy, LLC, Golden, CO (US)

(72) Inventors: Joseph Matthew Luther, Boulder, CO (US); Matthew Craig Beard, Arvada, CO (US); Young-Hoon Kim, Lakewood, CO (US)

(73) Assignee: Alliance for Sustainable Energy, LLC, Golden, CO (US)

(*) Notice: Subject to any disclaimer, the term of this patent is extended or adjusted under 35 U.S.C. 154(b) by 670 days.

(21) Appl. No.: 17/360,064

(22) Filed: Jun. 28, 2021

(65) Prior Publication Data

US 2022/0002619 A1    Jan. 6, 2022

Related U.S. Application Data

(60) Provisional application No. 63/047,208, filed on Jul. 1, 2020.

(51) Int. Cl.
| | |
|---|---|
| *C09K 11/66* | (2006.01) |
| *C07F 7/24* | (2006.01) |
| *C09K 11/02* | (2006.01) |
| *G02B 1/08* | (2006.01) |
| *H01F 10/32* | (2006.01) |
| *H10K 30/10* | (2023.01) |
| *H10N 50/80* | (2023.01) |

(52) U.S. Cl.
CPC ........... *C09K 11/664* (2013.01); *C07F 7/24* (2013.01); *C09K 11/025* (2013.01); *C09K 11/665* (2013.01); *H01F 10/3259* (2013.01); *H10N 50/80* (2023.02); *G02B 1/08* (2013.01); *H10K 30/10* (2023.02)

(58) Field of Classification Search
CPC ............... C09K 11/025; C09K 11/665; C09K 11/664; C07F 7/24
See application file for complete search history.

(56) References Cited

FOREIGN PATENT DOCUMENTS

CN          108129326         *   6/2018

OTHER PUBLICATIONS

He et al., "Spectropic studies of chiral perovskite nanocrystals", Applied Physics Lerrers, 111, 151102 (2017), 151102-1 to 151102-4, Oct. 12, 2017.*
Shi et al., "Endowing Perovskite Nanocrystals with Circularly Polarized Luminescence", Advanced Materials, 2018, 30, 1705011, 7 pages, Jan. 24, 2018.*

(Continued)

*Primary Examiner* — C Melissa Koslow
(74) *Attorney, Agent, or Firm* — Michael A. McIntyre

(57) ABSTRACT

The present disclosure relates to a composition that includes a nanocrystalline core that includes a perovskite and having an outer surface, and a chiral molecule having a functional group, where the functional group is bonded to a first portion of the outer surface, and the composition is capable of circularly polarized luminescence (CPL). In some embodiments of the present disclosure, the composition is capable of absorbing circularly-polarized light.

14 Claims, 55 Drawing Sheets

(56) References Cited

OTHER PUBLICATIONS

Chen at al, "Two-Photon Absorption-Based Upconveted Circularly Polarized Luminescence Geneated in Chiral Perovskite Nanocrystals", J. Phys. Chem. Let, 2019, 10, 3290-3295, May 30, 2019.*
Ahn, J. et al., "A new class of chiral semiconductors: chiral-organic-molecule-incorporating organic-inorganic hybrid perovskites," RSC Materials Horizons, vol. 4, 2017, 6 pages.
Ahn, J. et al., "Chiral 2D Organic Inorganic Hybrid Perovskite with Circular Dichroism Tunable Over Wide Wavelength Range," Journal of the American Chemical Society, vol. 142, 2020, 7 pages.
Chen, C. et al., "Circularly polarized light detection using chiral hybrid perovskite," Nature Communications, 2019, https://doi.org/10.1038/s41467-019-09942-z, 7 pages.
Chen, W. et al., "Two-Photon Absorption-Based Upconverted Circularly Polarized Luminescence Generated in Chiral Perovskite Nanocrystals," Journal of Physical Chemistry Letters, vol. 10, 2019, 6 pages.
Chen, X. et al., "Impact of Layer Thickness on the Charge Carrier and Spin Coherence Lifetime in Two-Dimensional Layered Perovskite Single Crystals," ACS Energy Letters, vol. 3, 2018, 7 pages.
De Roo, J. et al., "Highly Dynamic Ligand Binding and Light Absorption Coefficient of Cesium Lead Bromide Perovskite Nanocrystals," ACS Nano, vol. 10, 2016, 11 pages.
Georgieva, Z.N. et al., "Imprinting Chirality onto the Electronic States of Colloidal Perovskite Nanoplatelets," Advanced Materials Communication, vol. 30, 2018, 5 pages.
Jiang, M. et al., "Engineering Green-to-Blue Emitting CsPbBr3 Quantum-Dot Films with Efficient Ligand Passivation," ACS Energy Letters, vol. 4, 2019, 8 pages.
Kim, Y-H et al., "High efficiency perovskite light-emitting diodes of ligand-engineered colloidal formamidinium lead bromide nanoparticles," Elsevier Nano Energy, vol. 38, 2017, 8 pages.
Kim, Y-H et al., "Strategies to Improve Luminescence Efficiency of Metal-Halide Perovskites and Light-Emitting Diodes," Advanced Materials Progress Report, vol. 31, 2019, 28 pages.
Kuznetsova, V.A. et al., "Effect of Chiral Ligand Concentration and Binding Mode on Chiroptical Activity of CdSe/CdS Quantum Dots," ACS Nano, vol. 13, 2019, 13 pages.
Li, J. et al., "50-Fold EQE Improvement up to 6.27% of Solution-Processed All-Inorganic Perovskite CsPbBr3 QLEDs via Surface Ligand Density Control," Advanced Materials, vol. 29, 2017, 9 pages.
Li, G. et al., "Surface Ligand Engineering for Near-Unity Quantum Yield Inorganic Halide Perovskite QDs and High-Performance QLEDs," Chemistry of Materials, vol. 30, 2018, 9 pages.
Liu, X. et al., "Circular photogalvanic spectroscopy of Rashba splitting in 2D hybrid organic-inorganic perovskite multiple quantum wells," Nature Communications, https://doi.org/10.1038/s41467-019-14073-6, 8 pages.
Long, G. et al., "Spin control in reduced-dimensional chiral perovskites," Nature Photonics Letters, vol. 12, 2018, 7 pages.
Long, G. et al., "Theoretical Prediction of Chiral 3D Hybrid Organic-Inorganic Perovskites," Advanced Materials Communication, vol. 31, 2019, 6 pages.
Long, G. et al., "Chiral-perovskite optoelectronics," Nature Reviews Materials, vol. 5, 2020, 17 pages.
Lu, H. et al., "Spin-dependent charge transport through 2D chiral hybrid lead-iodide perovskites," Science Advances Research Article, vol. 5, 2019, 8 pages.
Ma, J. et al., "Chiral 2D Perovskites with a High Degree of Circularly Polarized Photoluminescence," ACS Nano, vol. 13, 2019, 7 pages.
Protesescu, L. et al., "Nanocrystals of Cesium Lead Halide Perovskites (CsPbX3, X=Cl, Br, and I): Novel Optoelectronic Materials Showing Bright Emission with Wide Color Gamut," Nano Letters, vol. 15, 2015, 5 pages.
Protesescu, L. et al., "Monodisperse Formamidinium Lead Bromide Nanocrystals with Bright and Stable Green Photoluminescence," Journal of the American Chemical Society, vol. 138, 2016, 4 pages.
Protesescu, L. et al., "Dismantling the "Red Wall" of Colloidal Perovskites: Highly Luminescent Formamidinium and Formamidinium-Cesium Lead Iodide Nanocrystals," ACS Nano, vol. 11, 2017, 16 pages.
Shi, Y. et al., "Endowing Perovskite Nanocrystals with Circularly Polarized Luminescence," Advanced Materials Communication, vol. 30, 2018, 7 pages.
Suri, M. et al., "Enhanced Open-Circuit Voltage of Wide-Bandgap Perovskite Photovoltaics by Using Alloyed (FA1- xCsx)Pb(I1-xBrx)3 Quantum Dots," ACS Energy Letters, vol. 4, 2019, 7 pages.
Swarnkar, A. et al., "Quantum dot-induced phase stablization of α-CsPbI3 perovskite for high-efficiency photovoltaics," Solar Cells, vol. 354, Issue 6308, 2016, 5 pages.
Wheeler, L. et al., "Targeted Ligand-Exchange Chemistry on Cesium Lead Halide Perovskite Quantum Dots for High-Efficiency Photovoltaics," Journal of the American Chemical Society, vol. 140, 2018, 10 pages.
Xing, G. et al., "Transcending the slow bimolecular recombination in lead-halide perovskites for electroluminescence," Nature Communications, 2017, DOI: 10.1038/ncomms14558, 9 pages.
Zhai, Y. et al., "Giant Rashba splitting in 2D organic-inorganic halide perovskites measured by transient spectroscopies," Science Advances Research Article, vol. 3, 2017, 7 pages.
Zhu, H. et al., "Screening in crystalline liquids protects energetic carriers in hybrid perovskites," Science Solar Cells Reports, vol. 353, Issue 6306, 2016, 6 pages.

* cited by examiner

COMPOSITIONS OF CHIRAL MOLECULES AND PEROVSKITE NANOCRYSTALS AND METHODS OF MAKING THE SAME

CROSS-REFERENCE TO RELATED APPLICATIONS

This application claims priority from U.S. Provisional Patent Application No. 63/047,208 filed on Jul. 1, 2020, the contents of which are incorporated herein by reference in their entirety.

CONTRACTUAL ORIGIN

This invention was made with government support under Contract No. DE-AC36-08GO28308 awarded by the Department of Energy. The government has certain rights in the invention.

BACKGROUND

Circularly polarized luminescence (CPL) refers to the differential emission of left- or right-circularly polarized light. Among other things, CPL can provide information about 3-dimensional (e.g., stereochemical, conformational, chiral) molecular structures in their excited (luminescent) electronic states, and, therefore, can be used for a wide variety of technologies including information storage and processing, quantum communication, asymmetric catalysis, 3D displays, agriculture, bioencoding, and photoelectric devices. In order to realize these applications, it is necessary to further develop CPL light sources which produce high luminescence dissymmetry g-factors, $g_{lum}=2\times(I_{left}-I_{right})/(I_{left}+I_{right})$ (where $I_{left}$ and $I_{right}$ refer to the PL intensity of left- and right-circularly polarized light, respectively), high photoluminescence quantum efficiency (PLQE), narrow spectral emission, and facile color tunability. Thus, there remains a need for materials capable of producing CPL and having suitable high luminescence dissymmetry g-factors.

SUMMARY

An aspect of the present disclosure is a composition that includes a nanocrystalline core of a perovskite and having an outer surface, and a chiral molecule having a functional group, where the functional group is bonded to a first portion of the outer surface, and the composition is capable of circularly polarized luminescence (CPL). In some embodiments of the present disclosure, the composition is capable of absorbing circularly-polarized light.

In some embodiments of the present disclosure, the perovskite may include at least one of a zero-dimensional perovskite, a two-dimensional perovskite, and/or a three-dimensional perovskite. In some embodiments of the present disclosure, the perovskite may include at least one of $ABX_3$, $AB_2X_5$, $A_2BX_4$, $A_3BX_5$, $A_3BX_6$, $A_3B_2X_9$, $A_3B_2X_5$, and/or $A_{n-1}B_nX_{3n+1}$, A includes a first cation, B includes a second cation, X includes an anion, and $1\leq n\leq 6$. In some embodiments of the present disclosure, the first cation may include at least one of formamidinium (FA), methylammonium (MA), cesium, dimethylammonium, and/or phenylethylammonium.

An aspect of the present disclosure is a composition that includes a nanocrystalline core of a perovskite and having an outer surface; and a chiral molecule that includes a functional group and a second group, where the perovskite includes at least one of $FAPb(X_yX'_zX''_{1-y-z})_3$, $CsPb(X_y-X'_zX''_{1-y-z})_3$, $MAPb(X_yX'_zX''_{1-y-z})_3$, and/or $Cs_{1-u-v}MA_u$-$FA_vPb(X_yX'_zX''_{1-y-z})_3$, X includes at least one of iodide, bromide, and/or chloride, X' includes at least one of iodide, bromide, and/or chloride and is different than X, X'' includes at least one of iodide, bromide, and/or chloride and is different than X and X', and $0\leq z\leq 1$, $0\leq y\leq 1$, $0\leq u\leq 1$, $0\leq v\leq 1$. In addition, the functional group includes an amine group, the second group includes a hydrocarbon having between 3 and 30 carbon atoms, the functional group is bonded to a first portion of the outer surface, and the composition is capable of circularly polarized luminescence (CPL).

In some embodiments of the present disclosure, the nanocrystalline core may have a characteristic length between about 1 nm and about 1000 nm. In some embodiments of the present disclosure, the CPL may have an average luminescence dissymmetry g-factor between about 1.0 and about 0.0001 in a wavelength range between about 400 nm and about 1000 nm. In some embodiments of the present disclosure, the chiral molecule may be present on the outer surface at a concentration between about 1 molecule/$nm^2$ and about 10 molecules/$nm^2$. In some embodiments of the present disclosure, wherein the second group includes a hydrocarbon having at least one of a straight chained functional group, a branched functional group, and/or a ringed functional group. In some embodiments of the present disclosure, the composition may further include a second halide interacting with at least one of the outer surface and/or the chiral molecule. In some embodiments of the present disclosure, the composition may further include a non-chiral molecule, where the non-chiral molecule is bonded to a second portion of the outer surface. In some embodiments of the present disclosure, the achiral molecule may be present on the outer surface at a concentration between about 1 molecule/$nm^2$ and about 10 molecules/$nm^2$.

An aspect of the present disclosure is a device that includes a first layer that includes a composition, and a second layer that includes a conducting material, where the first layer and the second layer are in physical contact and positioned substantially parallel to each other and the composition includes: a nanocrystalline core of a perovskite and having an outer surface and a chiral molecule that includes a functional group, where the functional group is bonded to a first portion of the outer surface, and the composition is capable of absorbing circularly polarized luminescence (CPL). In some embodiments of the present disclosure, the conducting material may include a single-walled carbon nanotube.

An aspect of the present disclosure is a device that includes a first layer that includes a composition, and a magnetized electrode layer, where the first layer and the magnetized electrode layer are positioned substantially parallel to each other, and the composition includes: a nanocrystalline core of a perovskite and having an outer surface, and a chiral molecule that includes a functional group, where the functional group is bonded to a first portion of the outer surface, and the composition is capable of absorbing circularly polarized luminescence (CPL).

In some embodiments of the present disclosure, the device may further include a spin tunneling buffer layer, where the spin tunneling buffer layer is positioned between the magnetized electrode layer and the first layer. In some embodiments of the present disclosure, the device may further include a fourth layer configured to prevent short-circuiting, where the first layer is positioned between the fourth layer and the spin tunneling layer. In some embodiments of the present disclosure, the device may further include a second electrode, where the fourth layer is positioned between the second electrode and the first layer. In some embodiments of the present disclosure, the magnetized electrode layer may include nickel.

BRIEF DESCRIPTION OF THE DRAWINGS

Some embodiments are illustrated in referenced figures of the drawings. It is intended that the embodiments and figures disclosed herein are to be considered illustrative rather than limiting.

FIG. 9A for x=100%, FIG. 9B for x=50%, FIG. 9C for x=25% and FIG. 9D x=0%, according to some embodiments of the present disclosure. Here, a laser with 3.1 eV excitation energy (above the bandgap of NCs) was used for the measurement.

FIGS. 15A-15D illustrate 2-dimensional mapping of the PL lifetime of: FIG. 15A as-synthesized NCs; FIG. 15B purified NCs, and ligand-treated NCs with FIG. 15C for R-MBA:Br and FIG. 15D for S-MBA:Br, according to some embodiments of the present disclosure.

REFERENCE NUMBERS

Figure 1A:
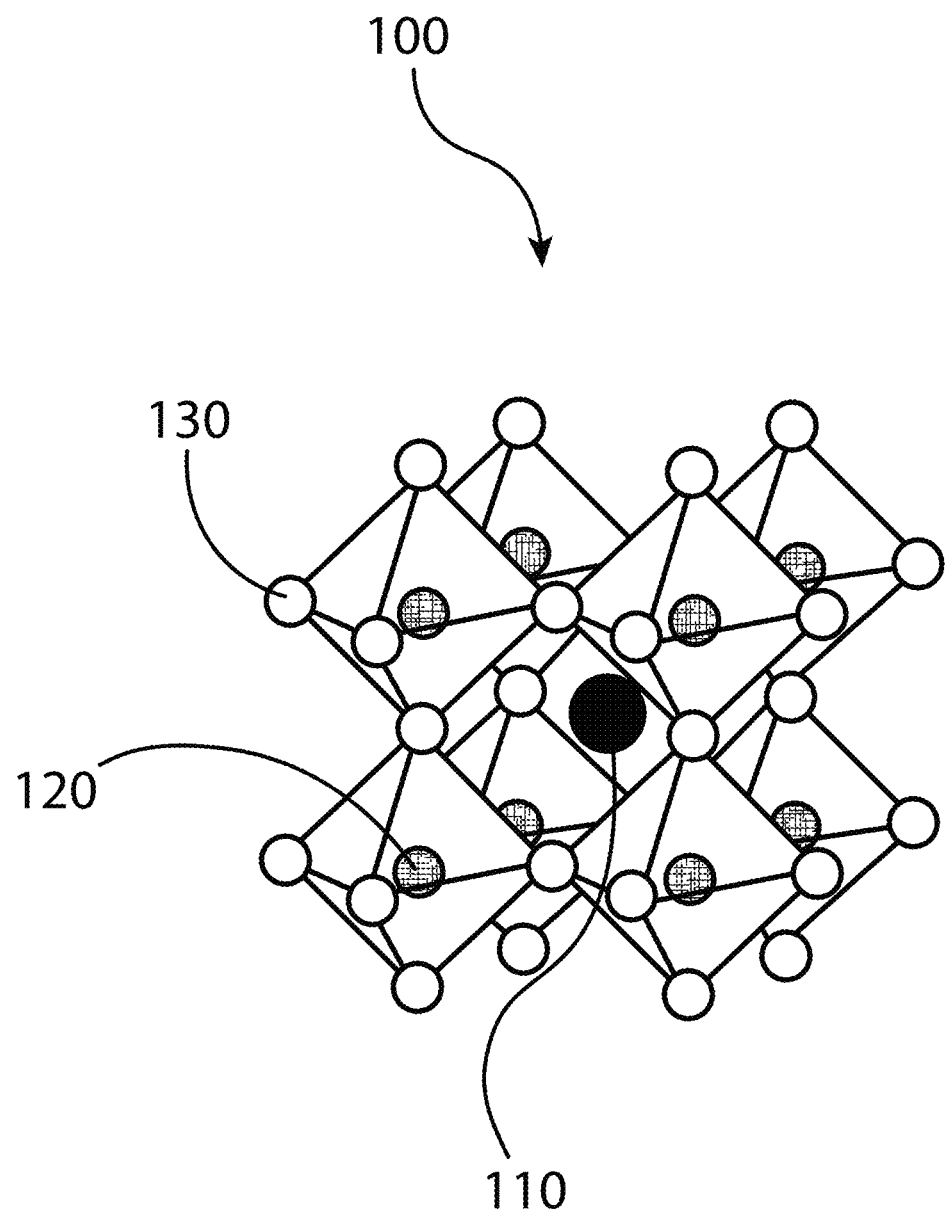
FIGS. 1A, 1B, and 1C illustrate a three-dimensional (3D) perovskite, according to some embodiments of the present disclosure.

100 . . . perovskite
110 . . . A-cation
120 . . . B-cation
130 . . . X-anion
300 . . . composition
310 . . . nanocrystalline core
320 . . . chiral molecule
325 . . . functional group
327 . . . group
330 . . . non-chiral molecule

DETAILED DESCRIPTION

The present disclosure may address one or more of the problems and deficiencies of the prior art discussed above. However, it is contemplated that some embodiments as disclosed herein may prove useful in addressing other problems and deficiencies in a number of technical areas. Therefore, the embodiments described herein should not necessarily be construed as limited to addressing any of the particular problems or deficiencies discussed herein.

References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

Among other things, the present disclosure relates to compositions having a nanocrystalline core with a perovskite structure and having chiral molecules associated with a surface of the nanocrystalline core, where the combination results in the composition's ability to produce circularly polarized luminescence (CPL) having high average luminescence dissymmetry g-factors ($g_{lum}$). In some embodiments of the present disclosure, colloidal formamidinium (FA) lead bromide ($FAPbBr_3$) perovskite nanocrystals (NCs) were synthesized at room temperature using chiral molecules attached to the surface of the NCs. As described herein, in an exemplary embodiment of the present disclosure, at least a portion of a starting non-chiral molecule (i.e., non-chiral ligand), oleylamine, positioned on $FAPbBr_3$ perovskite NCs was replaced with a chiral molecule (i.e., chiral ligand), (R)-2-octylamine, resulting in small, monodisperse NCs capable of high CPL having an average luminescence dissymmetry g-factor of up to about $6.8 \times 10^{-2}$.

Figure 1B:
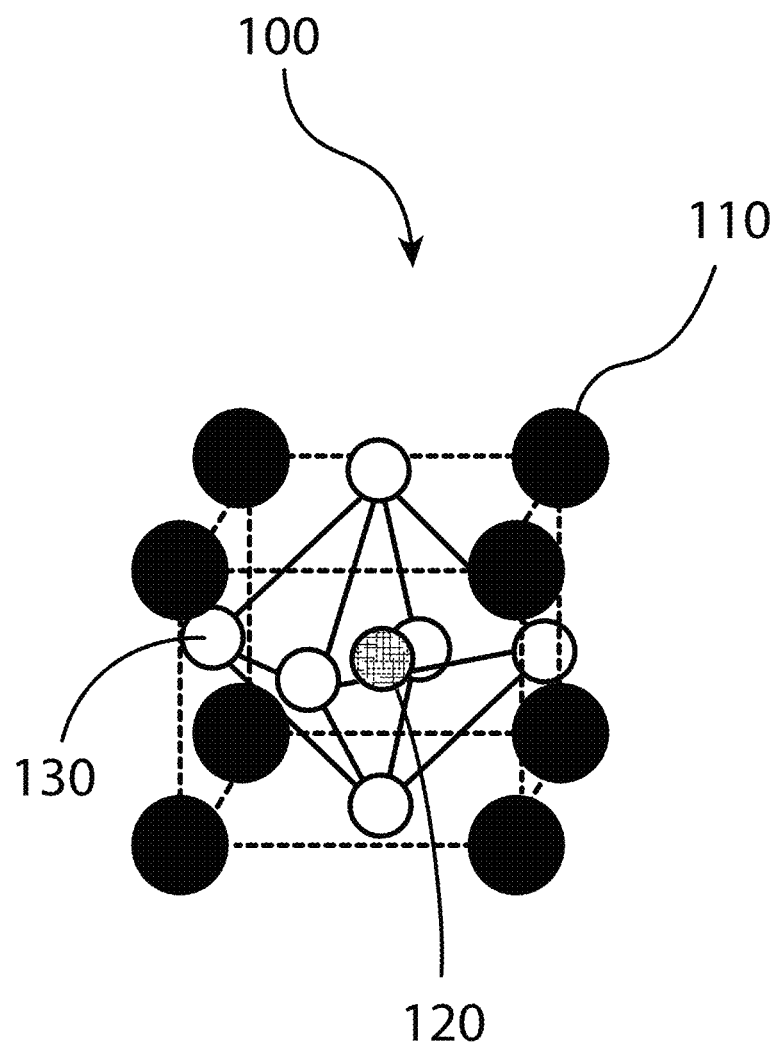
Figure 1C:
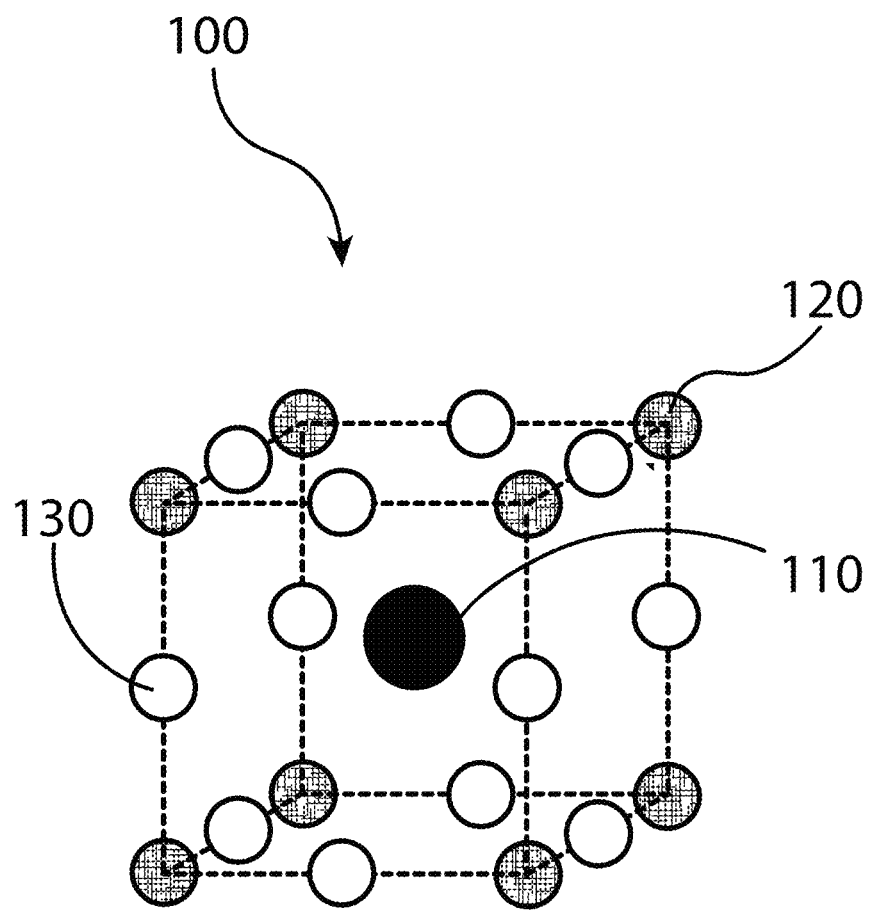

FIGS. 1A, 1B, and 1C illustrate that perovskites 100, for example halide perovskites, may organize into cubic crystalline structures with corner-sharing octahedra, as well as other crystalline structures such as tetragonal, hexagonal, and orthorhombic with either edge- or face-sharing octahedra, and may be described by the general formula $ABX_3$, where X (130) is an anion and A (110) and B (120) are cations, typically of different sizes (A typically larger than B). FIG. 1A illustrates that a perovskite 100 may be organized into eight octahedra surrounding a central A-cation 110, where each octahedra is formed by six X-anions 130 surrounding a central B-cation 120. FIG. 1B illustrates that a perovskite 100 may be visualized as a cubic unit cell, where the B-cation 120 is positioned at the center of the cube, an A-cation 110 is positioned at each corner of the cube, and an X-anion 130 is face-centered on each face of the cube. FIG. 1C illustrates that a perovskite 100 may also be visualized as a cubic unit cell, where the B-cation 120 resides at the eight corners of a cube, while the A-cation 110 is located at the center of the cube and with 12 X-anions 130 centrally located between B-cations 120 along each edge of the unit cell. For both unit cells illustrated in FIGS. 1B and 1C, the A-cations 110, the B-cations 120, and the X-anions 130 balance to the general formula $ABX_3$, after accounting for the fractions of each atom shared with neighboring unit cells. For example, referring to FIG. 1B, the single B-cation 120 atom is not shared with any of the neighboring unit cells. However, each of the six X-anions 130 is shared between two unit cells, and each of the eight A-cations 110 is shared between eight unit cells. So for the unit cell shown in FIG. 1B, the stoichiometry simplifies to B=1, A=8*0.124=1, and X=6*0.5=3, or $ABX_3$. Similarly, referring again to FIG. 1C, since the A-cation is centrally positioned, it is not shared with any of the unit cells neighbors. However, each of the 12 X-anions 130 is shared between four neighboring unit cells, and each of the eight B-cations 120 is shared between eight neighboring unit cells, resulting in A=1, B=8*0.125=1, and X=12*0.25=3, or $ABX_3$. Referring again to FIG. 1C, the X-anions 130 and the B-cations 120 are shown as aligned along an axis; e.g. where the angle at the X-anion 130 between two neighboring B-cations 120 is exactly 180 degrees, referred to herein as the tilt angle. However, a perovskite 100 may have a tilt angle not equal to 180 degrees. For example, some embodiments of the present disclosure may have a tilt angle between 153 and 180 degrees.

Typical inorganic perovskites include calcium titanium oxide (calcium titanate) minerals such as, for example, $CaTiO_3$ and $SrTiO_3$. In some embodiments of the present invention, the A-cation 110 may include a nitrogen-containing organic compound such as an alkyl ammonium compound. The B-cation 120 may include a metal and the X-anion 130 may include a halogen. Additional examples for the A-cation 110 include organic cations and/or inorganic cations, for example Cs, Rb, K, Na, Li, and/or Fr. Organic A-cations 110 may be an alkyl ammonium cation, for example a $C_{1-20}$ alkyl ammonium cation, a $C_{1-6}$ alkyl ammonium cation, a $C_{2-6}$ alkyl ammonium cation, a $C_{1-5}$ alkyl ammonium cation, a $C_{1-4}$ alkyl ammonium cation, a $C_{1-3}$ alkyl ammonium cation, a $C_{1-2}$ alkyl ammonium cation, and/or a $C_1$ alkyl ammonium cation. Further examples of organic A-cations 110 include methylammonium ($CH_3NH_3^+$), ethylammonium ($CH_3CH_2NH_3^+$), propylammonium ($CH_3CH_2 CH_2NH_3^+$), butylammonium ($CH_3CH_2 CH_2 CH_2NH_3^+$), formamidinium ($NH_2CH=NH_2^+$), hydrazinium, acetylammonium, dimethylammonium, imidazolium, guanidinium and/or any other suitable nitrogen-containing or organic compound. In other examples, an A-cation 110 may include an alkylamine. Thus, an A-cation 110 may include an organic component with one or more amine groups. For example, an A-cation 110 may be an alkyl diamine halide such as formamidinium ($CH(NH_2)_2$). Thus, the A-cation 110 may include an organic constituent in combination with a nitrogen constituent. In some cases, the organic constituent may be an alkyl group such as straight-chain or branched saturated hydrocarbon group having from 1 to 20 carbon atoms. In some embodiments, an alkyl group may have from 1 to 6 carbon atoms. Examples of alkyl groups include methyl ($C_1$), ethyl ($C_2$), n-propyl ($C_3$), iso-propyl ($C_3$), n-butyl ($C_4$), tert-butyl ($C_4$), sec-butyl ($C_4$), iso-butyl ($C_4$), n-pentyl ($C_5$), 3-pentanyl ($C_5$), amyl ($C_5$), neopentyl ($C_5$), 3-methyl-2-butanyl ($C_5$), tertiary amyl ($C_5$), and n-hexyl ($C_6$). Additional examples of alkyl groups include n-heptyl ($C_7$), n-octyl ($C_8$) and the like.

Examples of metal B-cations 120 include, for example, lead, tin, germanium, and or any other 2+ valence state metal that can charge-balance the perovskite 100. Further examples include transition metals in the 2+ state such as Mn, Mg, Zn, Cd, and/or lanthanides such as Eu. B-cations may also include elements in the 3+ valence state, as described below, including for example, Bi, La, and/or Y. Examples for X-anions 130 include halogens: e.g. fluorine, chlorine, bromine, iodine and/or astatine. In some cases, the perovskite halide may include more than one X-anion 130, for example pairs of halogens; chlorine and iodine, bromine and iodine, and/or any other suitable pairing of halogens. In other cases, the perovskite 100 may include two or more halogens of fluorine, chlorine, bromine, iodine, and/or astatine.

Thus, the A-cation 110, the B-cations 120, and X-anion 130 may be selected within the general formula of $ABX_3$ to produce a wide variety of perovskites 100, including, for example, methylammonium lead triiodide ($CH_3NH_3PbI_3$), and mixed halide perovskites such as $CH_3NH_3PbI_{3-x}Cl_x$ and $CH_3NH_3PbI_{3-x}Br_x$. Thus, a perovskite 100 may have more than one halogen element, where the various halogen elements are present in non-integer quantities; e.g. x is not equal to 1, 2, or 3. As described herein, the A-cation 110 of a perovskite 100, may include one or more A-cations, for example, one or more of cesium, FA, MA, etc. Similarly, the B-cation 120 of a perovskite 100, may include one or more B-cations, for example, one or more of lead, tin, germanium, etc. Similarly, the X-anion 130 of a perovskite 100 may include one or more anions, for example, one or more halogens. Any combination is possible provided that the charges balance.

For example, a perovskite having the basic crystal structure illustrated in FIG. 1A, in at least one of a cubic, orthorhombic, and/or tetragonal structure, may have other compositions resulting from the combination of the cations having various valence states in addition to the 2+ state and/or 1+ state described above for lead and alkyl ammonium cations; e.g. compositions other than $AB^{2+}X_3$ (where A is one or more cations, or for a mixed perovskite where A is two or more cations). Thus, the methods described herein may be utilized to create novel mixed cation materials having the composition of a double perovskite (elpasolites), $A_2B^{1+}B^{3+}X_6$, with an example of such a composition being $Cs_2BiAgCl_6$ and $Cs_2CuBiI_6$. Another example of a composition covered within the scope of the present disclosure is described by $A_2B^{4+}X_6$, for example $Cs_2PbI_6$ and $Cs_2SnI_6$. Yet another example is described by $A_3B_2^{3+}X_9$, for example $Cs_3Sb_2I_9$. For each of these examples, A is one or more cations, or for a mixed perovskite, A is two or more cations.

Figure 2:
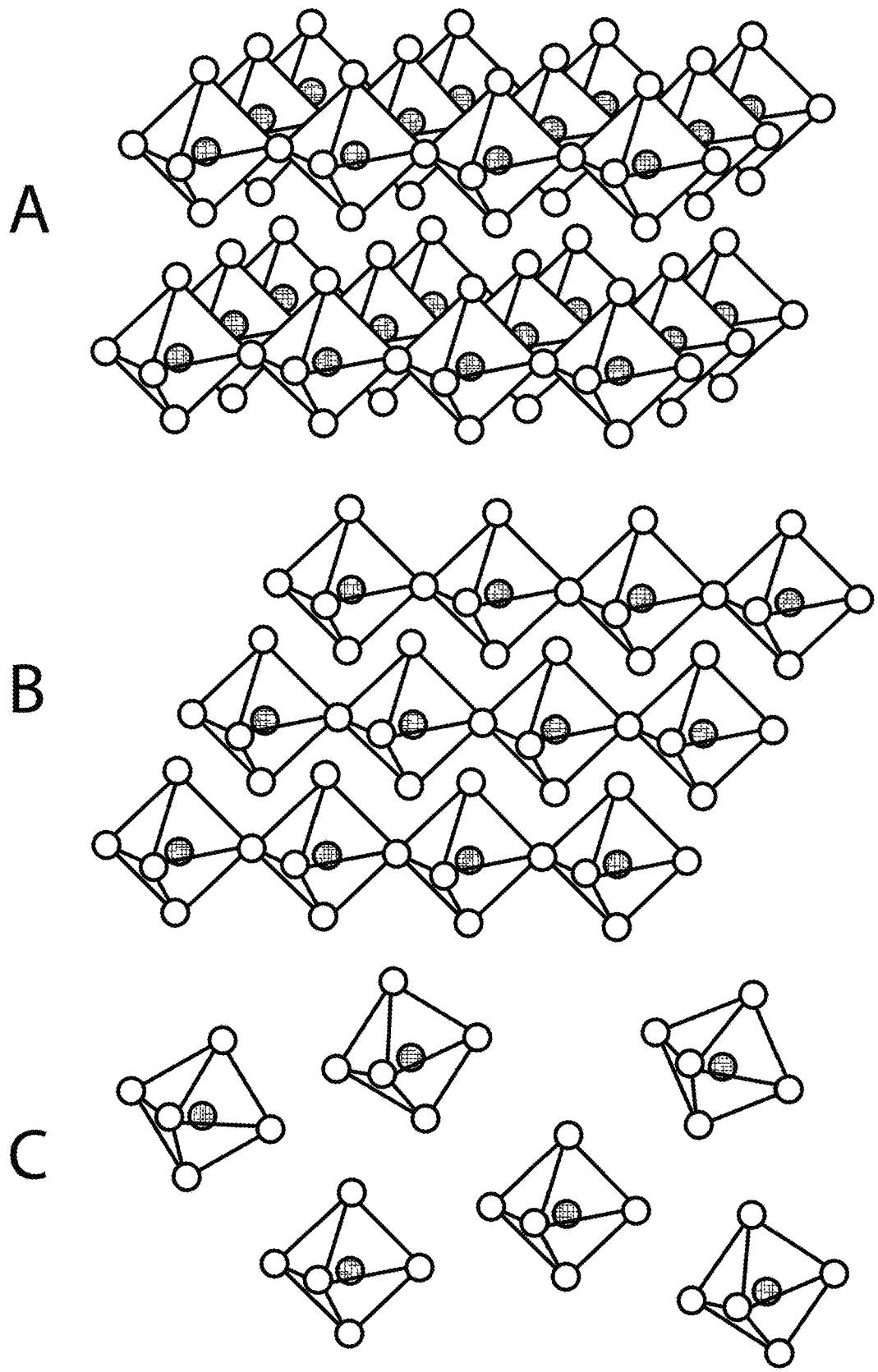
FIG. 2, Panels A, B, and C illustrate a two-dimensional (2D) perovskite, a one-dimensional (1D) perovskite, and a zero-dimensional (0D) perovskite, respectively, according to some embodiments of the present disclosure.

In addition, perovskite halides, like other organic-inorganic perovskites, can form a three-dimensional (3D) network, a two-dimensional (2D) network, a one-dimensional (1D) network and/or a zero-dimensional (0D) network, possessing the same unit structure. A perovskite's 3D network is illustrated in FIGS. 1A, 1B, and 1C. FIG. 2 illustrates a 2D perovskite network, a 1D perovskite network, and a 0D perovskite network, in Panels A, B, and C, respectively. As described above, a 3D perovskite may adopt a general chemical formula of $ABX_3$, in which the A-cation may be a monovalent cation (e.g. methylammonium and/or formamidinium $CH(NH_2)_2^+$), the B-cation may be a divalent cation (e.g. $Pb^{2+}$ and/or $Sn^{2+}$), and the X-anion may be a halide anion ($I^-$, $Br^-$, and/or $Cl^-$). In this formula, the 3D network of perovskites may be constructed by linking all corner sharing $BX_6$ octahedra, with the A-cation filling the space between eight octahedral unit cells to balance the crystal charge.

Referring to Panel A of FIG. 2, through the chemically accomplished dimensional reduction of the 3D crystal lattice, 2D perovskites, $(A')_m(A)_{n-1}B_nX_{3n+1}$, may adopt a new structural and compositional dimension, A' (not shown), where monovalent (m=2) or divalent (m=1) cations can intercalate between the X-anions of the 2D perovskite sheets. Referring to Panel B of FIG. 2, 1D perovskites are constructed by $BX_6$ octahedral chained segments spatially isolated from each other by surrounding bulky organic cations (not shown), leading to bulk assemblies of paralleled octahedral chains. Referring to Panel C of FIG. 2, typically, the 0D perovskites are consisted of isolated inorganic octahedral clusters and surrounded by small cations (not shown) which are connected via hydrogen bonding.

Figure 3:
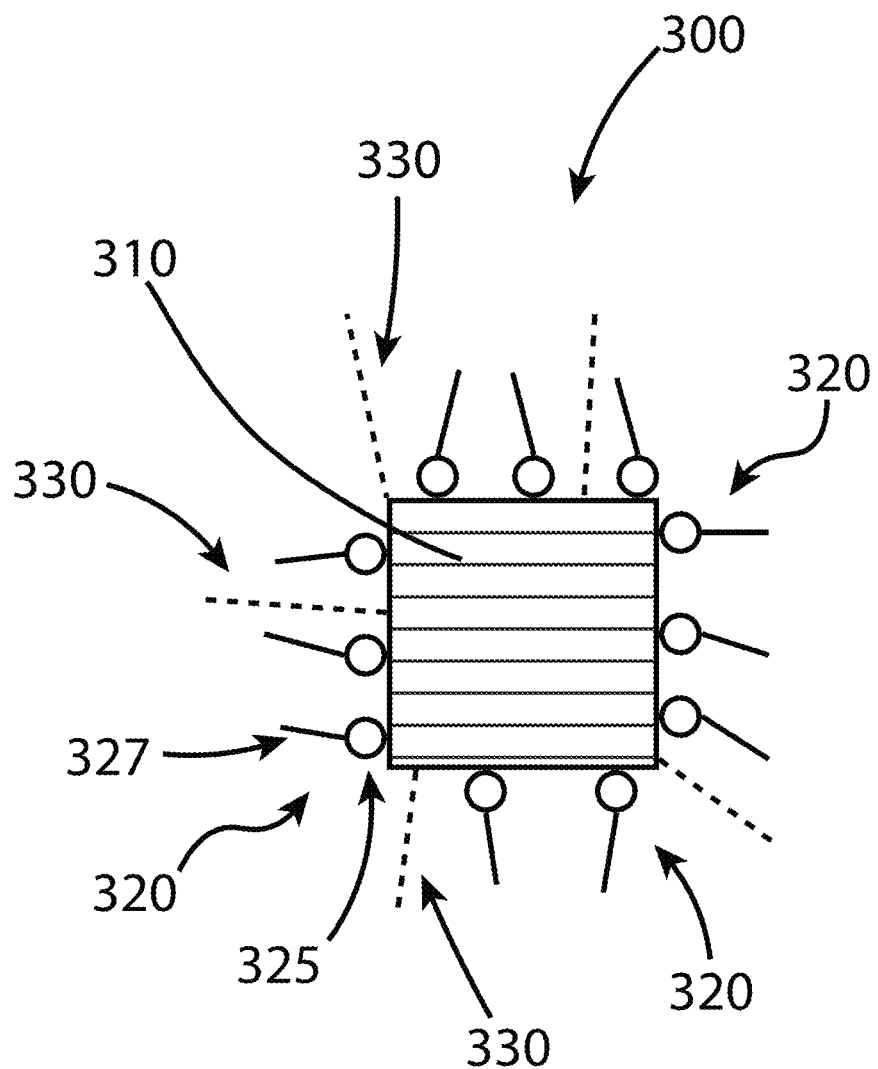
FIG. 3 illustrates a composition that includes a nanocrystalline perovskite core and a chiral molecule, according to some embodiments of the present disclosure.

FIG. 3 illustrates a composition 300 that includes a perovskite nanocrystalline core 310 having an outside surface to which at least one of a plurality of chiral molecules 320 and/or a plurality of non-chiral molecules 330 are attached, according to some embodiments of the present disclosure. As described above, a nanocrystalline perovskite may be at least one of a zero-dimensional perovskite, a two-dimensional perovskite, and/or or a three-dimensional perovskite. For example, a nanocrystalline perovskite may have a stoichiometry described by at least one of $ABX_3$, $AB_2X_5$, $A_2BX_4$, $A_3BX_5$, $A_3BX_6$, $A_3B_2X_9$, $A_3B_2X_5$, or $A_{n-1}B_nX_{3n+1}$, where, as described above, A is a first cation, B is a second cation, X is an anion, and 2≤n≤6.

In some embodiments of the present disclosure, a first cation may include at least one of formamidinium (FA), methylammonium (MA), cesium, dimethylammonium, and/or phenylethylammonium. In some embodiments of the present disclosure, a first cation may include at least one of an organic ammonium ($CH_3NH_3$, $C_xH_{2x+1}NH_3$, $RNH_3$, $CF_3NH_3$, $C_xF_{2x+1}NH_3$), an organic amidinium [e.g. $CH(NH_2)_2$, $(C_xH_{2x+1})C(NH_2)_2$, $R(NH_2)_2$, $CF(NH_2)_2$, or $(C_xF_{2x+1})C(NH_2)_2$], an organic ion, and/or an alkali metal (e.g. Na, K, Rb, Cs, or Fr), where R is an alkyl group and x is an integer greater than or equal to 1. In some embodiments of the present disclosure, a second cation may include at least one of a transition metal, a post-transition metal, an alkali metal, and/or a lanthanide. In some embodiments of the present disclosure, a second cation may include at least one of tin, lead, bismuth, manganese, cadmium, scandium, yttrium, europium, gallium, indium, antimony, polonium, and/or germanium. Among other things, an anion may be a halide.

In some embodiments of the present disclosure, a nanocrystalline perovskite may include at least one of $FAPb(X_yX'_zX''_{1-y-z})_3$, $CsPb(X_yX'_zX''_{1-y-z})_3$, $MAPb(X_yX'_zX''_{1-y-z})_3$, or $Cs_{1-u-v}MA_uFA_vPb(X_yX'_zX''_{1-y-z})_3$, where X includes iodide, bromide, or chloride, X' includes iodide, bromide, or chloride and is different than X, and where X' includes iodide, bromide, or chloride and is different than X and X'. Further, 0≤z≤1, 0≤y≤1, 0≤u≤1, and 0≤v≤1. A nanocrystalline core 310 may have a characteristic length between about 1 nm and about 1000 nm, or between about 4 nm and about 100 nm. In some embodiments of the present disclosure, a nanocrystalline core may have a shape comprising at least one of a cube, a rod, a wire, and/or a plate. In some embodiments of the present disclosure, a plate may have a thickness between about 0.1 nm and about 5 nm.

Referring again to FIG. 3, in some embodiments of the present disclosure, a chiral molecule 320 may have a functional group 325 connected to a second group 327, where the connecting may include a covalent bond. As described herein, a functional group 325 of a chiral molecule 320 may interact with a surface of a nanocrystalline core 310 by forming at least one of a covalent bond, an ionic bond, a hydrogen bond, an electrostatic interaction, and/or van der Waals forces. In some embodiments of the present disclosure a chiral molecule 320, e.g., at least one of the chiral molecule's functional group 325 and/or second group 327, may form a bond with a surface of a nanocrystalline core 310 through at least one of a Z-type ligand interaction, an X-type ligand interaction, and/or an L-type ligand interaction.

Referring again to FIG. 3, a functional group 325 of a chiral molecule 320 may include at least one of an amine group, and ammonium group, a sulfate group, a phosphate group, a carboxylate group, an alkyl halide, a sulfuric acid group, a phosphoric acid group, and/or a carboxylic acid group. A second group 327 may include a hydrocarbon having between 3 and 30 carbon atoms, where the hydrocarbon may include a straight chain of carbon atoms, a branched chain of carbon atoms, and/or a ringed structure of carbon atoms. A hydrocarbon may be saturated or unsaturated. In some embodiments, a hydrocarbon may include other elements, including among others, oxygen, nitrogen, sulfur, and/or phosphorus. In some embodiments of the present disclosure, a ringed structure may be an aromatic and/or a polyaromatic, such as benzene and/or naphthalene.

In some embodiments of the present disclosure, a chiral molecule 320 may include at least one of an amino acid, (R)-2-octylamine, (S)-2-octylamine, R-methylbenzylammonium, S-methylbenzyleammonium, R-cysteine, S-cysteine, L-canavanine, L-canavanine sulfate salt, L-leucine, L-proline, N-acetyl-D-penicillamine, L-cysteine hydrochloride monohydrate, (R)-(−)-sec-butylamine, (S)-(+)-sec-butylamine, (R)-(−)-2-amino-3-methylbutane, (S)-(+)-2-amino-3-methylbutane, (S)-(+)-3,3-dimethyl-2-butylamine, (R)-(−)-3,3-dimethyl-2-butylamine, (S)-(+)-1-cyclohexylethylamine, (R)-(−)-1-cyclohexylethylamine, R-ethylbenzylamine, S-ethylbenzylamine, sulfobetaine, phosphocholine, (S)-(−)-1-(1-naphthyl)ethylamine, (S)-(+)-1,2,3,4-tetrahydro-1-naphthylamine, (S)-1,2,3,4-tetrahydro-3-isoquinolinecarboxylic acid, (S)-(+)-3-amino-1-boc-piperidine, (S)-(−)-1-(4-bromophenyl)ethylamine, (S)-(+)-1-aminoindan, (S)-1-cyclopropylethylamine, (S)-(−)-3-cyclohexene-1-carboxylic acid, (S)-(−)-1-(2-naphthyl)ethylamine, (S)-1-(2-fluorophenyl)ethylamine, (S)-(−)-1-amino-2-(methoxymethyl)pyrrolidine, (R)-(+)-bornylamine, (S)-1-m-tolylethanamine, (S)-(+)-1-methoxy-2-propylamine, (S)-(+)-1-methyl-3-phenylpropylamine, (S)-(+)-1-amino-2-propanol, (S)-1,4-benzodioxane-2-carboxylic acid, (S)-1,2,3,4-tetrahydro-1-naphthoic acid, (R)-1,2,3,4-Tetrahydro-1-naphthoic acid, (R)-(−)-1,2,3,4-tetrahydro-1-naphthylamine, (R)-(+)-1,2-dithiolane-3-pentanoic acid, (S)-1-boc-4-oxopiperidine-2-carboxylic acid, penicillamine, glutathione, oligopeptide, and/or L-cystathionine. In some embodiments of the present disclosure, a chiral molecule may be a zwitterion.

Further, a chiral molecule 320 may be provided in the form of a salt, e.g., (R-/S-)methylbenzylammonium bromide. Thus, in some embodiments of the present disclosure, a chiral molecule 320 may have a functional group 325 that is a first cation or first anion, such that a second cation or a second anion is present to balance the charge (not shown). In some embodiments of the present disclosure, the second ion may interact with a surface of nanocrystalline core 310 and/or with the chiral molecule 320. A second halide may include at least one of bromide, chloride, and/or iodide.

In some embodiments of the present disclosure, a non-chiral molecule 330 may interact with a surface of a nanocrystalline core 310. In some embodiments of the present disclosure, a non-chiral molecule 330 may interact with a surface of a nanocrystalline core 310 by forming at least one of a covalent bond, an ionic bond, a hydrogen bond, an electrostatic interaction, and/or an interaction by van der Waals forces. In some embodiments of the present disclosure a non-chiral molecule 330, may form a bond with a surface of a nanocrystalline core 310 through at least one of a Z-type ligand interaction, an X-type ligand interaction, and/or an L-type ligand interaction.

Examples of a non-chiral molecule 330 include at least one of oleylammonium, oleate, a zwitterion, an alkyl halide (e.g. acyclic alkyl having a structure of $C_nH_{2n+1}$), a primary alcohol, a secondary alcohol, a tertiary alcohol, an alkylamine, a p-substituted aniline, a phenyl ammonium, a fluorine ammonium, a carboxylic acid (e.g. a 4,4'-Azobis(4-cyanovaleric acid)), acetic acid, 5-aminosalicylic acid, acrylic acid, L-aspentic acid, 6-bromohexanoic acid, bromoacetic acid, dichloroacetic acid, ethylenediaminetetraacetic acid, isobutyric acid, itaconic acid, maleic acid, r-maleimidobutyric acid, L-malic acid, 4-nitrobenzoic acid, 1-pyrenecarboxylic acid, and/or oleic acid. An example of a zwitterion is sulfobetaine.

In some embodiments of the present disclosure, a composition having a nanocrystalline core 310 and a chiral molecule 320 may exhibit CPL having an average luminescence dissymmetry g-factor between about 1.0 and about 0.0001 in a wavelength range between about 400 nm and about 1000 nm. In some embodiments of the present disclosure, the average luminescence dissymmetry g-factor may be between about 1.0 and about 0.001. In some embodiments of the present disclosure, the average luminescence dissymmetry g-factor may be between about 1.0 and about 0.01. Further, a chiral molecule 320 may be present on a surface of nanocrystalline core 310 at a surface concentration between about 1 molecule/$nm^2$ and about 20 molecules/$nm^2$, inclusively, or between about 1 molecule/$nm^2$ and about 10 molecules/$nm^2$, inclusively.

Figure 4:
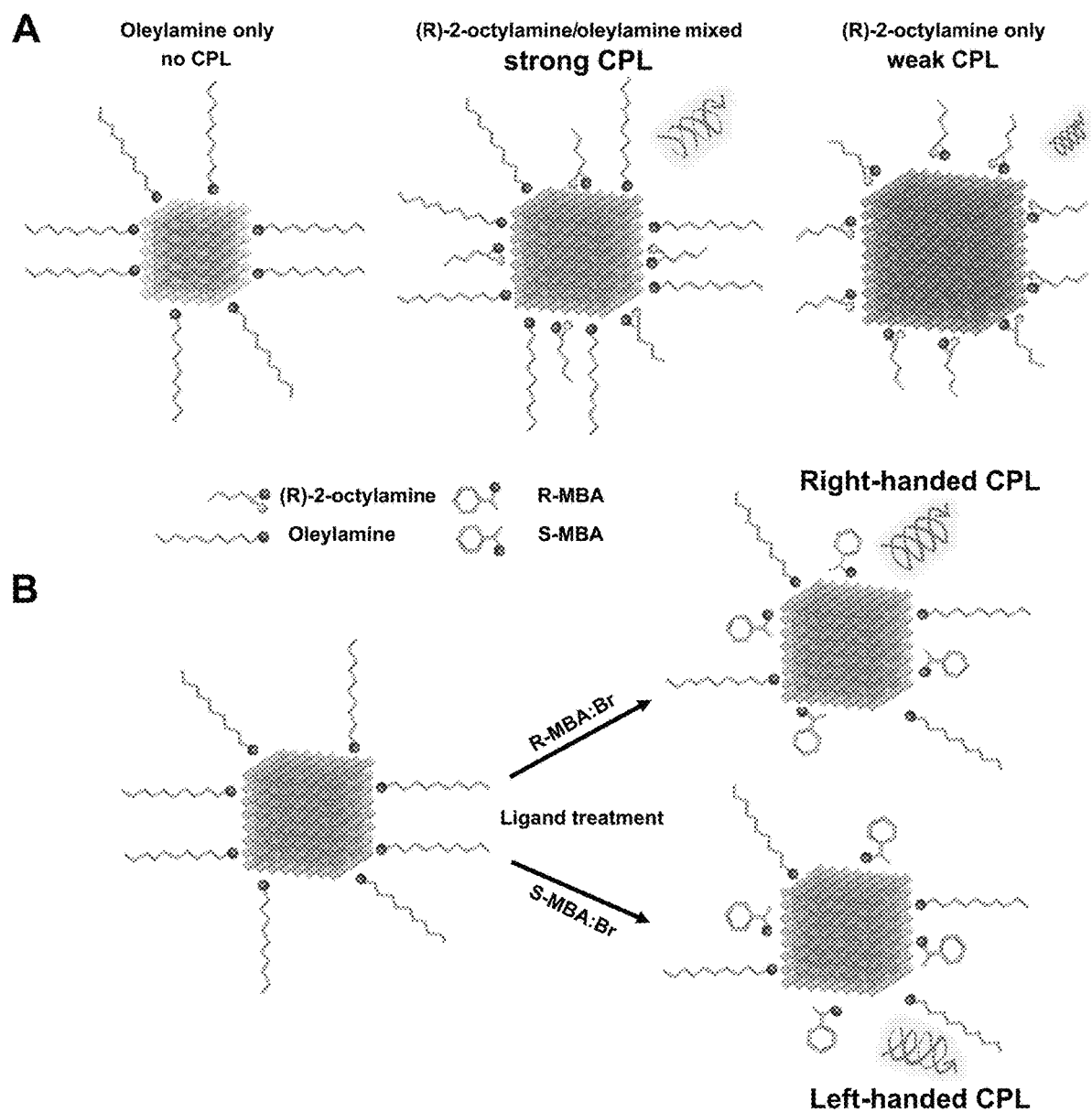
FIG. 4 illustrates in Panel A) a schematic of ligand-controlled synthesis of $FAPbBr_3$ nanocrystals (NCs) with (R)-2-octylamine, and in Panel B) a schematic of post-synthetic ligand treatment of $FAPbBr_3$ NCs with R-,S-MBA:Br, according to some embodiments of the present disclosure. (FA=formamidinium; MBA=methylbenzylammonium.)

The present disclosure relates to methods for synthesizing unique nanocrystalline compositions capable of high CPL, for example, referring to FIG. 4, the synthesis of colloidal FA-lead bromide ($FAPbBr_3$) perovskite nanocrystalline cores with chiral molecules bound to the surface of the perovskite nanocrystalline cores. For example, a nanocrystalline composition capable of high CPL was synthesized by first substituting a portion of a non-chiral starting molecule (i.e., non-chiral ligand), oleylamine (OAm), bound to the NCs surfaces as oleylammonium ($OAmH^+$) with a short chiral molecule, ((R)-2-octylamine), during the synthesis of the $FAPbBr_3$ NCs. In this example, these steps resulted in small and relatively monodisperse perovskite NCs, with (R)-2-octylamine molecules bound to the NC surfaces, exhibiting high CPL with $g_{lum}$ of $6.8 \times 10^{-2}$. However, post-synthetic purification (e.g., washing the chiral molecule functionalized NCs with methylacetate (MeOAc)), which can be important for the use of perovskite NCs in optoelectronic or spintronic devices, resulted in the removal of the chiral molecules and greatly reduced the CPL response. To obtain a nanocrystalline/chiral molecule composition capable of suitable CPL, in some embodiments of the present disclosure and as described herein, a post-purification chiral molecule treatment was utilized using chiral (R-/S-) methylbenzylammonium bromide (R-,S-MBA:Br) resulting in NC compositions having left- and right-handed CPL with an average $g_{lum} = \pm 1.18 \times 10^{-2}$ after purification.

In some embodiments of the present disclosure, a hot injection method may be utilized to produce perovskite NCs (e.g., $FAPbBr_3$) having a tunable size. A chiral nanocrystalline perovskite composition may be produced directly during the perovskite NC synthesis. This may be accomplished using a chiral molecule that is structurally similar to the starting non-chiral molecule and that is also able to dissolve at least one of the perovskite precursors. For example, (R)-2-octylamine may be utilized as a chiral molecule during the synthesis of nanocrystalline $FAPbBr_3$ due to its structural similarity with OAm and its ability to dissolve $PbBr_2$, a perovskite precursor. For this particular example, the NC synthesis was conducted at a constant reaction temperature of about 80° C. More specifically, the ratio of (R)-2-octylamine to OAm was controlled during synthesis at a constant reaction temperature of about 80° C. while maintaining a constant concentration of oleic acid (OA).

Figure 5A:
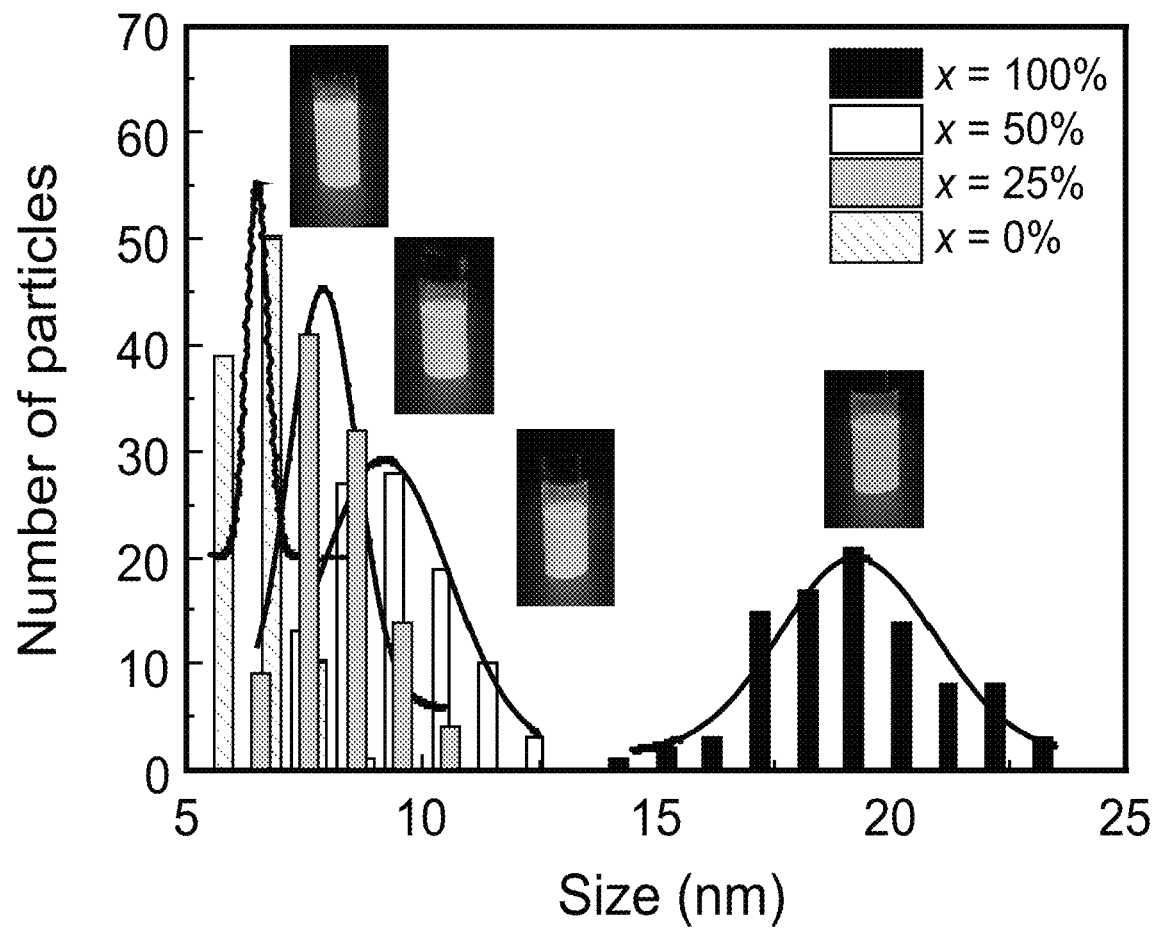
FIG. 5A illustrates a size distribution histogram and photograph under a λ=350 nm Xe lamp of $FAPbBr_3$ NCs with different (R)-2-octylamine concentrations x, according to some embodiments of the present disclosure.
Figure 5B:
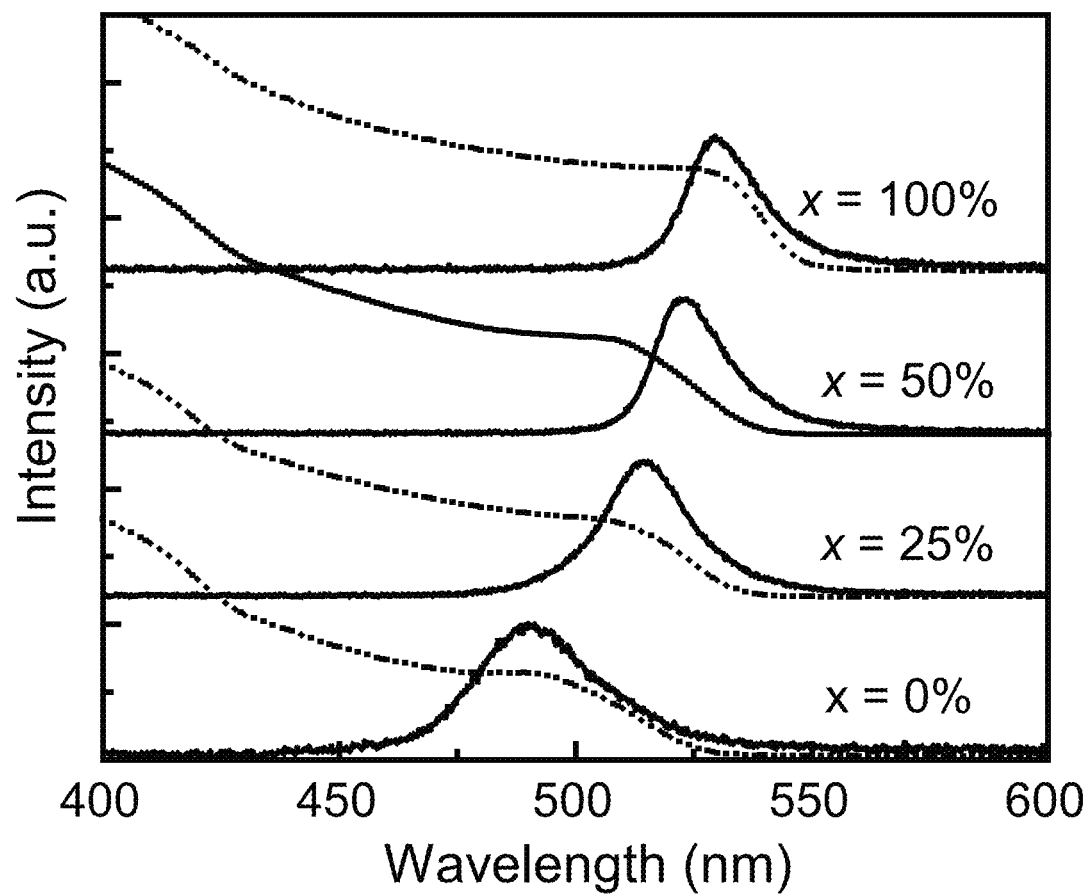
FIG. 5B illustrates PL (solid line) and absorption (dashed lime) spectra of $FAPbBr_3$ NCs with different (R)-2-octylamine concentrations x, according to some embodiments of the present disclosure.
Figure 6:
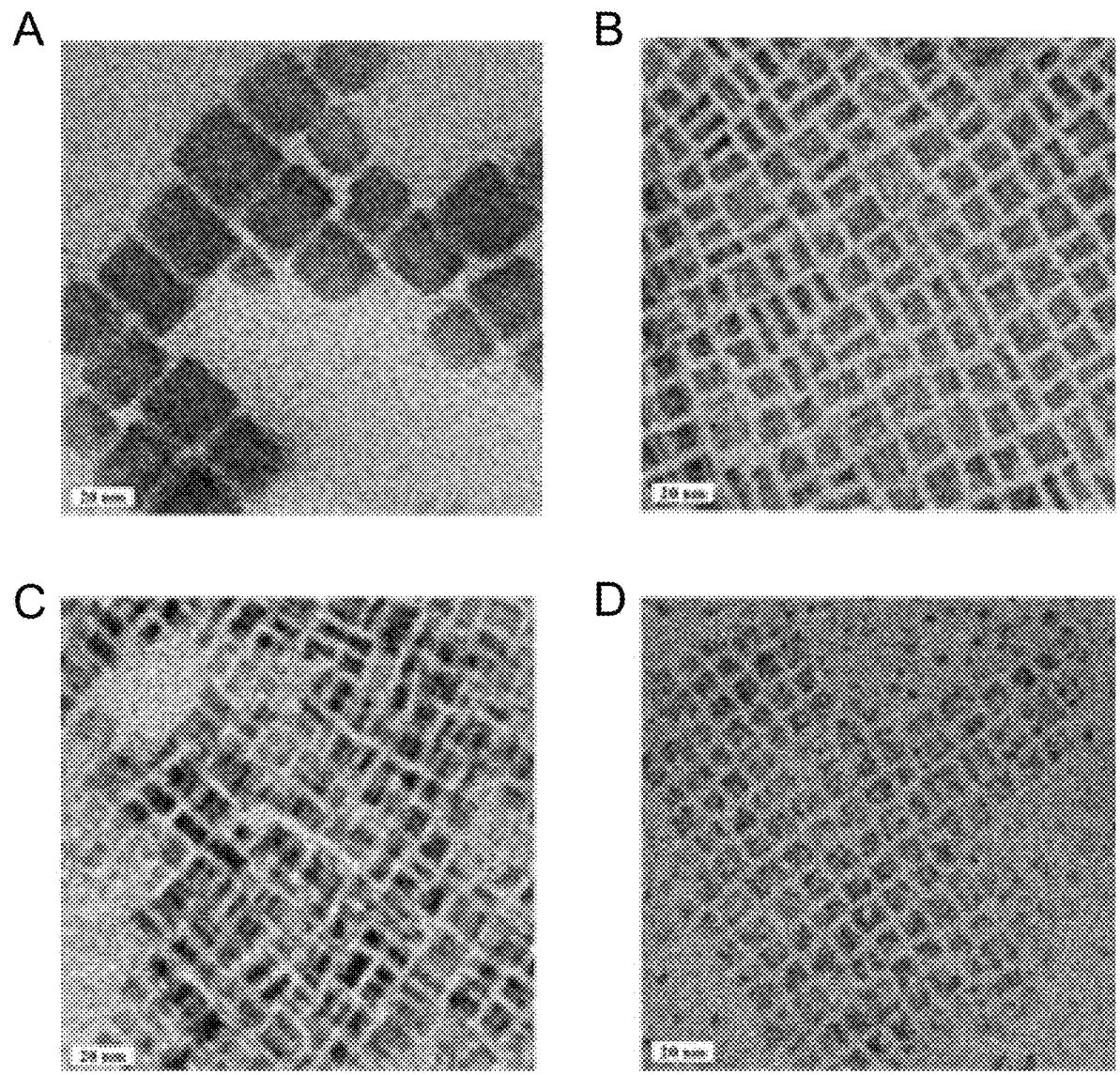
FIG. 6 illustrates transmission electron microscopy (TEM) images of $FAPbBr_3$ NCs with different (R)-octylamine concentration x; Panel A) x=100%, Panel B) x=50%, Panel C) x=25%, and Panel D) x=0%, according to some embodiments of the present disclosure.

As (R)-2-octylamine concentration x decreased from 100% (pure (R)-2-octylamine) to 0% (pure OAm) at the constant reaction temperature of about 80° C., the size of the $FAPbBr_3$ NCs gradually decreased from ~19 nm to ~7 nm, as measured by TEM (see FIG. 5A and FIG. 6). This observed decrease in NC size with decreasing x was confirmed by both photoluminescence (PL) and absorption spectra. As x decreased from 100% to 0%, the PL spectrum gradually shifted toward higher energies (shorter wavelengths) from 528 nm to 490 nm due to quantum confinement, as did the absorption spectra (see FIG. 5B). The PL spectra also broadened, e.g., FWHM ~18 nm for NCs with x=100% to ~32 nm for NCs with x=0%. The FAPbBr$_3$ NCs also exhibited blue-shifted emission under UV illumination as x decreased (see the insets of FIG. 5A).

Figure 5C:
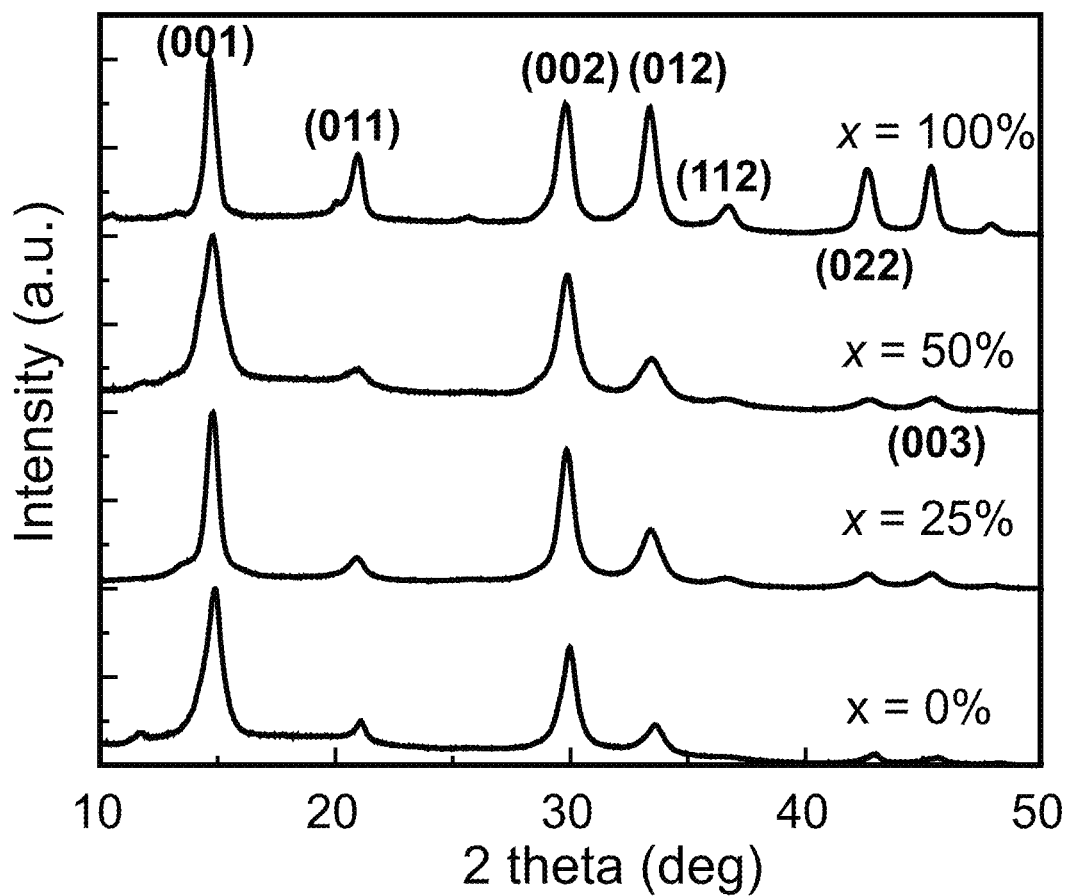
FIG. 5C illustrates X-ray diffraction (XRD) patterns of $FAPbBr_3$ NCs with different (R)-2-octylamine concentrations x, according to some embodiments of the present disclosure.
Figure 7A:
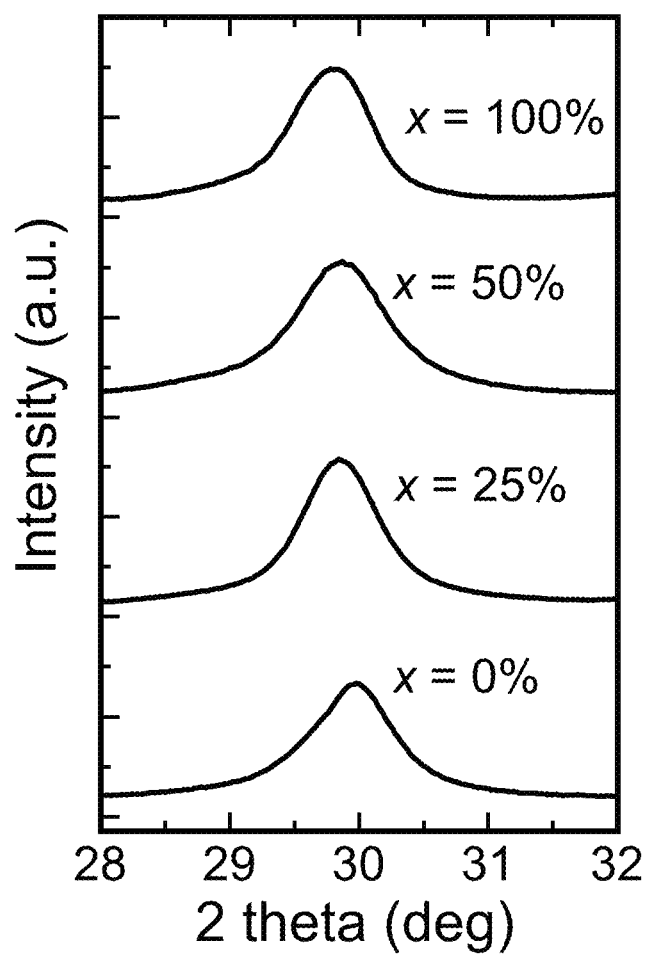
FIG. 7A illustrates magnified XRD patterns (28-32 deg) of $FAPbBr_3$ NCs with different (R)-2-octylamine concentration x, according to some embodiments of the present disclosure.
Figure 7B:
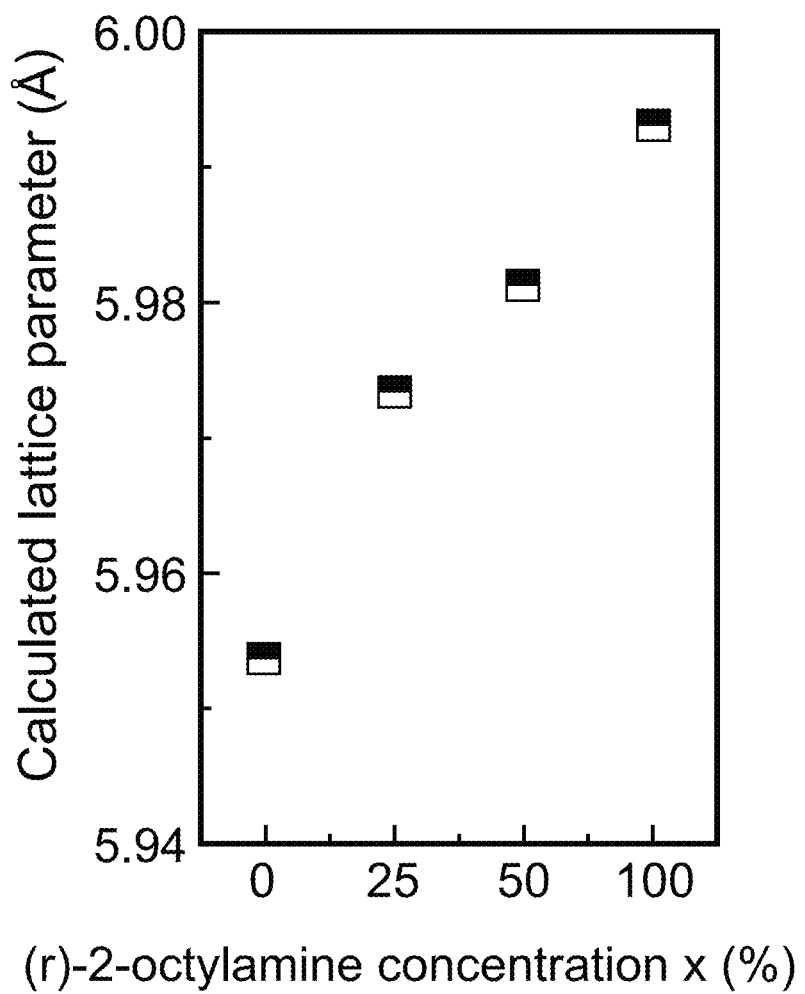
FIG. 7B illustrates calculated lattice parameters of $FAPbBr_3$ NCs with different (R)-2-octylamine concentration x, according to some embodiments of the present disclosure.

All FAPbBr$_3$ NCs synthesized demonstrated clear XRD patterns with prominent (001), (002) and (012) peaks at ~14.69°, ~29.77° and ~33.39° (see FIG. 5C). As (R)-2-octylamine concentration x decreased, the diffraction peaks shifted to a higher 2θ angle, indicating a decrease in the lattice parameter from 5.99 Å (for x=100%) to 5.95 Å (for x=0%) (see FIGS. 7A and 7B).

Figure 5D:
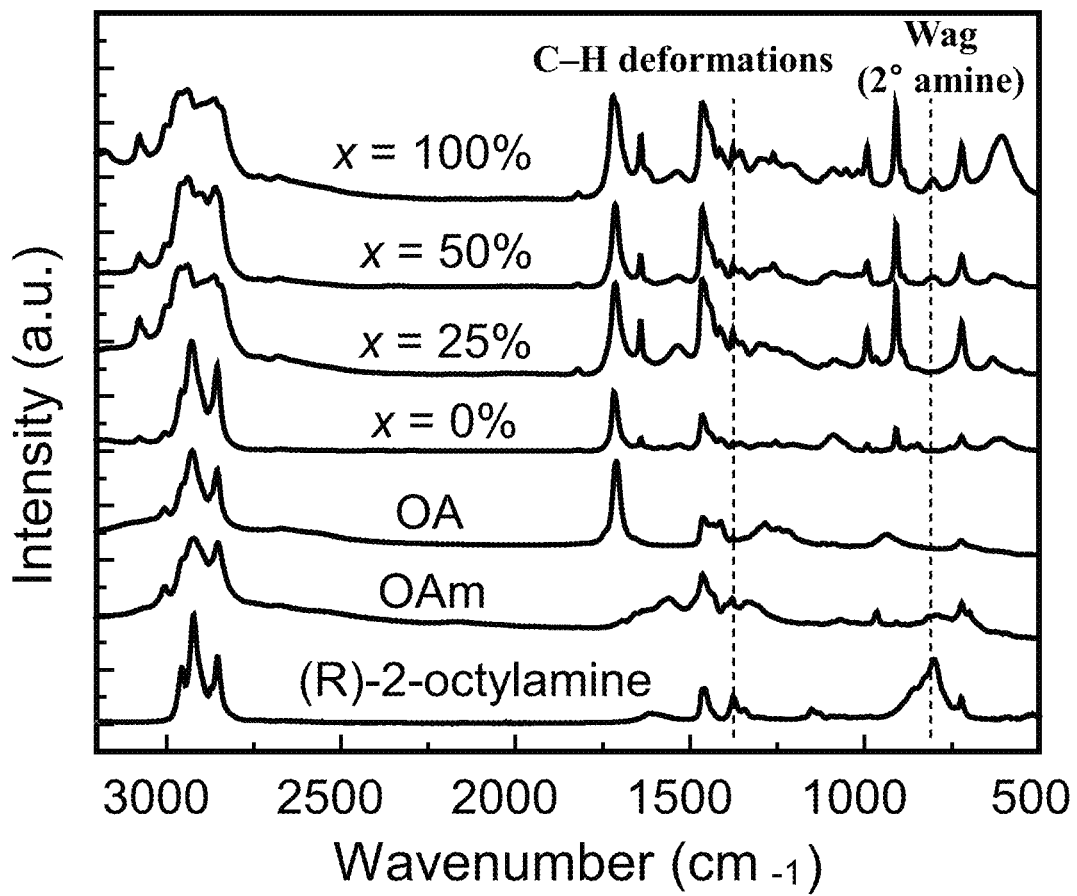
FIG. 5D illustrates Fourier transform infrared (FTIR) spectrum of oleic acid, oleylamine, (R)-2-octylamine and $FAPbBr_3$ NCs with different concentrations x, according to some embodiments of the present disclosure.

Because CPL is affected by the chiral molecules attached to the perovskite NC core surfaces, FTIR spectroscopy was conducted to study the surface chemistry of the FAPbBr$_3$ NCs (see FIG. 5D). This confirmed the presence OA by $v(C=O)=1720$ cm$^{-1}$ and $v_s(COO^-)=1412$ cm$^{-1}$, and both OA and OAm by $v(C-H_x)$ (2850-3000 cm$^{-1}$), $v(C=C-H)=3005$ cm$^{-1}$, and $v(C-H_2)=1466$ cm$^{-1}$ where $v$ is stretching and $v_s$ is the symmetric stretching mode. Similarly, (R)-2-octylamine was identified by the stretches of its secondary (2°) amine group. NCs with (R)-2-octylamine (x=100, 50, 25%) showed a C—H deformation peak at 1371 cm$^{-1}$ and a N—H wagging peak of 2° amines at 800 cm$^{-1}$, confirming that (R)-2-octylamine was attached to the perovskite NC core surfaces. Furthermore, NCs with (R)-2-octylamine (x=100, 50, 25%) showed broadened FTIR peaks at 2850-3000 cm$^{-1}$, which can arise when there are multiple local chemical environments. Therefore, the broadened FTIR peaks observed in the NCs with (R)-2-octylamine may be attributed to a chemical environment caused by the 2° amine in (R)-2-octylamine (e.g., bonding of the 2° ammonium in (R)-2-octylamine with COO$^-$ or Br$^-$ on the NC surface; or proton exchange with primary (1°) ammonium (FA$^+$, NH$_3^+$ in FAPbBr$_3$ crystals or OAmH$^+$)).

Figure 8A:
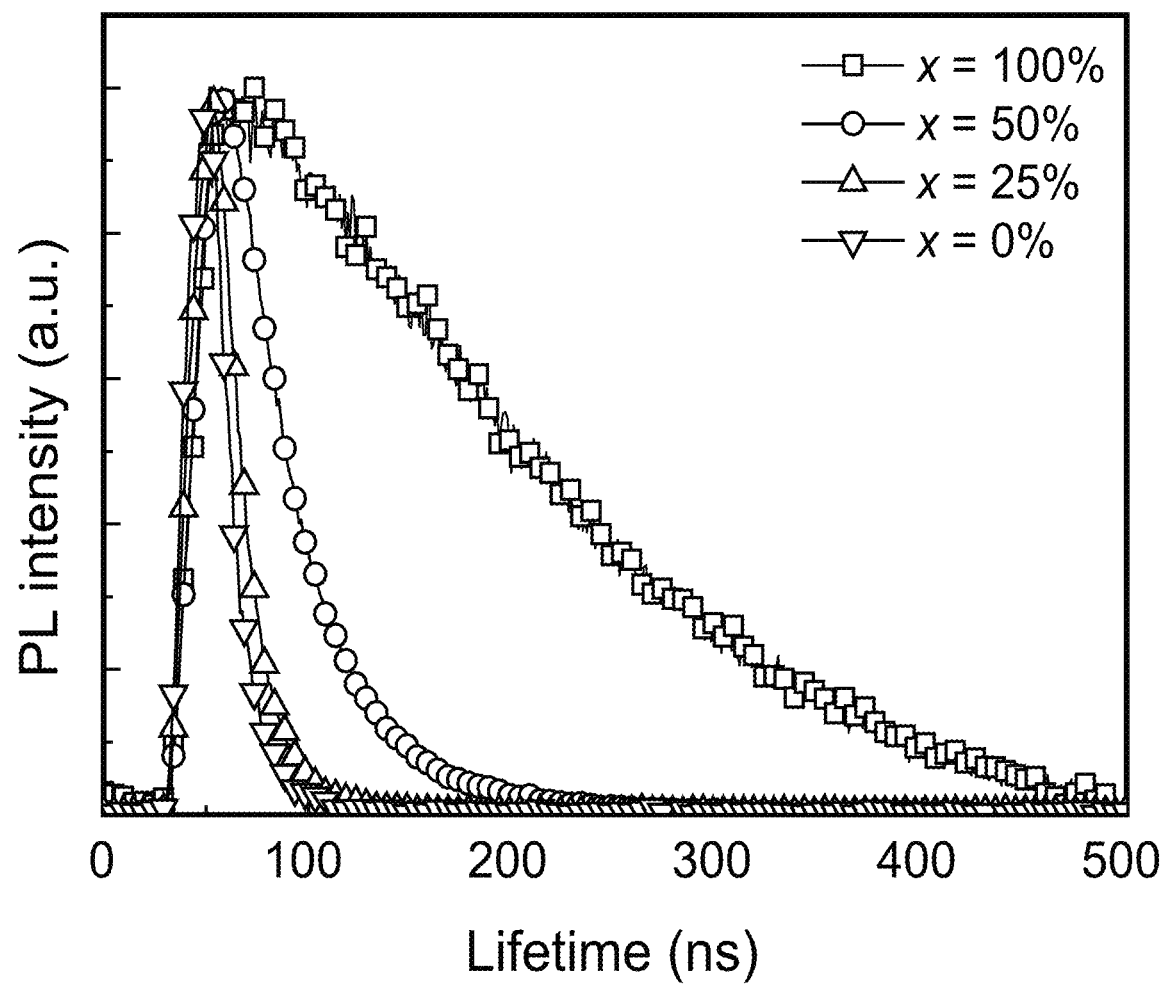
FIG. 8A illustrates time resolved photoluminescence (TRPL) decay kinetics in $FAPbBr_3$ NC solutions with different (R)-2-octylamine concentration x, according to some embodiments of the present disclosure.
Figure 8B:
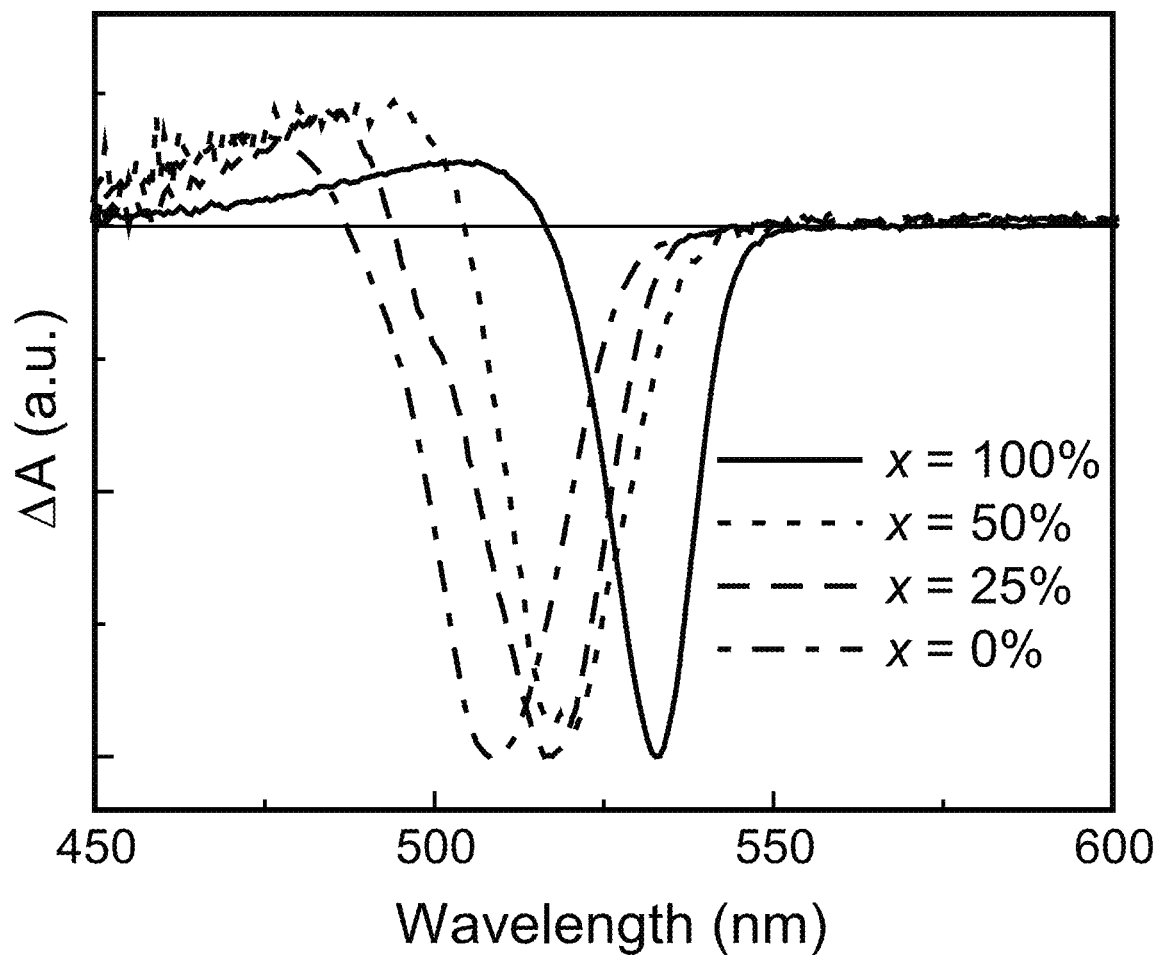
FIG. 8B illustrates normalized transient absorption (TA) spectra at 2 ps in $FAPbBr_3$ NC solutions with different (R)-2-octylamine concentration x, according to some embodiments of the present disclosure.

Since CPL response is governed by radiative recombination within NCs and the interplay that chiral molecules (i.e., ligands) impart on the recombination dynamics, a time-resolved PL (TRPL) study was conducted to understand exciton recombination dynamics in the FAPbBr$_3$ NCs (see FIG. 8A). With a decrease in (R)-2-octylamine concentration x, the resulting FAPbBr$_3$ NCs showed a gradually decreasing PL lifetime from about 231 ns at x=100% to about 12.2 ns at x=0% due to increased exciton confinement in the smaller NCs. FIG. 8B shows the transient absorption (TA) spectra measured at a delay time of about 2 ps. The spectra were normalized at the ground state bleaching peaks to show the trend. Bleaching of the exciton was observed, which originates from state-filling in all the samples, blue-shifts as x decreases (see FIGS. 9A-9D), which is consistent with absorption and PL spectra and further confirm a decrease of NC size (see FIG. 5A). FAPbBr$_3$ NCs with 25%≤x≤100% exhibited similar PLQE of 57-60%, but NCs with x=0% produced a reduced PLQE of 32.6% due to increased non-radiative recombination at surface defects, which can arise from increased surface/volume ratio in small NCs.

Figure 8C:
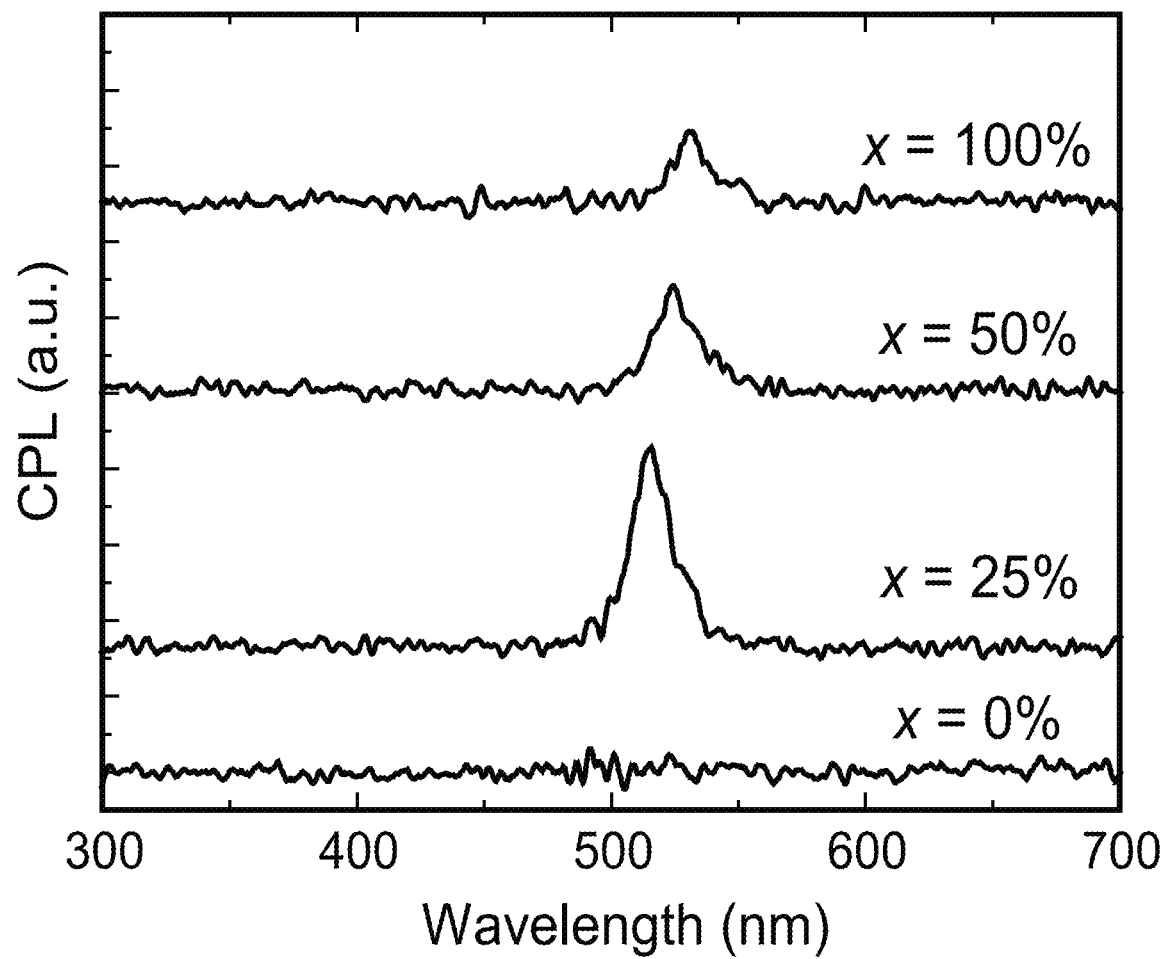
FIG. 8C illustrates CPL in $FAPbBr_3$ NC solutions with different (R)-2-octylamine concentration x, according to some embodiments of the present disclosure.
Figure 8D:
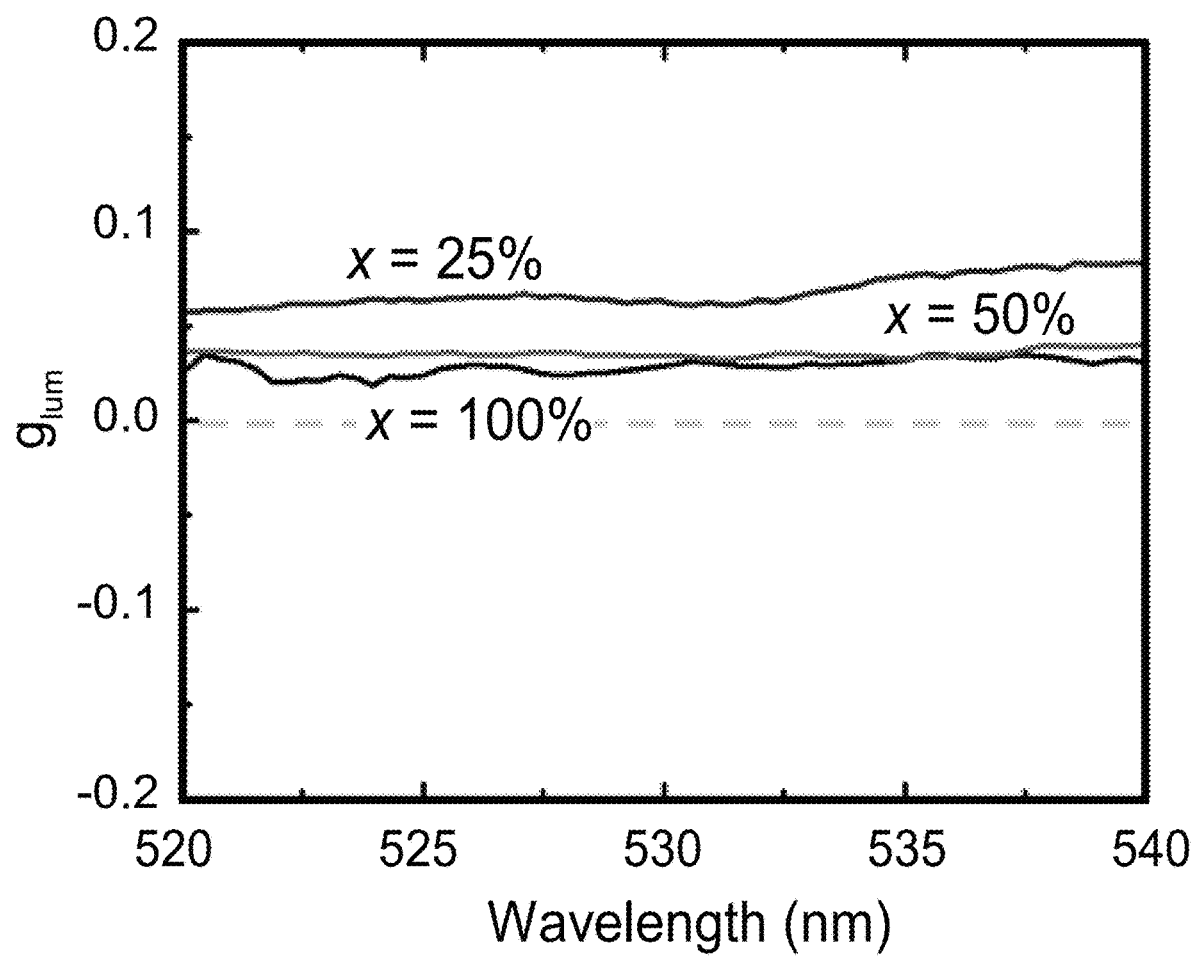
FIG. 8D illustrates $g_{lum}$ in $FAPbBr_3$ NC solutions with different (R)-2-octylamine concentration x, according to some embodiments of the present disclosure.
Figure 8E:
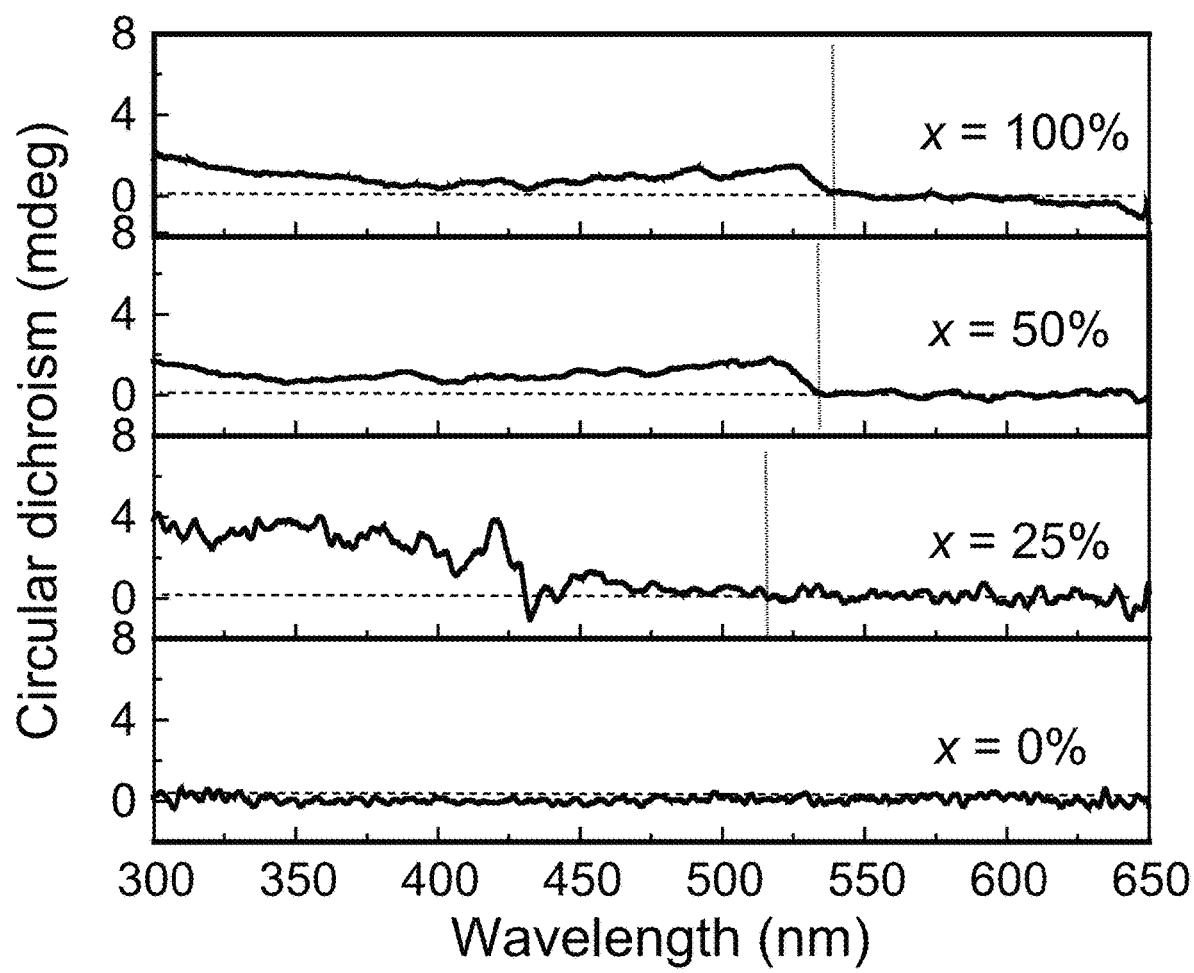
FIG. 8E illustrates circular dichroism (CD) spectrum in $FAPbBr_3$ NC solutions with different (R)-2-octylamine concentration x, according to some embodiments of the present disclosure.
Figure 8F:
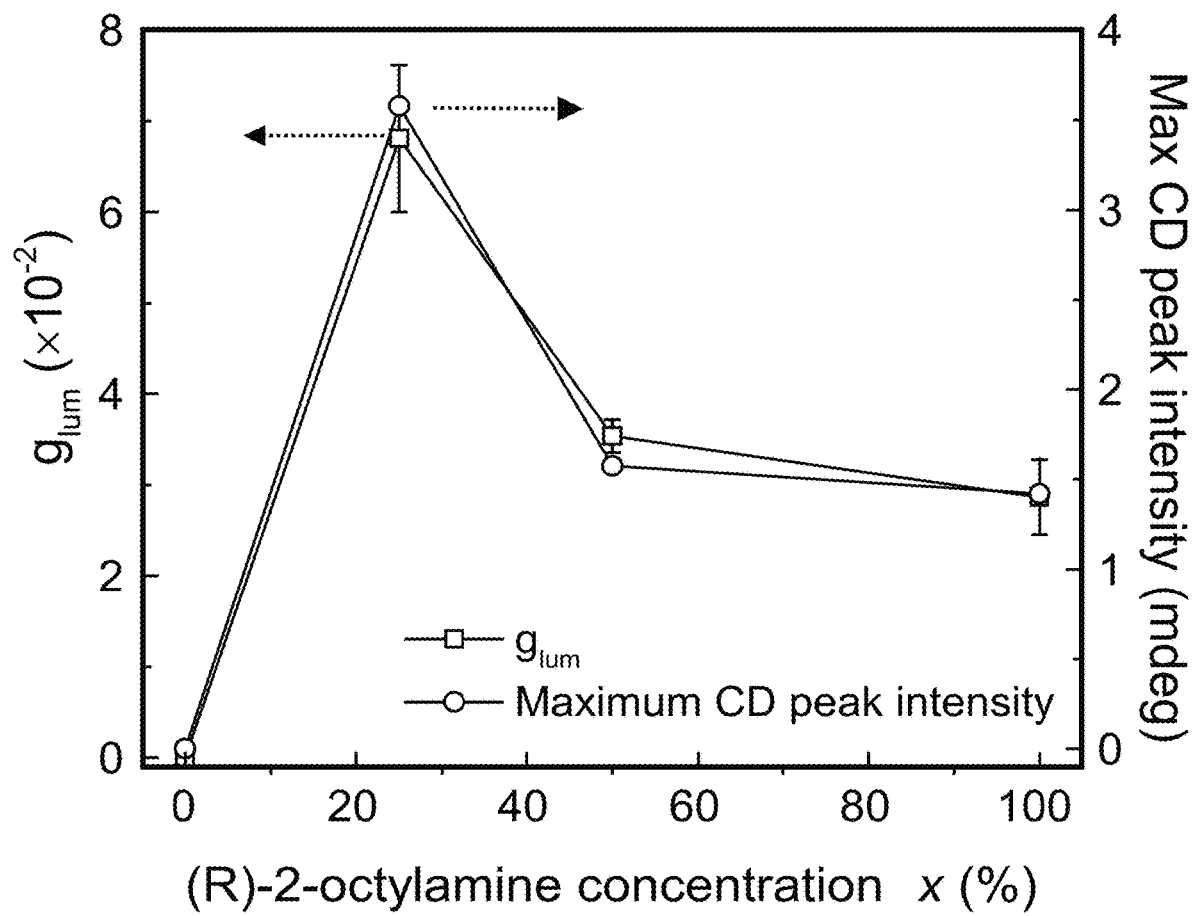
FIG. 8F illustrates average $g_{lum}$ values measured at $520 \leq \lambda \leq 540$ nm and maximum CD peak intensity in $FAPbBr_3$ NC solutions with different (R)-2-octylamine concentration x, according to some embodiments of the present disclosure.
Figure 9A:
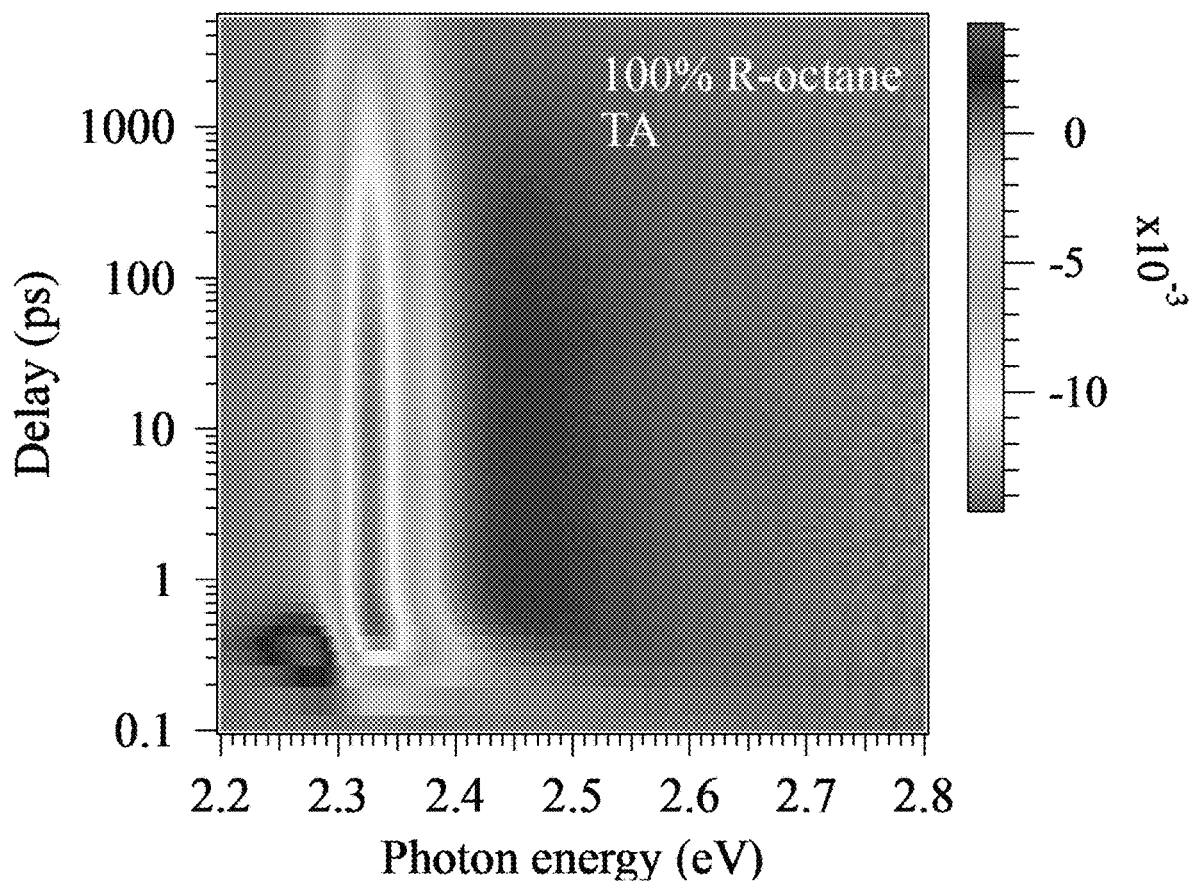
FIGS. 9A-9D illustrate transient absorption spectrum of $FAPbBr_3$ NCs with different (R)-2-octylamine concentration x.
Figure 9B:
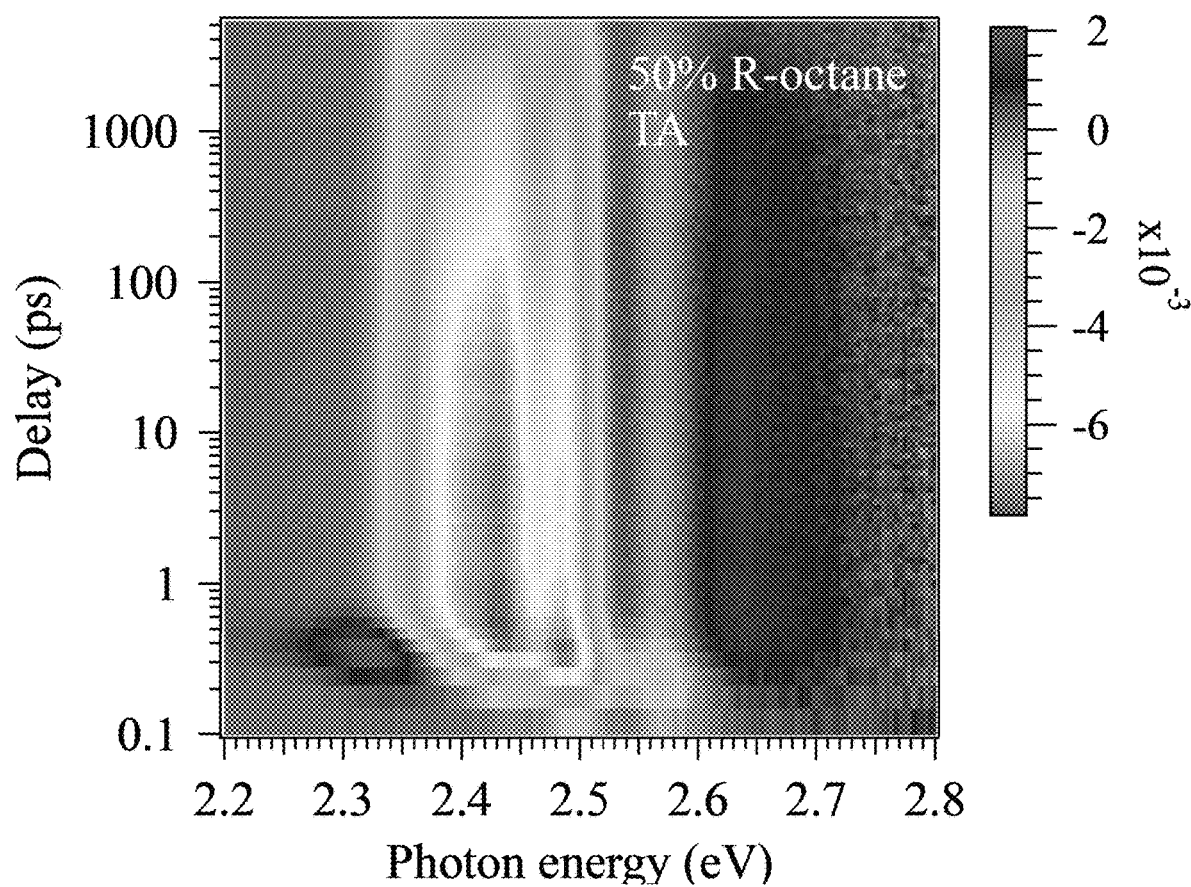
Figure 9C:
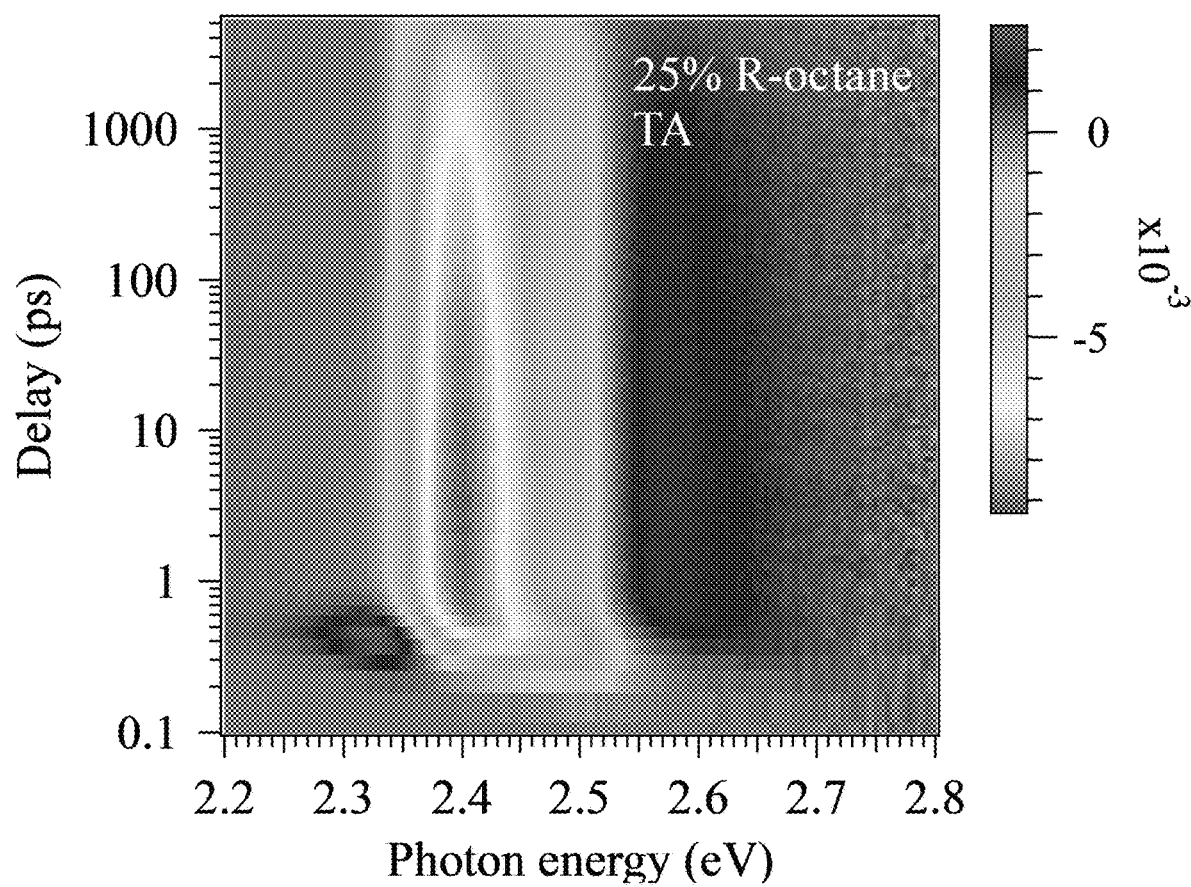
Figure 9D:
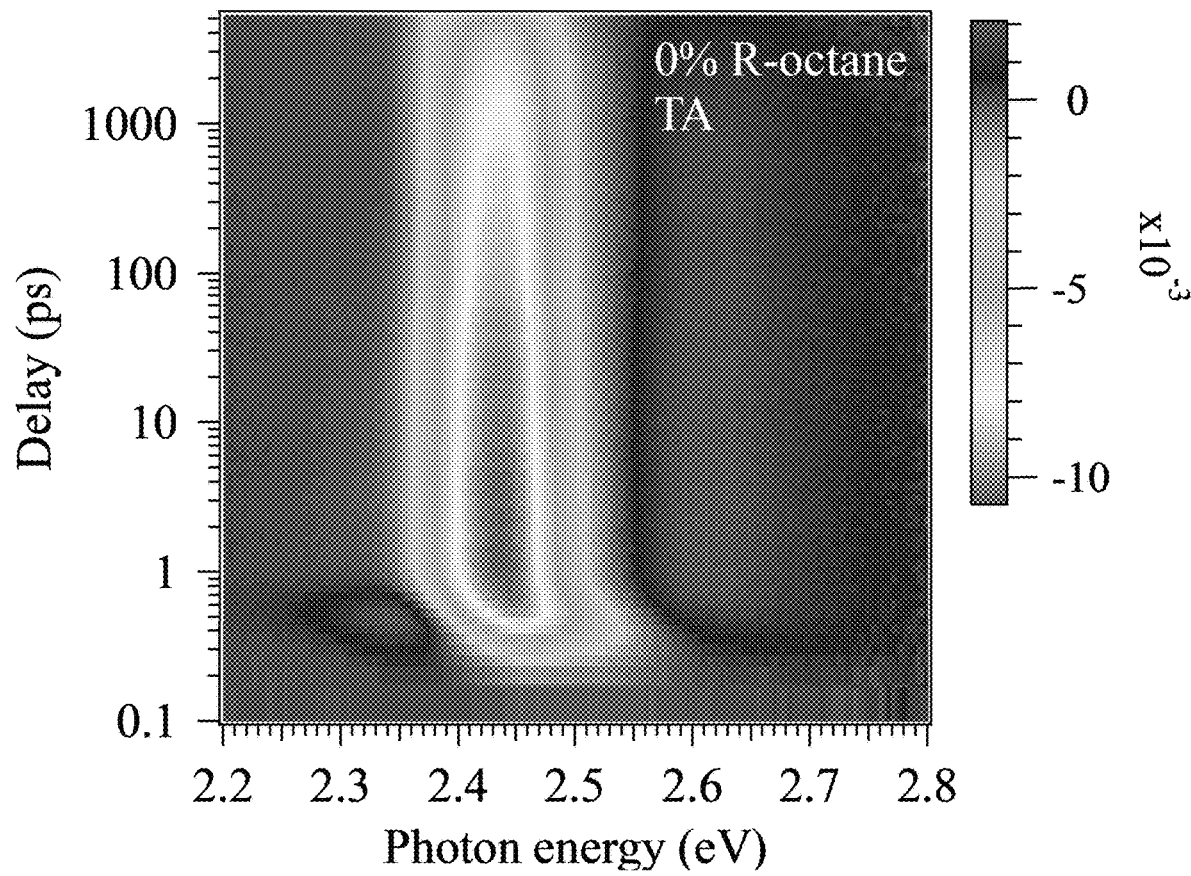
Figure 10:
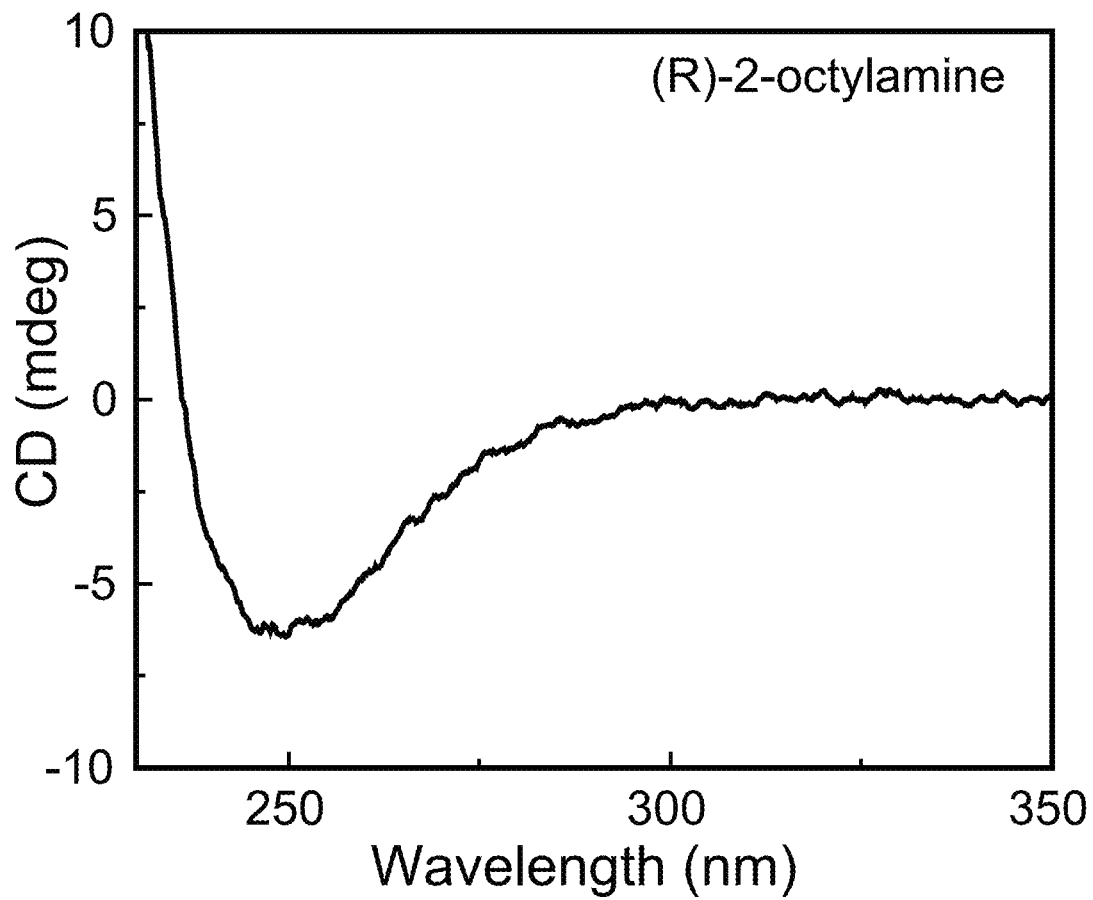
FIG. 10 illustrates circular dichroism spectra of (R)-2-octylamine, according to some embodiments of the present disclosure.

The CPL properties of FAPbBr$_3$ NCs as a function of (R)-2-octylamine concentration x was also studied. As x decreased from 100% to 25%, FAPbBr$_3$ NCs blue-shifted and produced intensified CPL, with $g_{lum}$ increasing from ~2.8×10$^{-2}$ to ~6.8×10$^{-2}$, measured at 520 nm≤λ≤540 nm (see FIGS. 8C and 8D), which is the highest value reported to date for perovskite materials at room temperature. Circular dichroism (CD) of synthesized FAPbBr$_3$ NCs was also measured. FAPbBr$_3$ NCs with chiral ligands had CD spectra onsets at between 500 nm and 540 nm (see FIG. 8E), which are markedly different to that of (R)-2-octylamine (onset at 293 nm) (see FIG. 10); this confirms that chiral molecules positioned on the surface of perovskite nanocrystalline cores induce optical chirality into an inorganic Pb—Br framework, and CPL and CD signals of NCs do indeed originate from FAPbBr$_3$ crystals. As x decreased, NC compositions showed blue-shifted CD spectra and increased maximum CD peak intensity (from 1.462 mdeg for NCs with x=100% to 3.532 mdeg for NCs with x=25%); these results corroborate the results of high glum in small NCs at low concentrations of chiral ligands (see FIG. 8F). FAPbBr$_3$ NCs without (R)-2-octylamine (x=0%) did not show any CPL or CD signal as expected due to the absence of chiral molecules on the surface of the perovskite NC cores.

Although one may expect that NCs with the highest concentration (for example, 100%) of injected chiral ligands during synthesis should yield the largest CPL intensity (ideally maximum g-factor=2), the results described herein surprisingly show that the NCs with relatively low concentrations (e.g., about 25%) of chiral ligands produced the largest CPL (g-factor=~6.8×10$^{-2}$). In the experiments described herein, (R)-2-octylamine has one functional group, which can be coordinated to the perovskite crystals. Therefore, the high CPL of FAPbBr$_3$ NCs having relatively low concentrations of chiral ligands during synthesis may be attributed to the fact that small NCs 1) have high surface-to-volume ratio where more surface chiral ligands can attach to the surface and 2) have minimized distance between surface chiral ligands and electronic states in the NC cores, inducing larger effects of chiral ligands (i.e., electronic coupling, chiral ligand-induced surface lattice distortion, and/or surface defects) on the electron-hole wave-functions inside the perovskite NC cores.

Figure 11A:
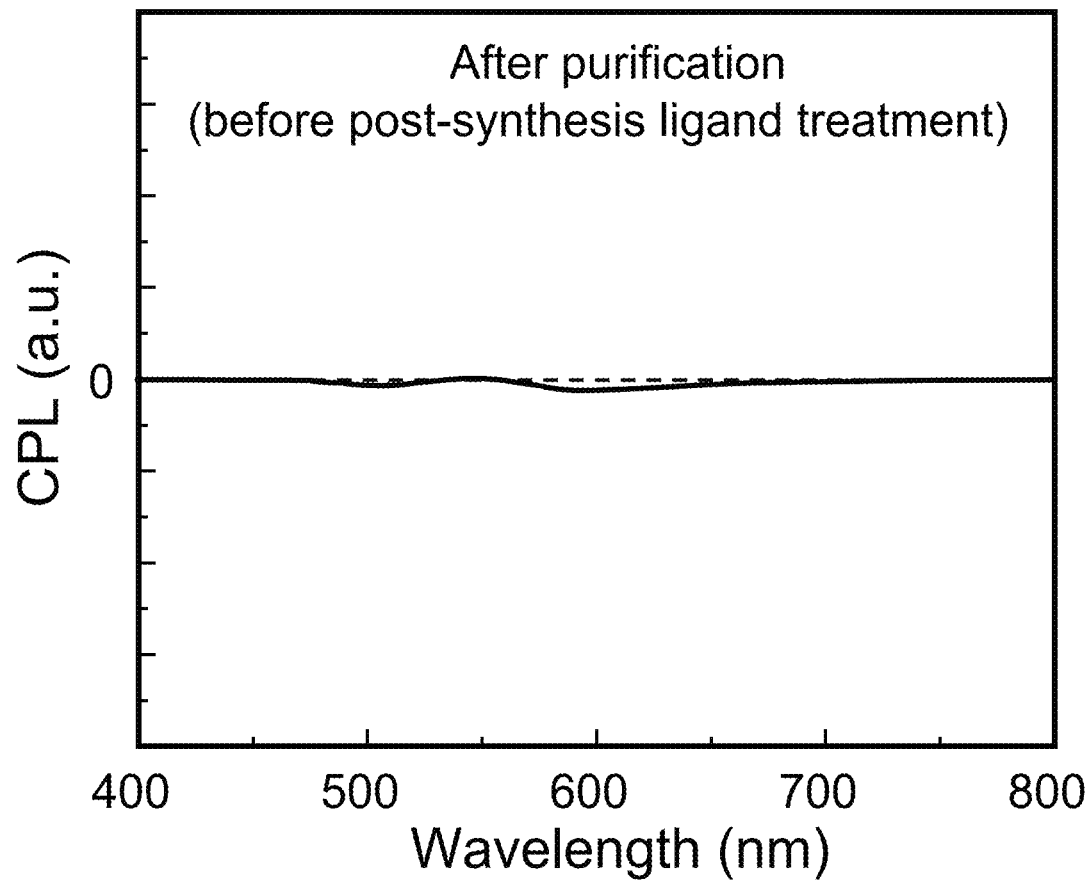
FIG. 11A illustrates CPL of purified $FAPbBr_3$ NCs, according to some embodiments of the present disclosure.
Figure 11B:
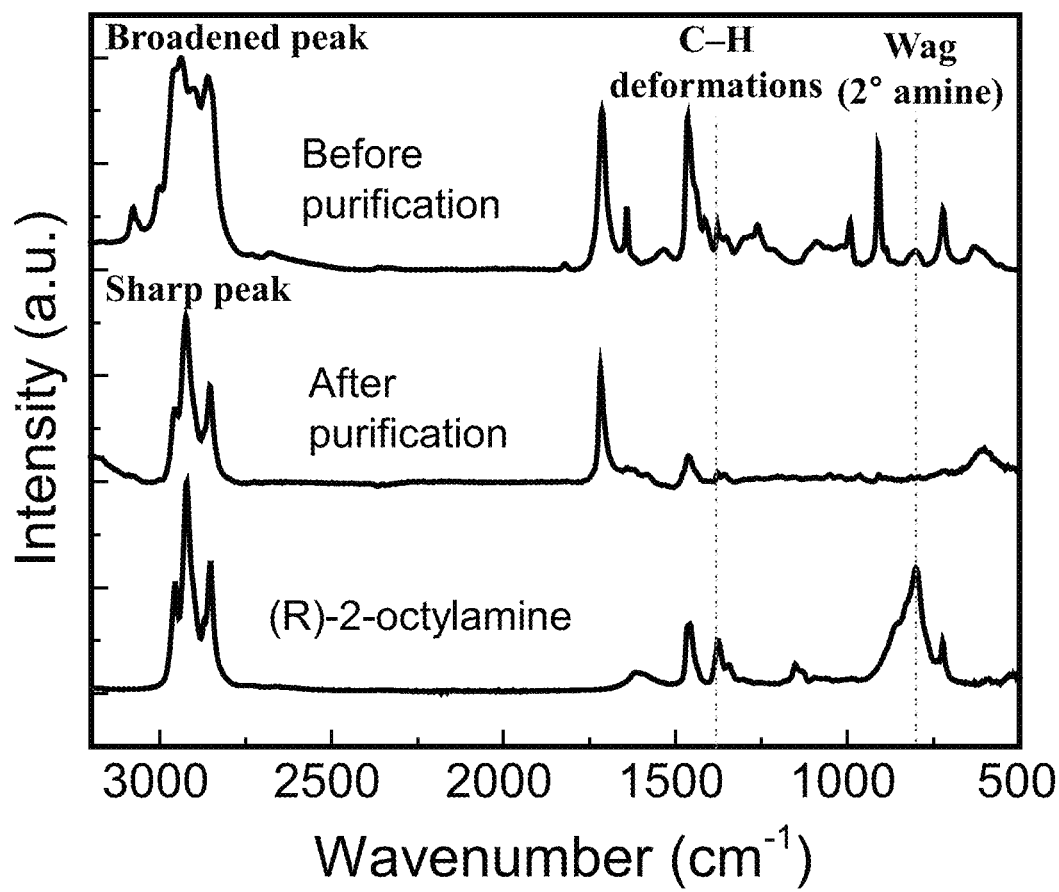
FIG. 11B illustrates FTIR spectrum of (R)-2-octylamine and as-synthesized (before-purified) and purified $FAPbBr_3$ NCs, according to some embodiments of the present disclosure. $FAPbBr_3$ NCs with (R)-2-octylamine concentration x=50% were tested.

Often, the use of NCs in an optoelectronic device requires that the NCs form a high-quality thin film, which often necessitates purification of the NCs prior to their deposition. However, a common purification method using MeOAc removes the chiral ligands from the as-synthesized NC surfaces and reduces or eliminates the CPL response (see FIG. 11A). The removal of (R)-2-octylamine was confirmed by a sharpening of the FTIR peaks in the 2850-3000 cm$^{-1}$ and disappearances of the C—H deformation peak at 1371 cm$^{-1}$ and of the N—H wagging peak in the 2° amine at 800 cm$^{-1}$ (see FIG. 11B). To reactivate a CPL response, a post-synthetic ligand treatment to the purified NCs was performed by mixing a dispersion of purified NCs with a saturated solution of a chiral molecule in ethyl acetate (EtOAc). Here, R-,S-MBA:Br was chosen as the chiral molecule, although others may be used, as described herein. EtOAc was chosen as the solvent because EtOAc preserves the crystal structure of the perovskite NCs while still dissolving the chiral molecules of interest.

Figure 12A:
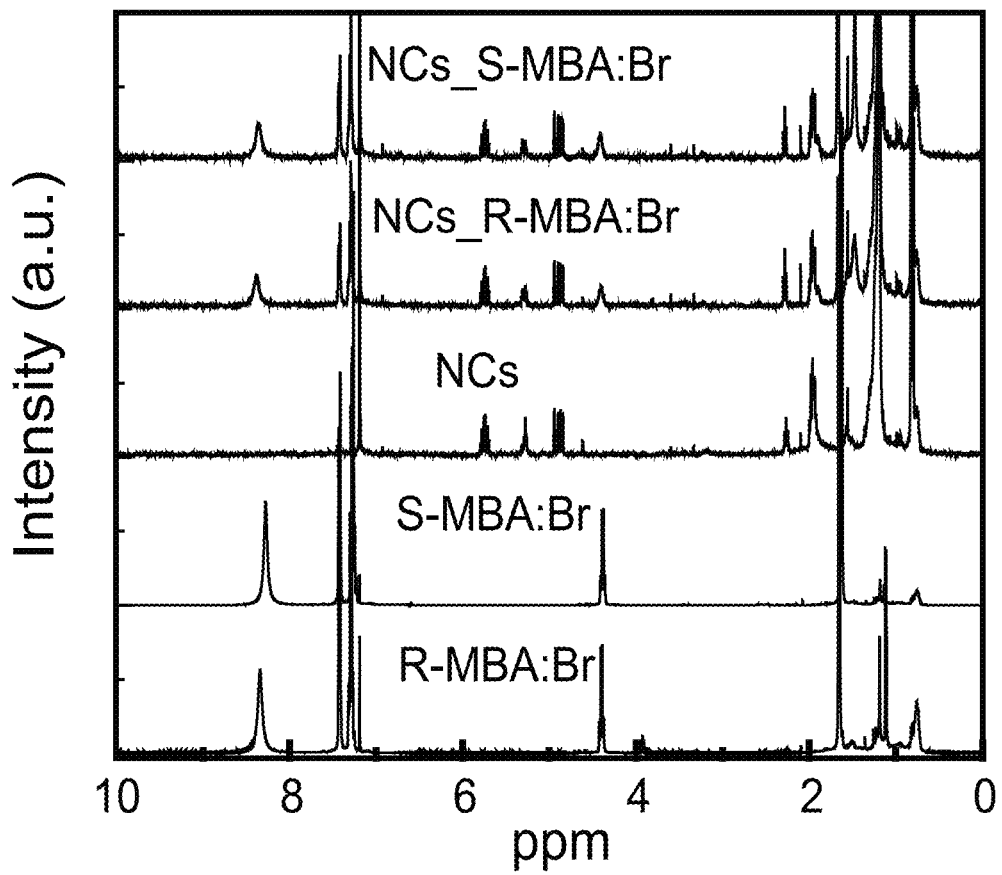
FIG. 12A illustrates $^1H$ nuclear magnetic resonance (NMR) spectra of R-,S-MBA:Br, purified $FAPbBr_3$ NCs and ligand-treated $FAPbBr_3$ NCs with R-,S-MBA:Br, according to some embodiments of the present disclosure.
Figure 13A:
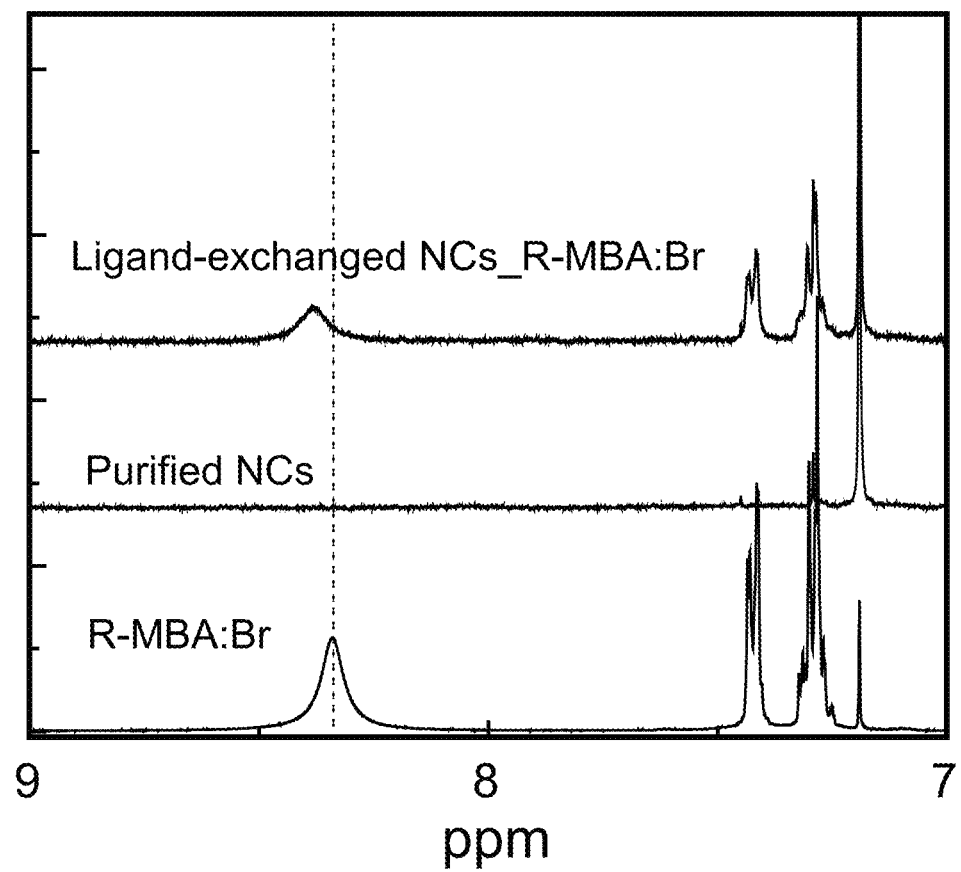
FIG. 13A illustrates magnified $^1H$ NMR spectra (9-7 ppm deg) of R-MBA:Br, purified NCs and ligand-treated NCs with R-MBA:Br, according to some embodiments of the present disclosure.
Figure 13B:
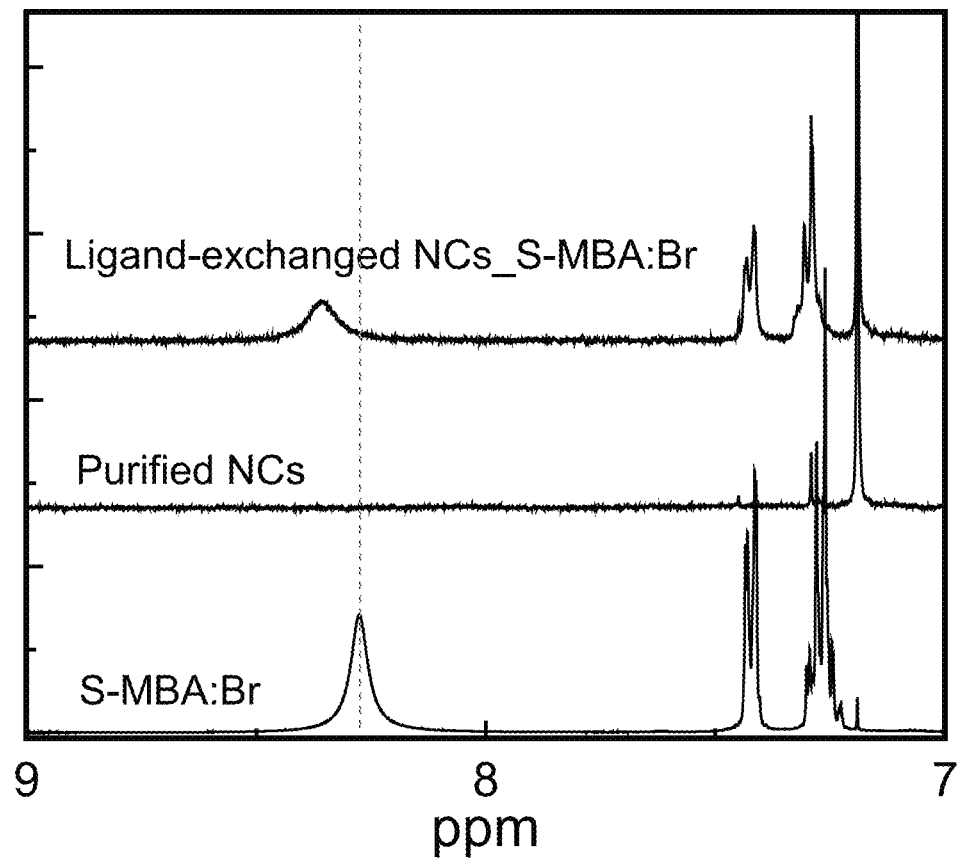
FIG. 13B illustrates magnified $^1H$ NMR spectra (9-7 ppm deg) of S-MBA:Br, purified NCs and ligand-treated NCs with S-MBA:Br, according to some embodiments of the present disclosure.
Figure 14A:
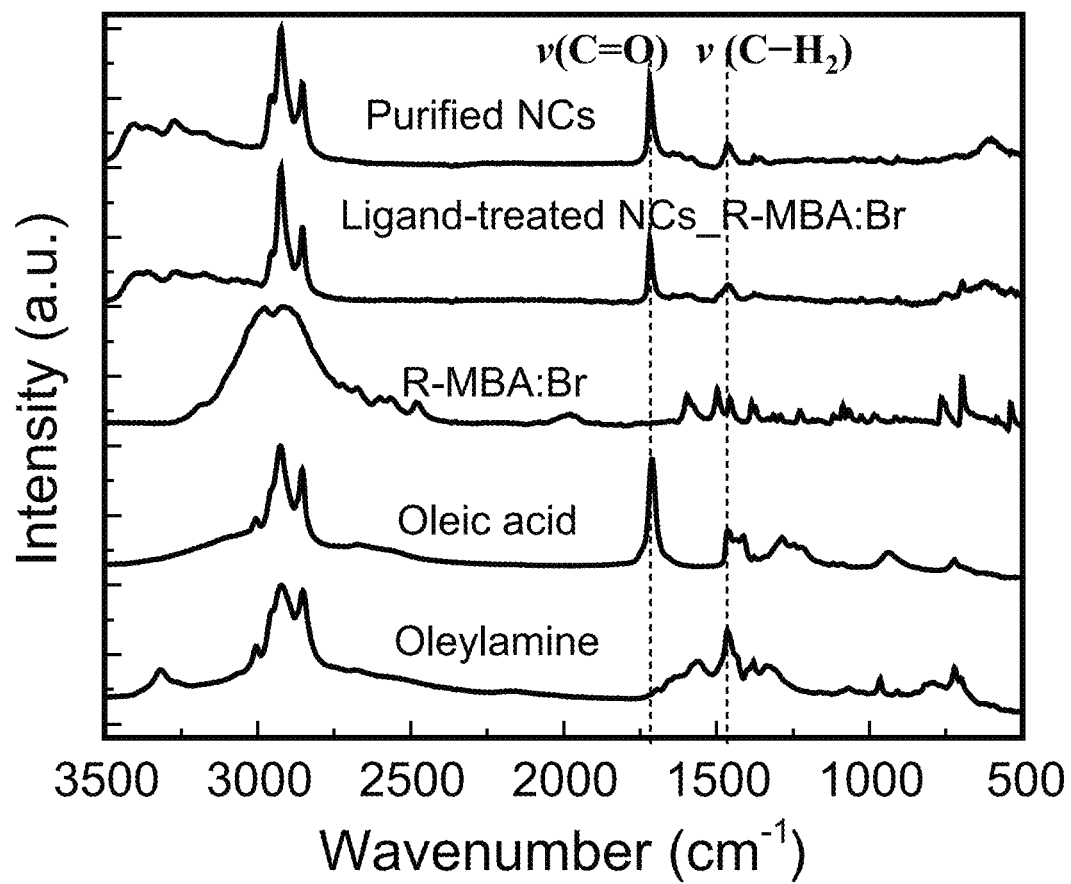
FIG. 14A illustrates FTIR spectra of oleic acid, oleylamine, R-MBA:Br, purified NCs and ligand-treated $FAPbBr_3$ NCs with R-MBA:Br, according to some embodiments of the present disclosure.
Figure 14B:
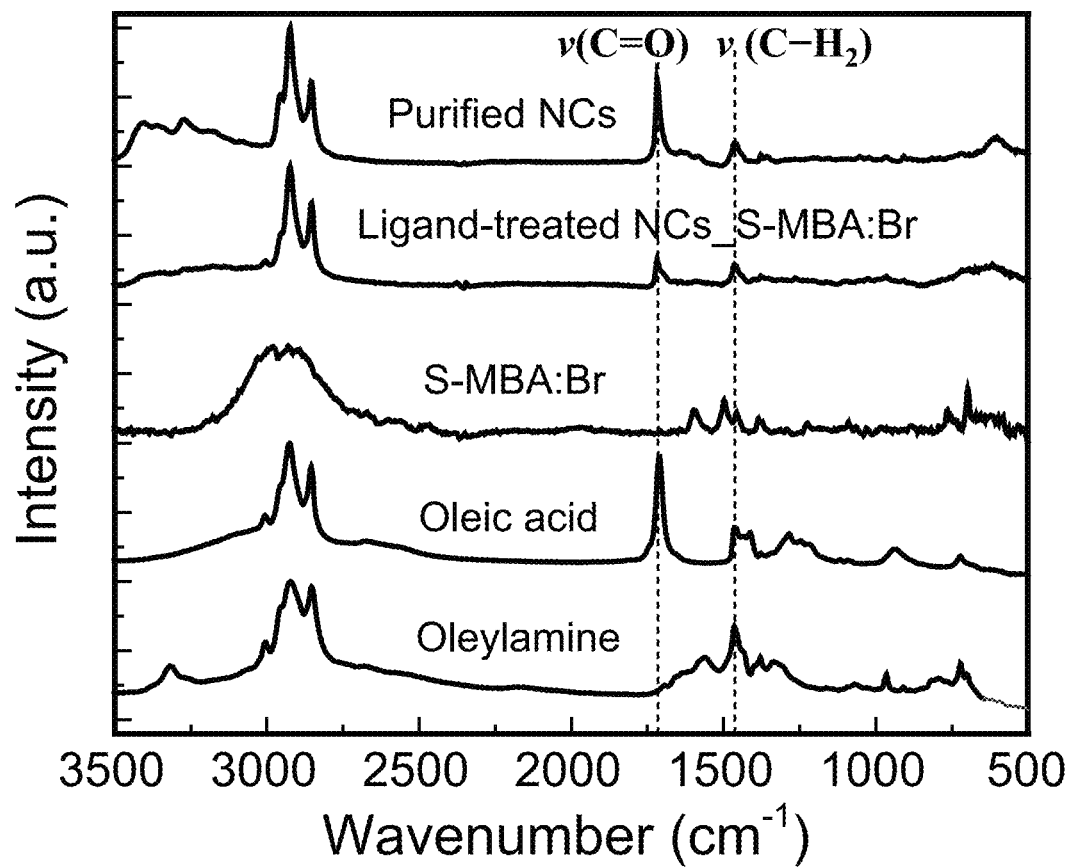
FIG. 14B illustrates FTIR spectra of oleic acid, oleylamine, S-MBA:Br, purified NCs and ligand-treated $FAPbBr_3$ NCs with S-MBA:Br, according to some embodiments of the present disclosure.
Figure 15A:
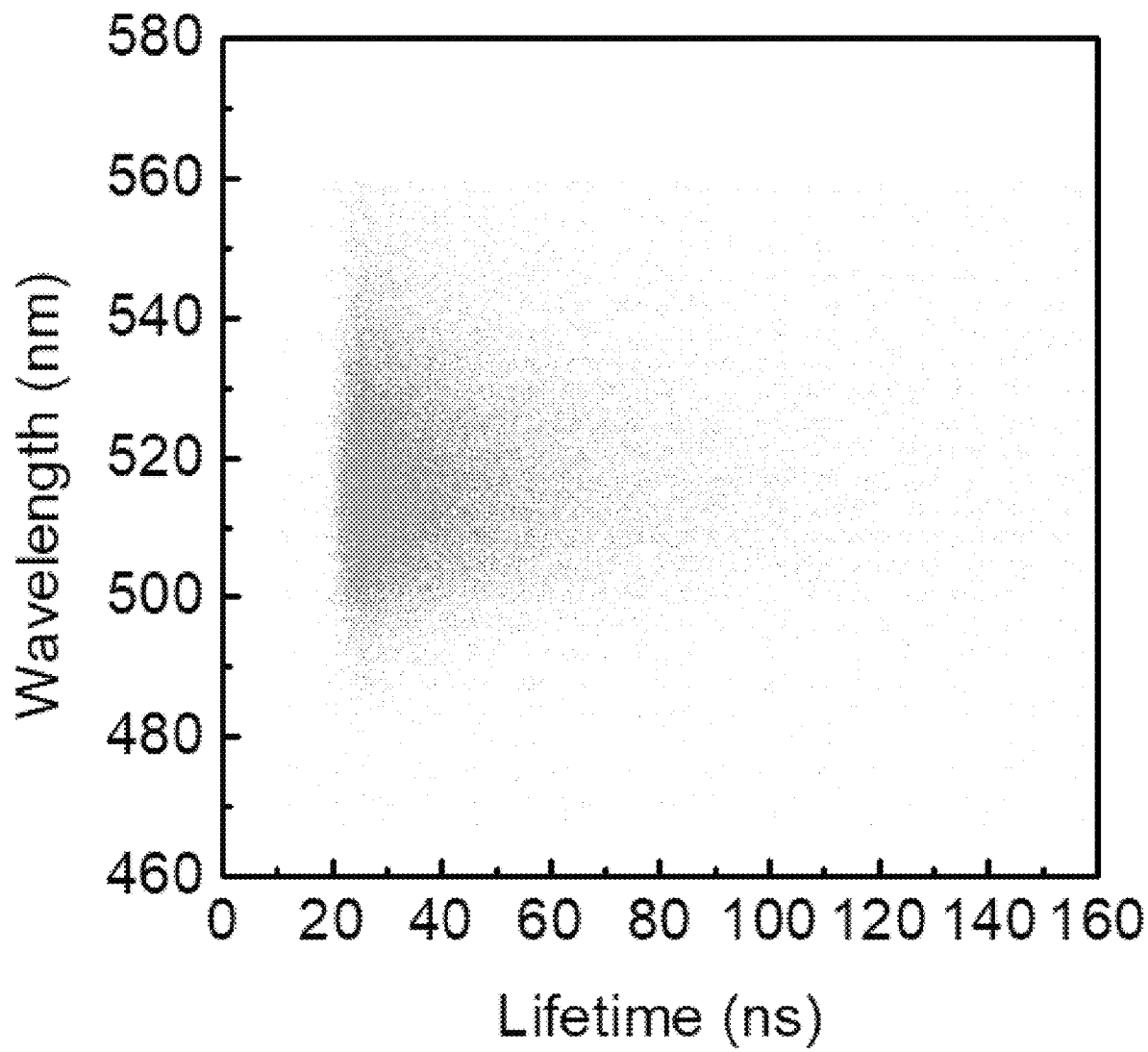
Figure 15B:
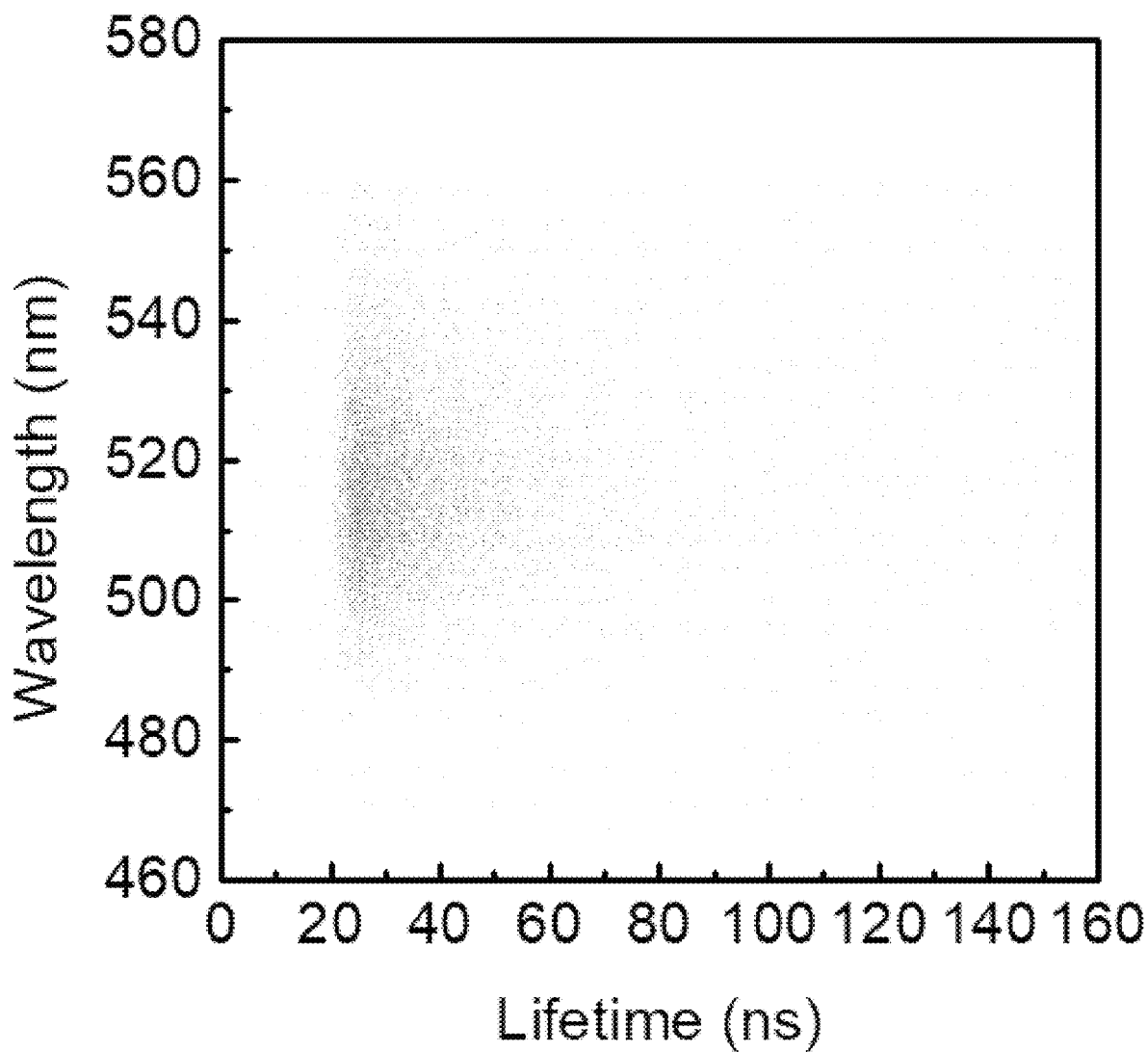
Figure 15C:
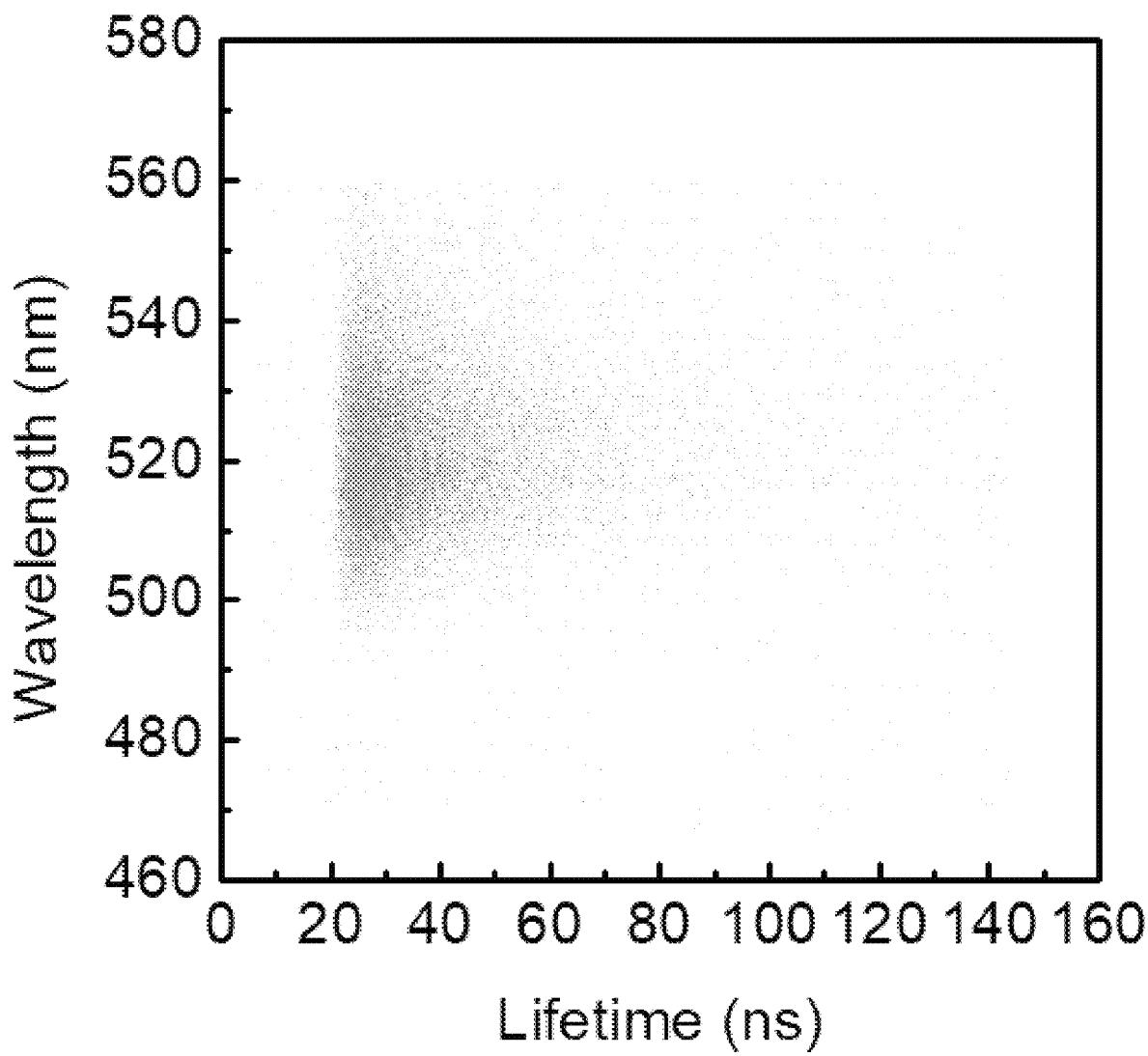
Figure 15D:
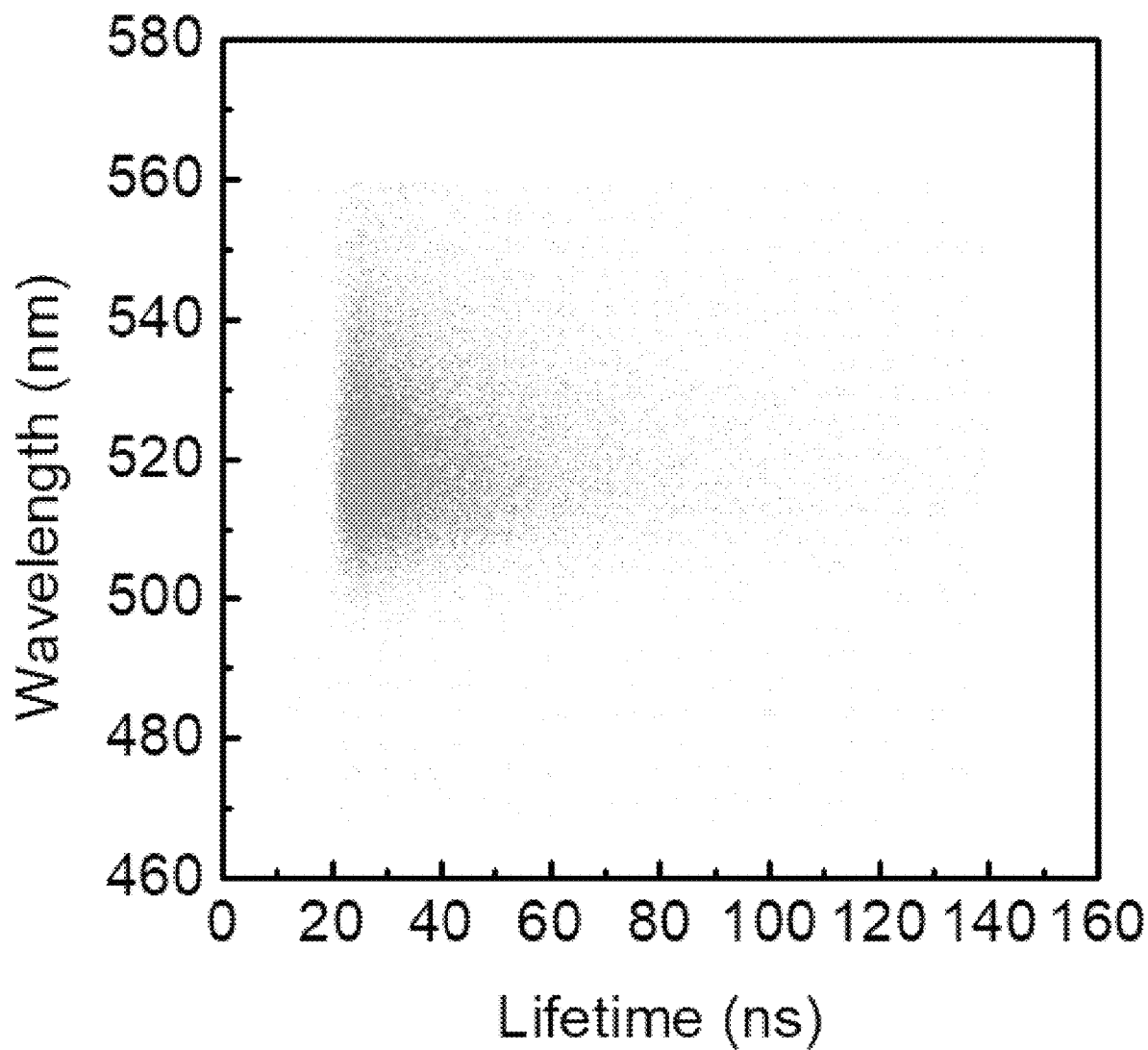

$^1$H NMR was conducted to verify that R-,S-MBA:Br was attached to the NC core surfaces after the post-synthetic ligand treatment described above (see FIG. 12A). The purified FAPbBr$_3$ NCs show peaks for chemical shifts (δ) ~0.8 ppm, ~1.2 ppm and ~1.9 ppm, which arise from alkyl protons, indicating that some OA and OAm molecules (i.e., ligands) remained on the NC core surfaces after purification. The R-,S-MBA:Br ligands exhibited a sharp NMR peak at δ ~8.3 ppm which corresponds to aromatic protons and did not overlap with any peaks from the purified NCs. Post-synthetic ligand treated NCs with R-,S-MBA:Br showed an aromatic-proton NMR peak that was broadened and shifted down field to 8.35-8.4 ppm compared to that of pure R-,S-MBA:Br (see FIGS. 13A and 13B). These changes indicate R-,S-MBA:Br molecules associate with NC surface. FTIR spectra shows a relative decrease in the peak intensity of the v(C—H$_2$) and v(C=O) after ligand treatment (see FIGS. 14A and 14B), indicating that some R-,S-MBA:Br ligands were attached to the NC core surfaces by replacing either oleylammonium (from OAm) and/or oleate (from OA).

Figure 12B:
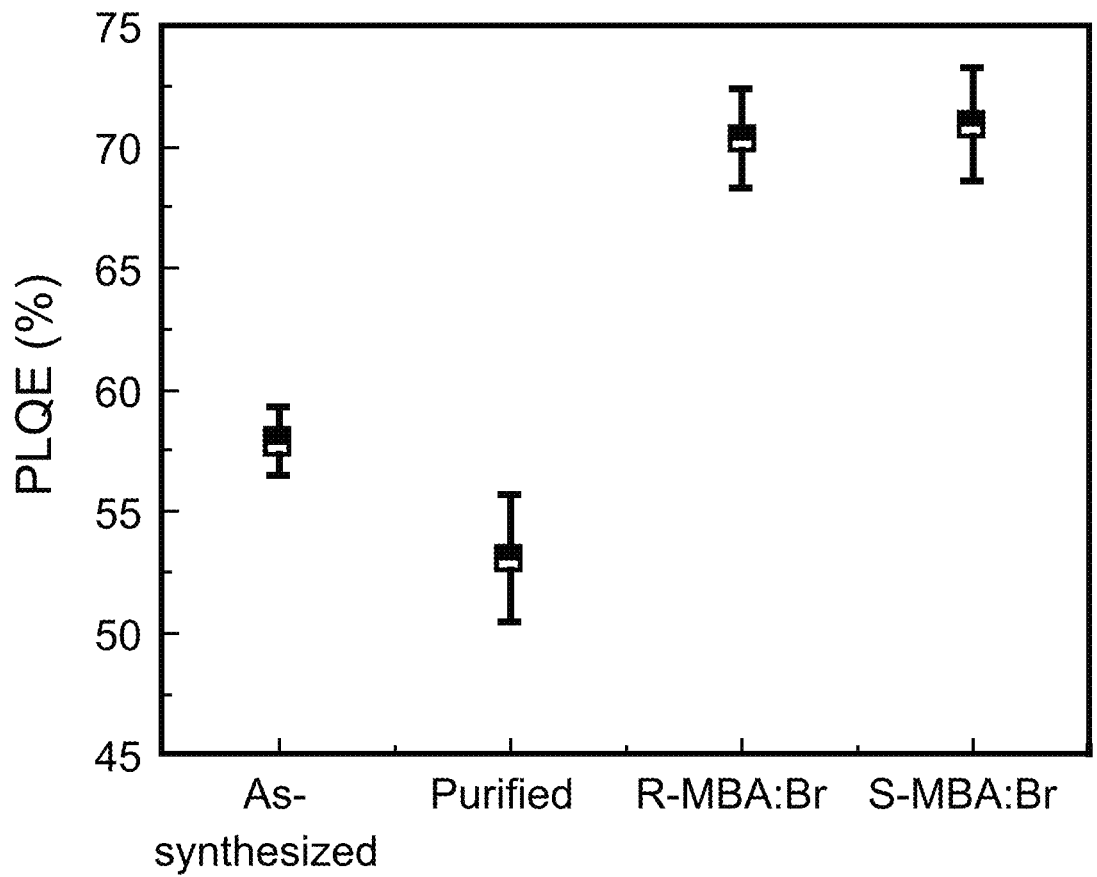
FIG. 12B illustrates PLQE of as-synthesized $FAPbBr_3$ NCs, purified NCs and ligand-treated NCs with R-,S-MBA:Br, according to some embodiments of the present disclosure.
Figure 12C:
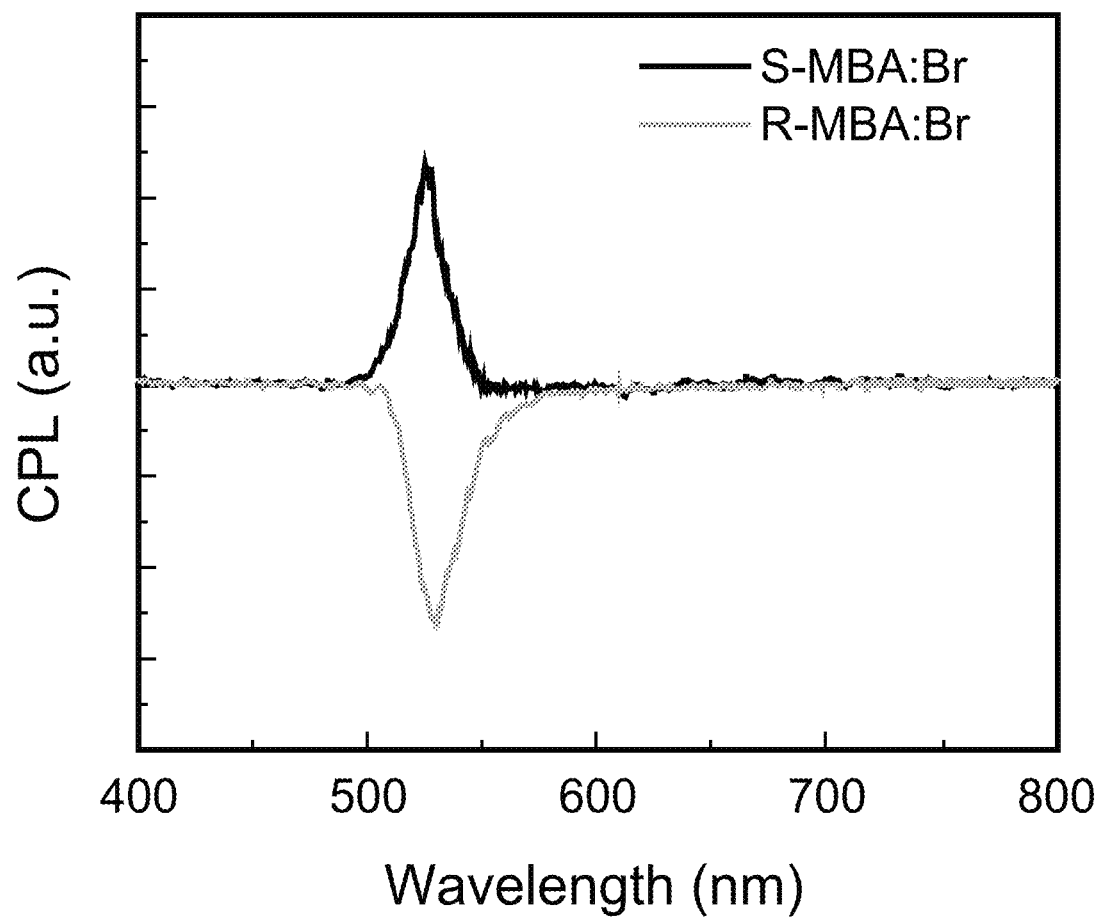
FIG. 12C illustrates CPL of ligand-treated $FAPbBr_3$ NCs with R-,S-MBA:Br, according to some embodiments of the present disclosure.
Figure 12D:
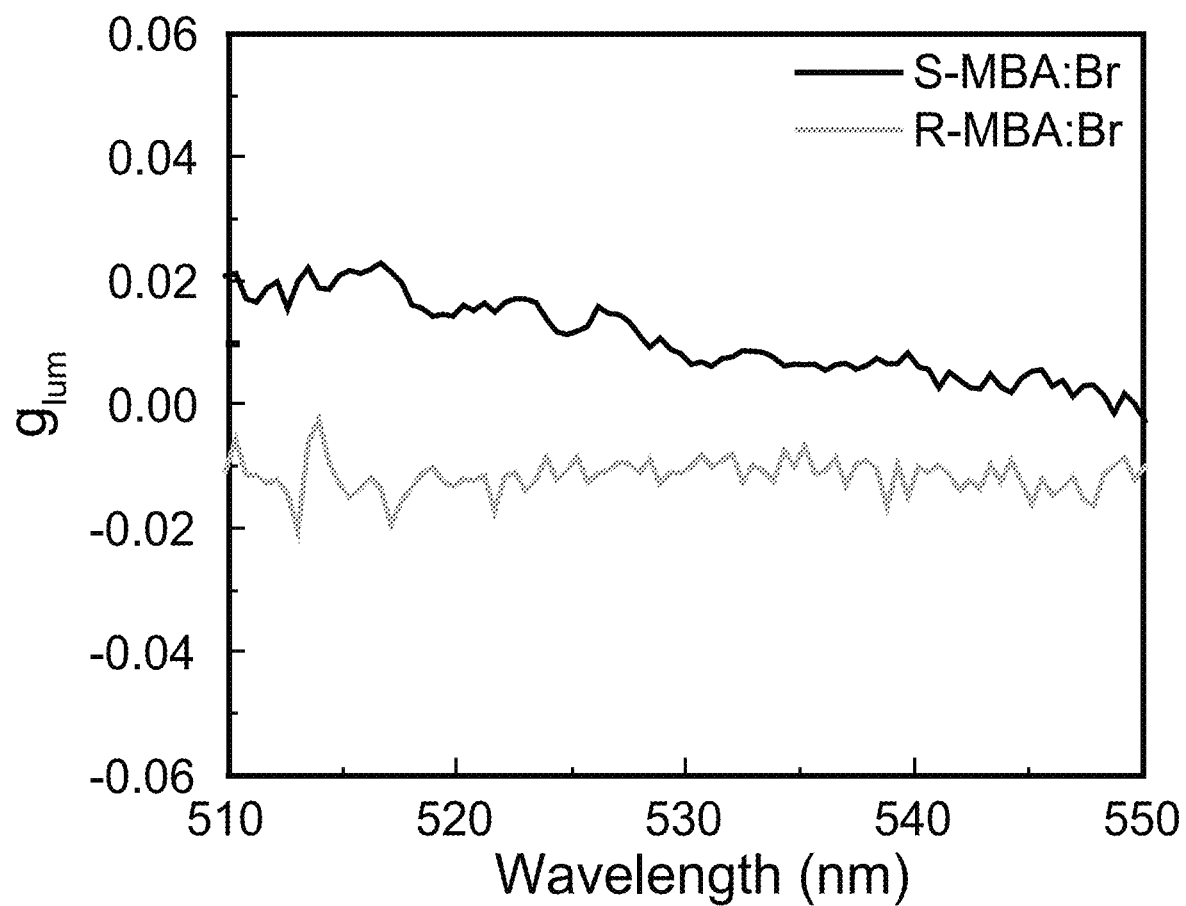
FIG. 12D illustrates $g_{lum}$ of ligand-treated $FAPbBr_3$ NCs with R-,S-MBA:Br, according to some embodiments of the present disclosure.

Having demonstrated chiral molecules attach to the purified NC core surfaces through the post-synthetic ligand treatment, whether they affect exciton recombination dynamics and confer chiral emission in NCs was examined next. Purified NCs exhibited a PLQE ~53% but upon the post-synthetic ligand treatment, the PLQE rose significantly to ~70.4% for NCs with R-MBA:Br and to ~71% for NCs with S-MBA:Br (see FIG. 12B). TRPL maps show that PL lifetime decreased after purification but was then rectified after the post-purification ligand-treatment (see FIGS. 15A-15D). These results indicate that R-,S-MBA:Br passivates the surface defects induced by detached ligands from the NC surface during the purification and thus reduces non-radiative recombination. Indeed, the treatment of the purified NCs with R-,S-MBA:Br ligands induces CPL responses with average $g_{lum}$=±1.18×10$^{-2}$ at 510≤λ≤550 nm at room temperature (see FIGS. 12C and 12D). The success of this post-synthetic ligand treatment method is of importance because it solves two problems with the current methods for inducing CPL on NCs. First, chiral ligands are often removed during the purification process leading to a reduction and/or elimination of CPL, and second, long native ligands (e.g., OA and/or OAm) often reduce charge transport, both of which are necessary for the implementation of NCs into spintronic based applications.

These results show the following. Dynamic ligand binding to NC core surfaces and steric hindrance of chiral molecules arising from bulky alkyl group limit their strong and compact attachment to the NC core surfaces. Therefore, other chiral molecules with different functional groups (e.g., carboxylic acid, phosphonic acid) which adhere more strongly to the NC surface, and with short aliphatic groups, which have less steric hindrance and can attach to the NC surface more compactly, can boost the $g_{lum}$ of perovskite NCs. Among other things, this may be achieved using chiral Zwitterionic molecules, which have both acid groups (e.g., SO$_3^-$, COO$^-$, and PO$_3^-$) and amine groups (NH$_3^+$), can be effective choices to realize efficient chiral NCs because Zwitterionic ligands can reveal various binding modes on the NC core surfaces such as bidentate (i.e., two binding sites between ligands and NCs) and tridentate (i.e., three binding sites between ligands and NCs).

Figure 17A:
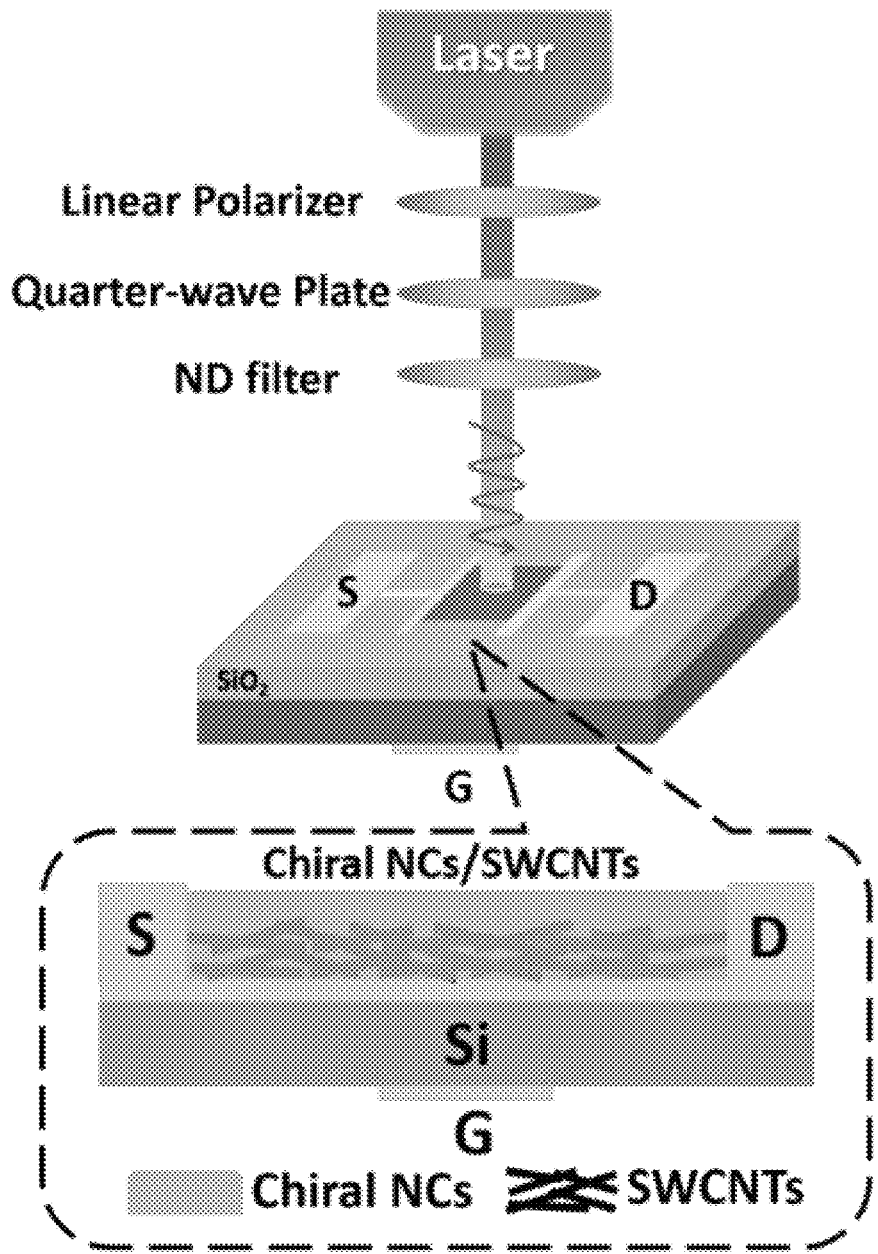
FIG. 17A illustrates a direct circular polarized light (CPL) detection system and/or device using R-MBA:Br treated CsPbBr$_3$ and S-MBA:Br treated CsPbBr$_3$ thin films and R-MBA:Br treated and S-MBA:Br treated —CsPbBr$_3$ thin film/(6, 5) SWCNT heterojunctions. A schematic of the experimental setup showing the generation of left- and right-hand circular polarized light and an enlarged schematic of a fabricated field-effect transistor (FET) device using chiral NCs/SWCNTs as the channel materials, according to some embodiments of the present disclosure.
Figure 17B:
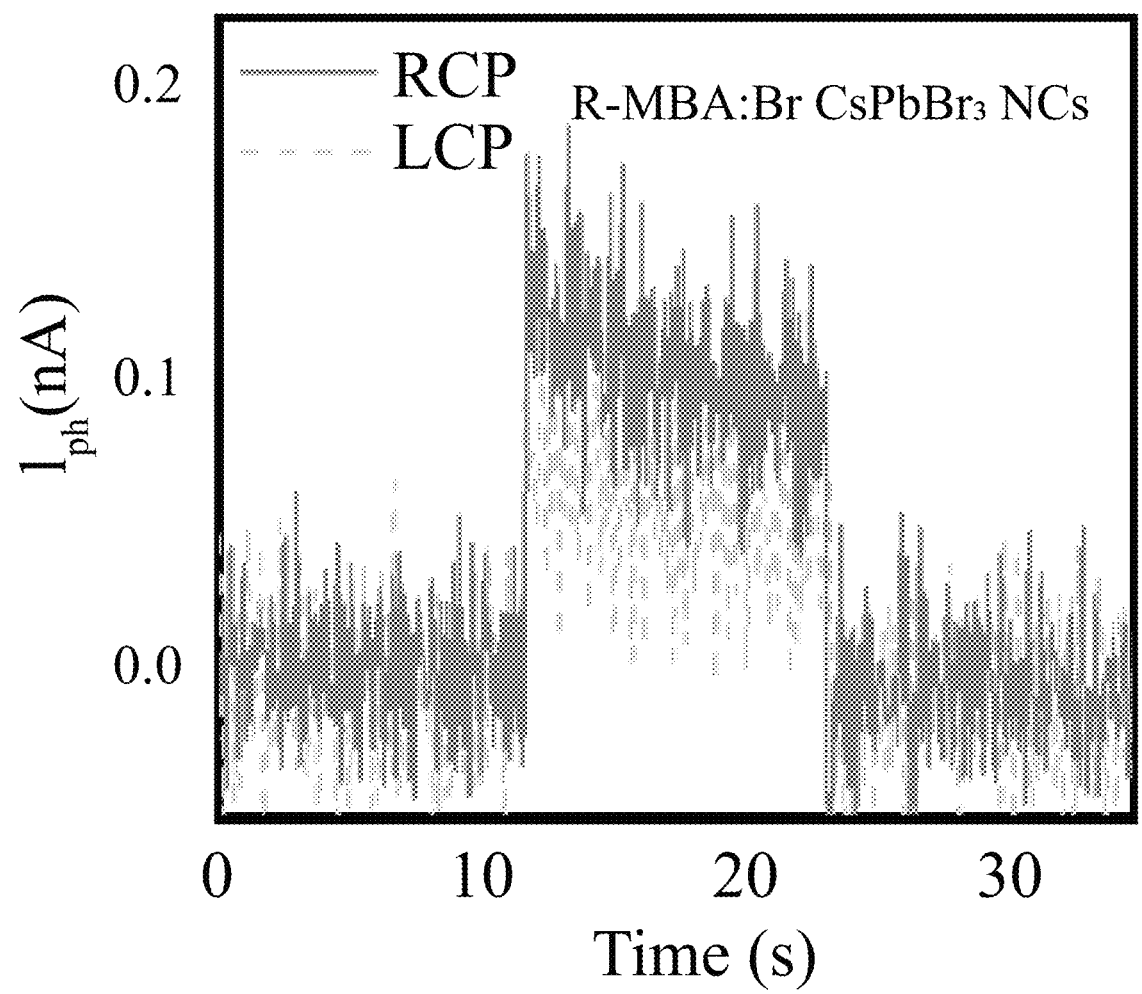
FIG. 17B illustrates time-dependent photocurrent changes ($I_{ph}$) of a R-MBA:Br treated CsPbBr$_3$ device under the illumination of 405 nm right-handed CPL (RCP) and left-handed CPL (LCP) laser separately at $V_{DS}$=60V (here $V_{DS}$ is voltage between Drain and Source) Percentage of gph factor of R-, S- and Achiral (where Achiral refers to without chiral ligands) CsPbBr$_3$ under 405 nm RCP and LCP illumination at $V_{DS}$=60 V, according to some embodiments of the present disclosure.

To further demonstrate the ability of chiroptical and spintronic properties of R-/S-MBA:Br-treated CsPbBr$_3$ NCs were evaluated. An in-plane two-terminal circularly polarized light (CPL) detector was developed to directly differentiate the left-handed CPL (LCP) and right-handed CPL (RCP). This type of CPL detector was fabricated by applying R-/S-MBA:Br CsPbBr$_3$ NC thin films as sensing materials, bridging a 10 μm source-drain channel with a 1000 μm channel width. To compare the sensing ability of R-/S-MBA:Br CsPbBr$_3$ NCs, the Achiral (nonchiral, without chiral ligands) CsPbBr$_3$ NCs was also used to fabricate a CPL detector as the control device. The schematic of the experimental setup is illustrated in FIG. 17A. LCP and RCP light were generated using a linear polarizer and quarter-wave plate to transform the linearly polarized 405 nm laser to LCP and RCP light, and a neutral density filter was applied to control the power density of the light transferred by the laser to the CPL detector. The photocurrent responses of R-MBA:Br-treated CsPbBr$_3$ NCs to RCP and LCP lights are illustrated in FIG. 17B. 60V V$_{DS}$ was applied due to the relatively poor carrier transport ability of the exemplary NC thin films tested.

Figure 17C:
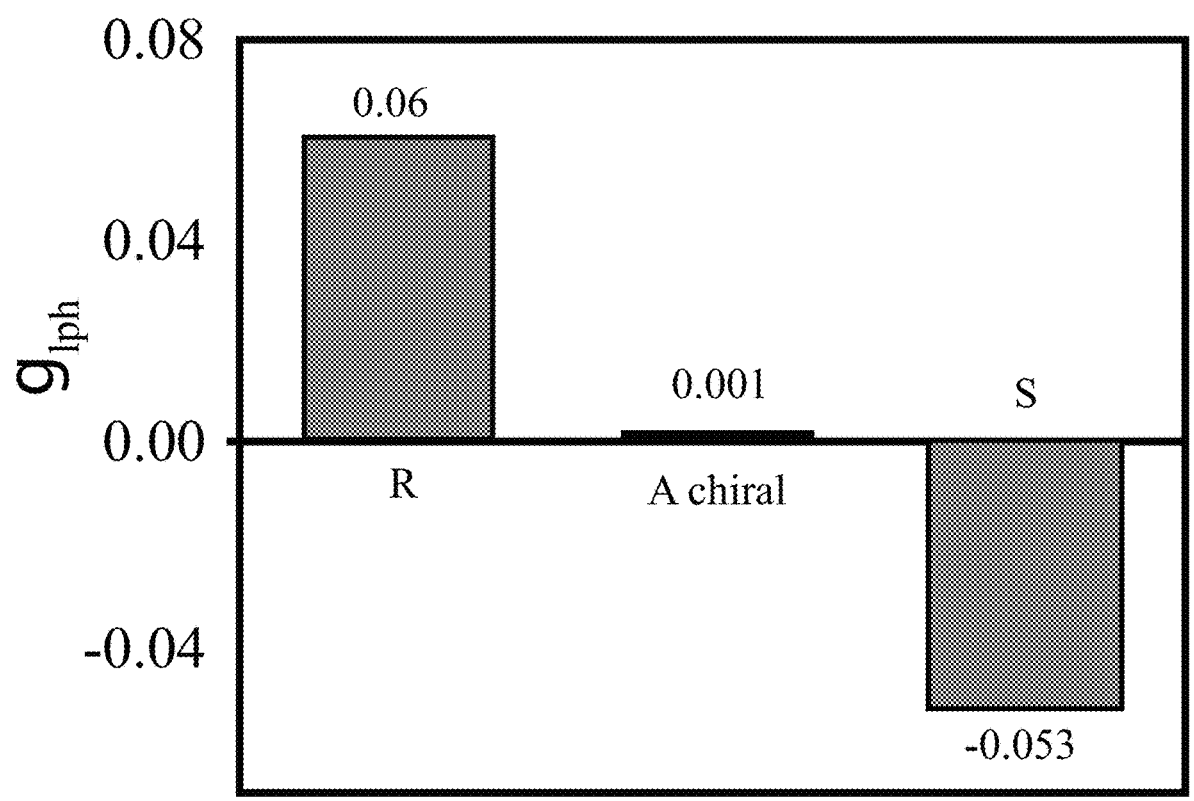
FIG. 17C illustrates percentage of gph factor of R-, S- and Achiral CsPbBr$_3$ films under 405 nm RCP and LCP illumination at $V_{DS}$=60V, according to some embodiments of the present disclosure.
Figure 17D:
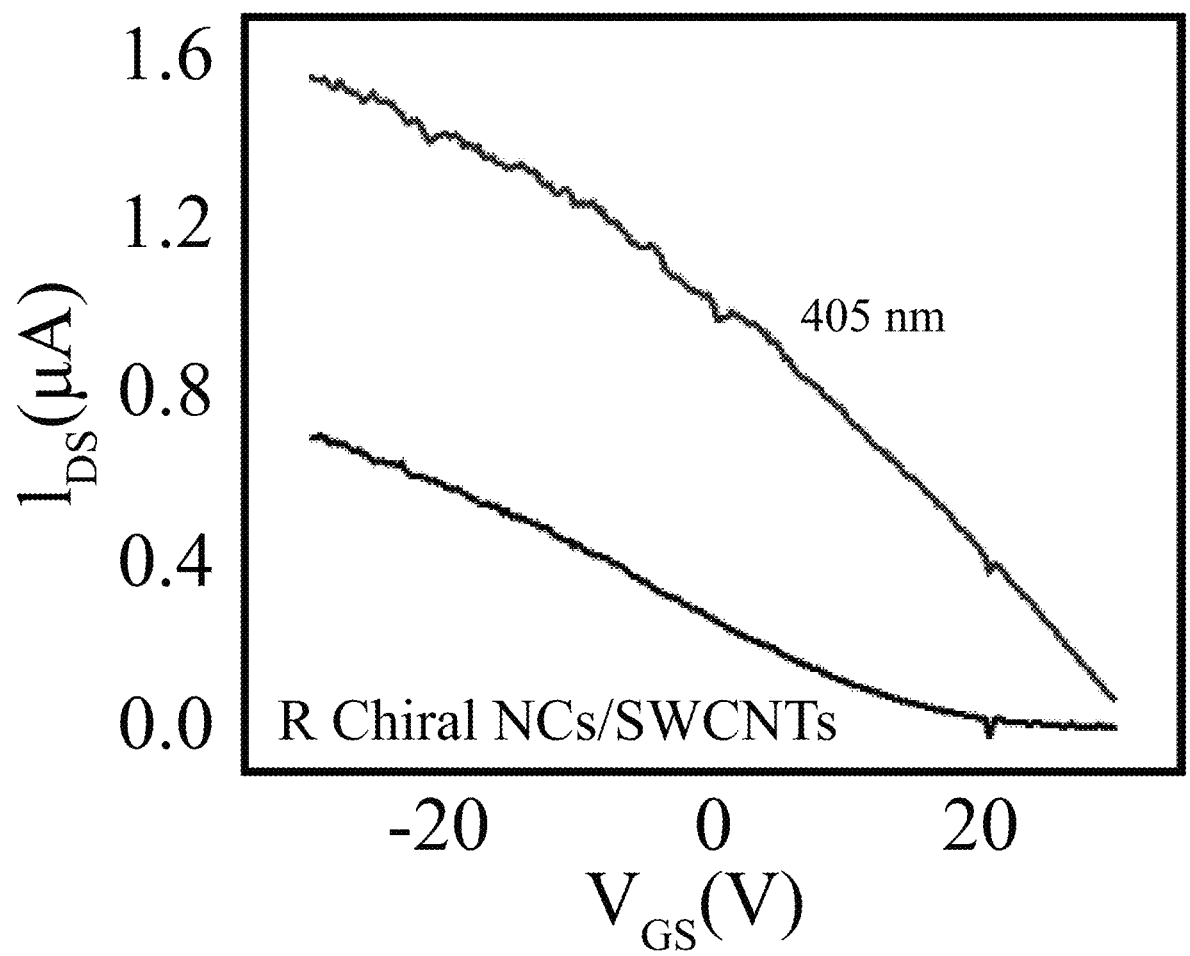
FIG. 17D illustrates FET transfer curves of R-MBA:Br treated CsPbBr$_3$/(6,5) SWCNTs heterojunction under 405 nm laser and in the dark under $V_{DS}$=1V, according to some embodiments of the present disclosure.

Both R-MBA:Br-treated and S-MBA:Br-treated CsPbBr$_3$ NCs demonstrated the apparent photocurrent response anisotropy under RCP and LCP illumination, respectively. I$_{ph}$ is the photocurrent change, which is defined as $$I_{ph}=I_{ph\_light}-I_{ph\_dark}$$

where I$_{ph\_light}$ is the source-drain current under light illumination and I$_{ph\_dark}$ is the dark current. There is no photocurrent response anisotropy under RCP and LCP light illumination separately in the Achiral (nonchiral, without chiral ligands) CsPbBr$_3$ NC due to its lack of chiroptical properties. To further evaluate the effectiveness for differentiating between different CPL, the anisotropy factor of the photocurrent (g$_{ph}$) may be calculated based on the equation:

$$g_{ph} = 2 \times \frac{I_{ph,R} - R_{ph,L}}{I_{Ph,R} + R_{ph,L}}$$

where I$_{ph, R}$ and I$_{ph, L}$ are the photocurrent responses under RCP and LCP light illumination, respectively. From this equation, the calculated g$_{ph}$ values of R-MBA:Br-treated and S-MBA:Br-treated CsPbBr$_3$ NCs are 0.06 and −0.053 separately under the same conductions shown in FIG. 17C.

To further improve the performance of the NC CPL detector, thin films of (6, 5) semiconducting single-walled carbon nanotubes (SWCNT) were, to serve as carrier transport layers, were combined with CsPbBr$_3$ NCs to form CsPbBr$_3$/SWCNTs heterojunction structures. For the resultant R-/S-MBA:Br-treated CsPbBr$_3$ NCs/SWCNT heterojunction structures, a 10 nm thick SWCNT thin film was initially spray-coated using ultrasound onto the pre-patterned device, and then a 30 nm thick layer of R-/S-MBA:Br-treated CsPbBr$_3$ NCs was spin-coated onto the SWCNT thin film to form the targeted heterojunction structures (see FIG. 17A). The carrier transfer between CsPbBr$_3$ NCs and SWCNTs layers was characterized using typical field-effect transistor (FET) measurements (V$_{DS}$=3 V, V$_{GS}$=−30~30 V). Because the SWCNT layer has a much higher electrical conductivity and hole carrier mobility than the NC layer, the source-drain current (I$_{DS}$) mainly flowed through the SWCNT layer. Compared to the threshold voltage of the FET transfer curve of the heterojunction device in the dark environment, the threshold voltage shifted to the positive gate voltage direction under continuous 405 nm laser illumination, which demonstrates that the photo-excited hole carriers generated from CsPbBr$_3$ NCs layer transferred to the SWCNT layer, resulting in a more P-type doped SWCNT layer.

Figure 17E:
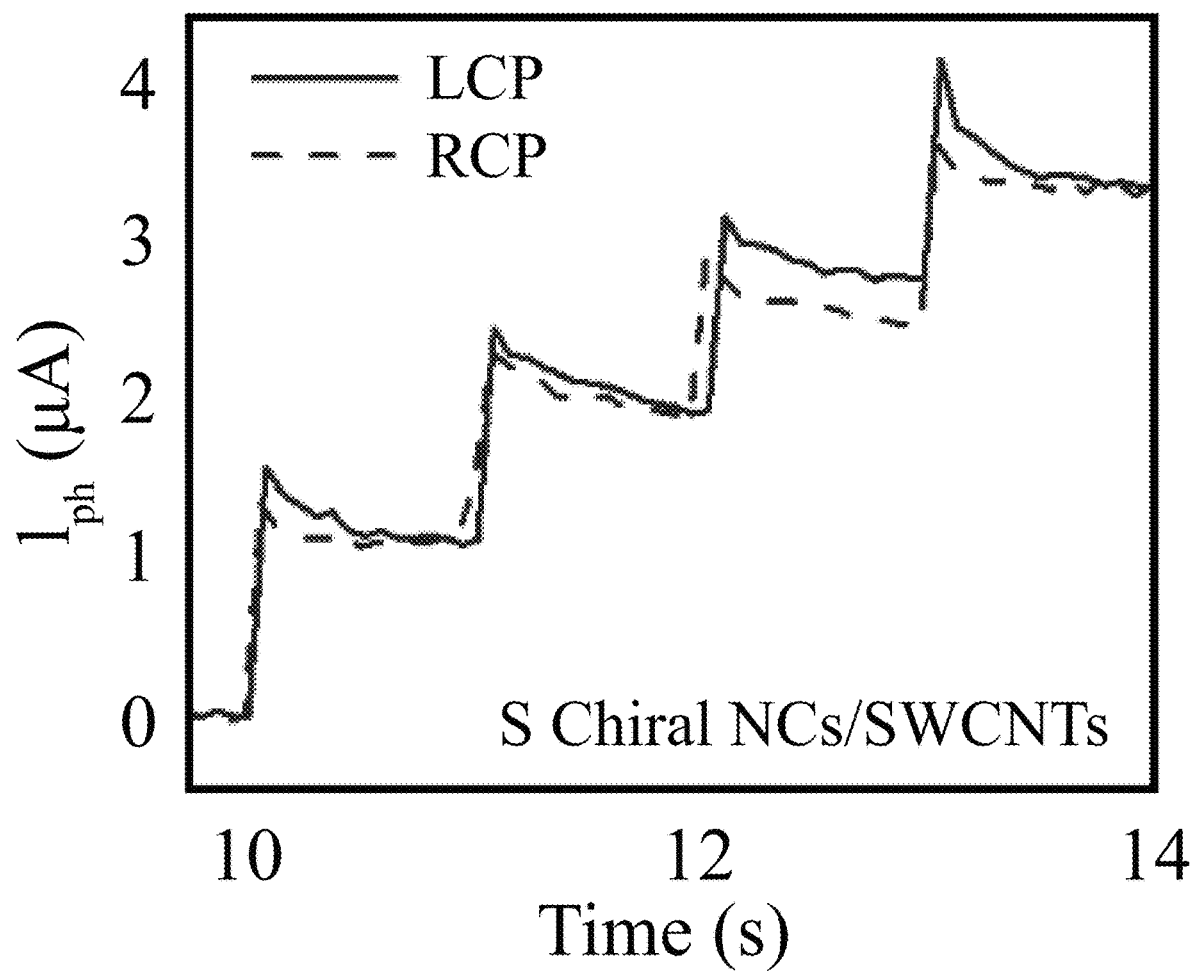
FIGS. 17E-17G illustrate time-dependent photocurrent change of R- and S- and Achiral CsPbBr$_3$/(6, 5) SWCNT heterojunctions under 405 nm RCP and LCP pulse laser illumination under $V_{DS}$=1V, respectively, according to some embodiments of the present disclosure.
Figure 17F:
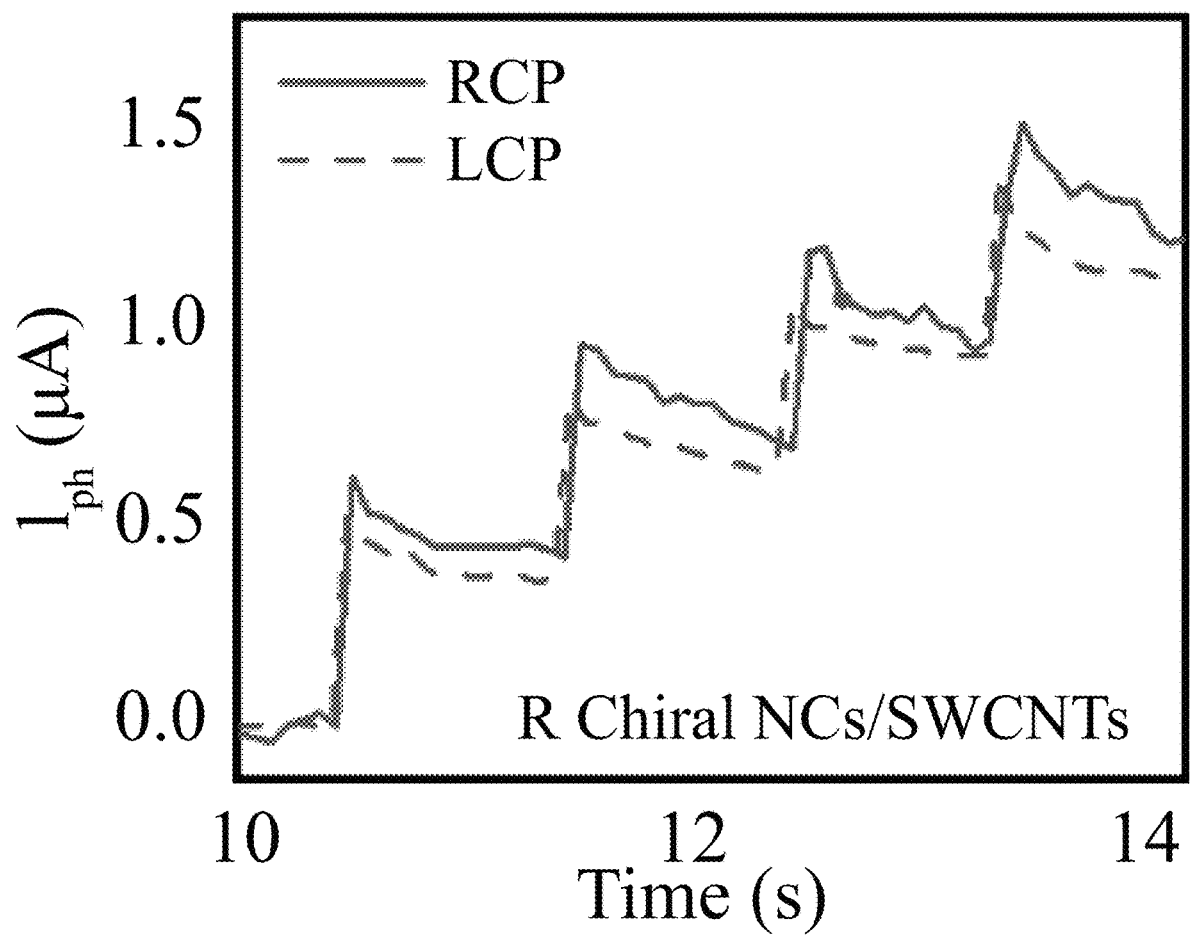
Figure 17G:
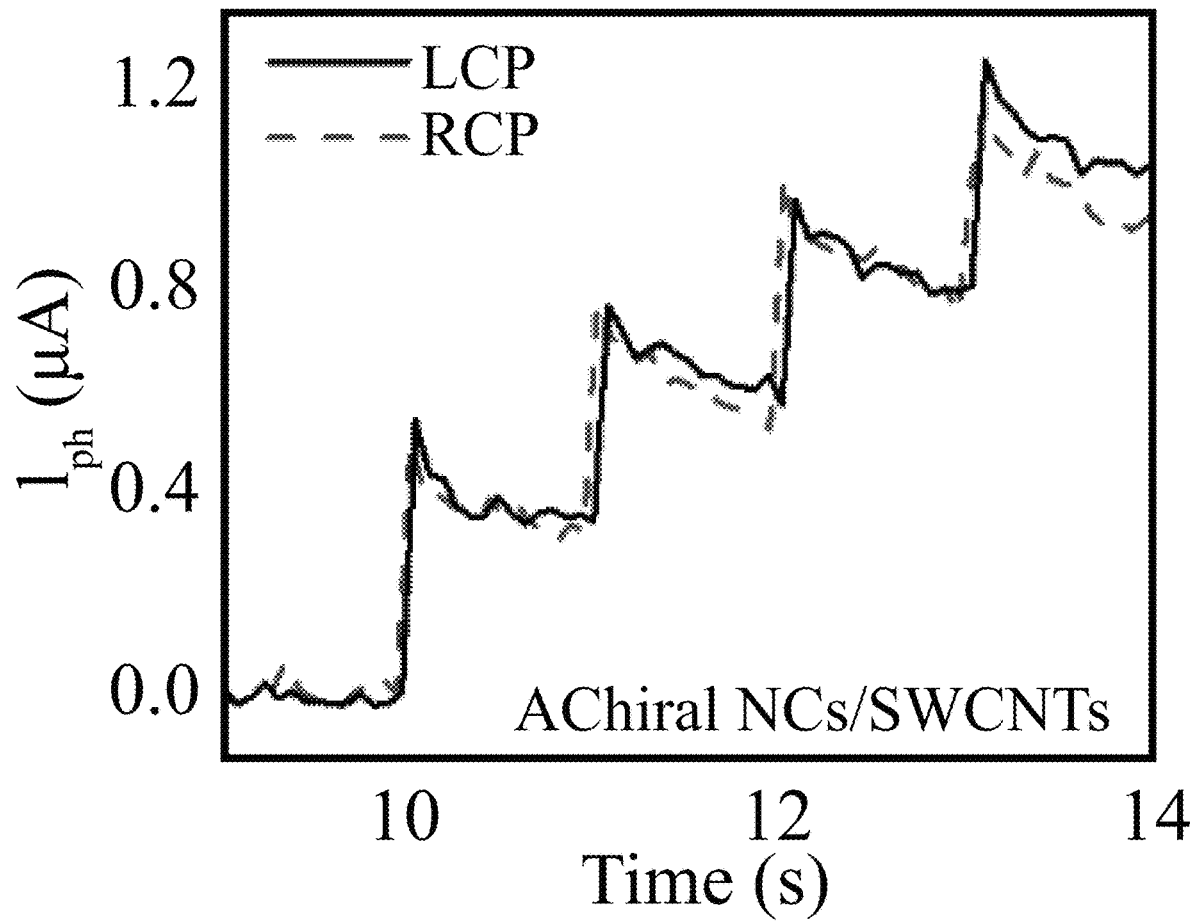
Figure 17H:
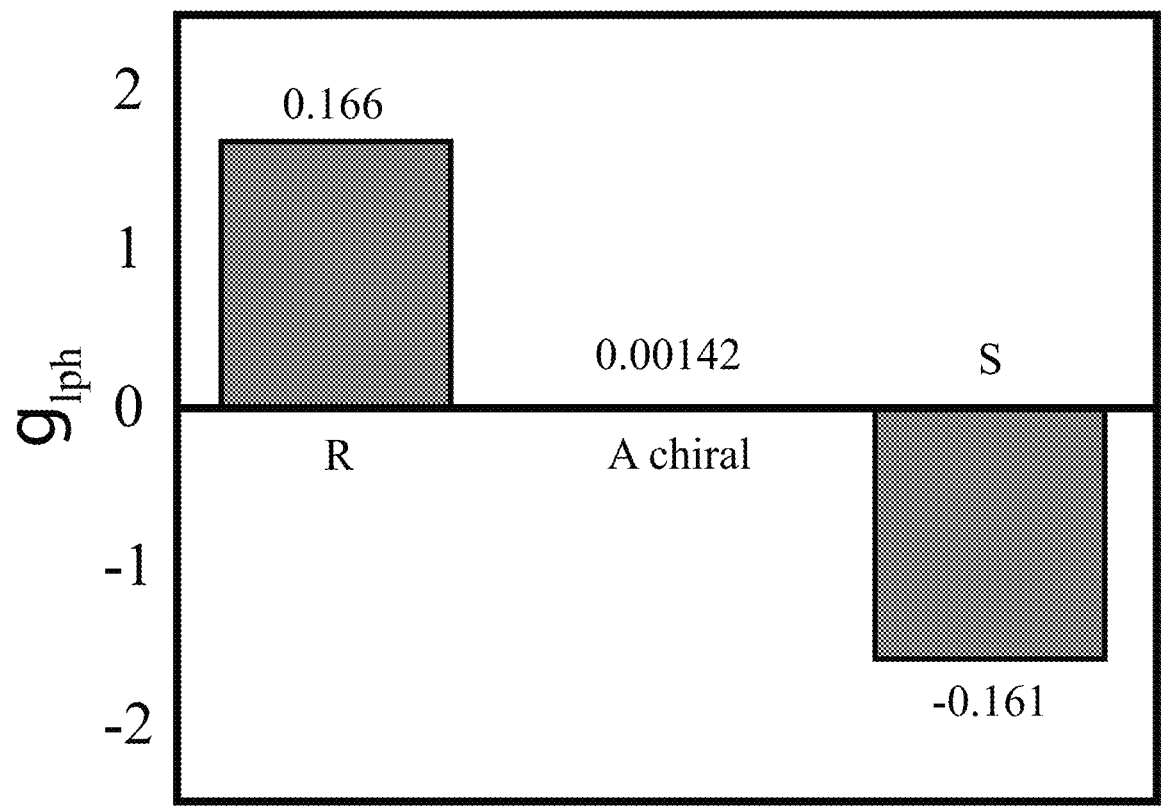
FIG. 17H illustrates percentage of $g_{ph}$ factor of R-, S- and Achiral CsPbBr$_3$/SWCNTs under 405 nm RCP and LCP illumination at $V_{DS}$=1V, according to some embodiments of the present disclosure.

The time-dependent photocurrent response results of R-MBA:Br-treated, S-MBA:Br-treated and Achiral (i.e., nonchiral, without chiral ligands) CsPbBr$_3$ NCs/SWCNT heterojunction structures are illustrated in FIGS. 17E-G under RCP and LCP light illumination, respectively. Similar to the R-MBA:Br-treated/S-MBA:Br-treated/Achiral CsPbBr$_3$ NCs devices described above (see FIGS. 17B and 17C), the R-MBA:Br-treated and S-MBA:Br-treated CsPbBr3 NCs/SWCNT heterojunction structures also showed a clear photocurrent response anisotropy under pulse-mode RCP and LCP light illumination (30 μs pulse width, 6.29 nJ pulse energy) separately, but the photocurrent change level of the heterojunction device demonstrates four orders of magnitude higher current level (~$10^6$ A) than that produced by the CsPbBr$_3$ NCs devices (without SWCNT) (~$10^{-10}$ A). Furthermore, the calculated g$_{ph}$ values for the R-MBA:Br-treated and S-MBA:Br-treated CsPbBr$_3$ NCs/SWCNT heterojunctions are 0.166 and −0.161 respectively, which are also 2.76 and 3 times higher than that of R-MBA:Br-treated and S-MBA:Br-treated CsPbBr$_3$ NCs devices (without SWCNT) (see FIG. 17H). These results verify the chiroptical and spintronic properties of R-MBA:Br-treated/S-MBA:Br-treated MBA:Br CsPbBr$_3$ NCs and R-MBA:Br-treated/S-MBA:Br-treated MBA:Br CsPbBr$_3$ NCs/SWCNTs heterojunction structures and pave the way for new chiral perovskite materials that are practical for optoelectronics having low fabrication complexity, low cost, and low power consumption.

Furthermore, chiral molecules can act as spin filters in which the spin orientation of electrons moving through the chiral molecules prefers to be aligned with a specific direction (either parallel or antiparallel to the electron conduction direction); this process is called chiral-induced spin selectivity (CISS).

Figure 18A:
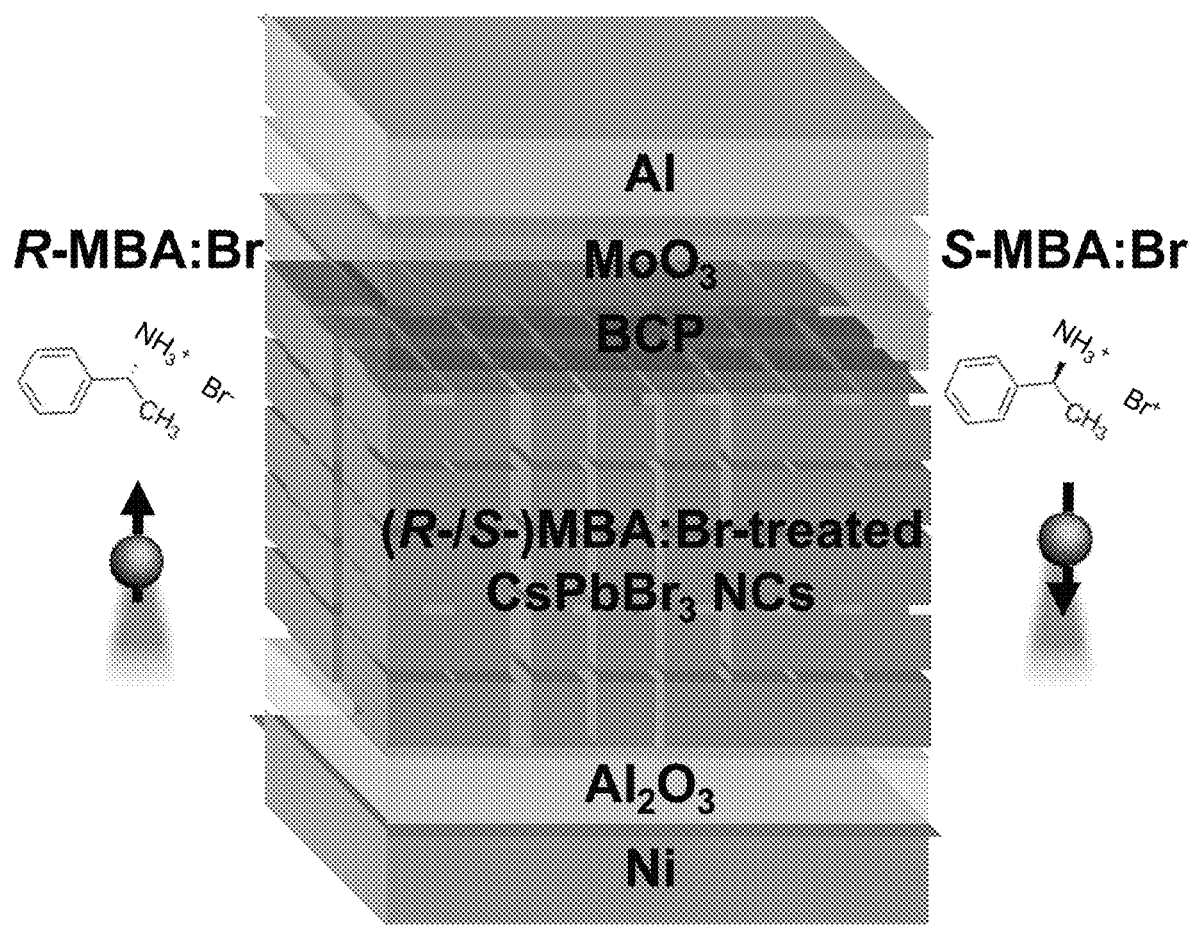
FIG. 18A illustrates a device structure of chiral-induced spin selectivity (CISS) devices and schematic illustration of spin-polarized charge injection through the R-/S-MBA:Br-treated CsPbBr$_3$ NC films in the devices, according to some embodiments of the present disclosure.
Figure 18B:
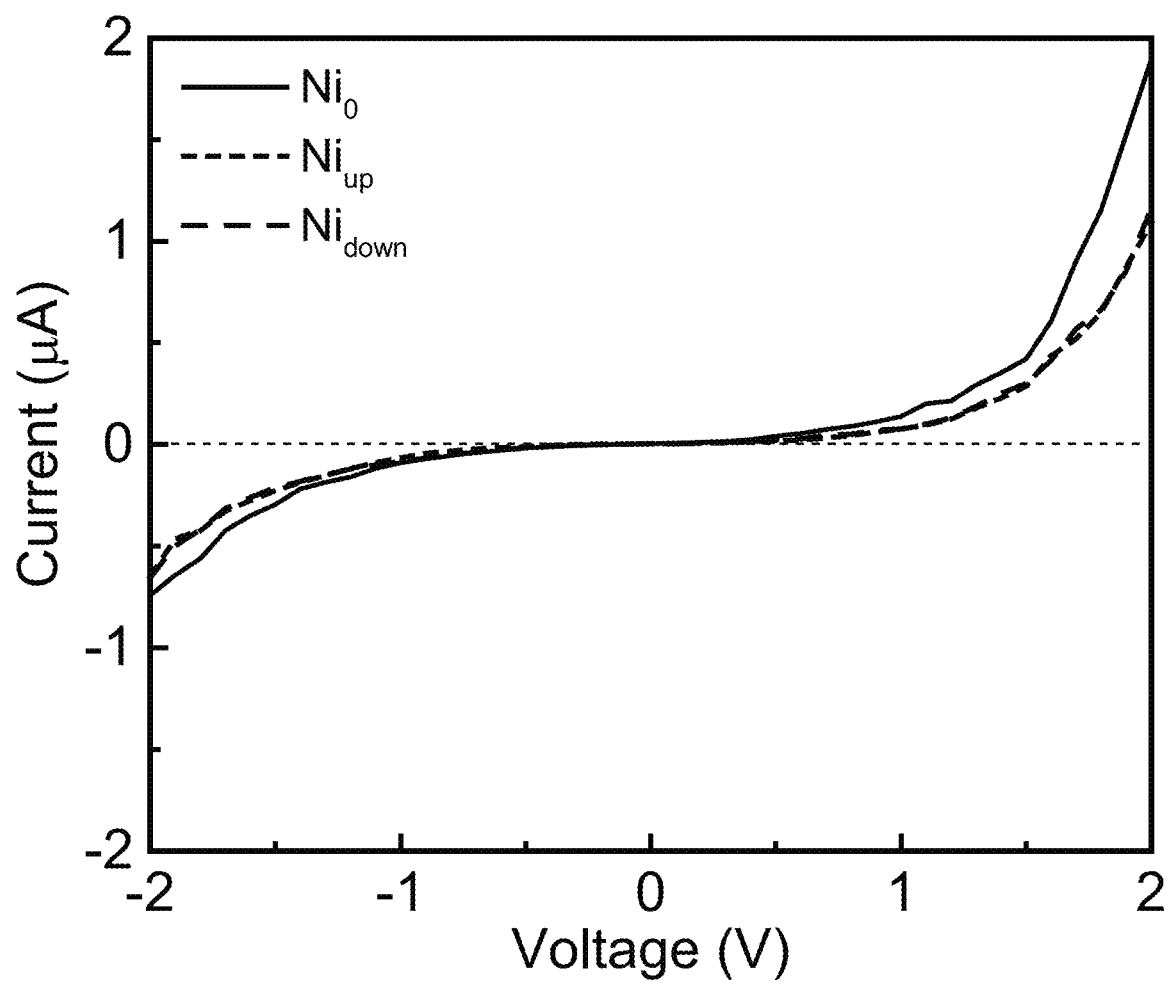
FIG. 18B illustrates average current-voltage curves measured in CISS devices based on control (nonchiral, without chiral ligands) CsPbBr$_3$ NC films, according to some embodiments of the present disclosure. The current-voltage curves were measured 10 times in a same pixel under different magnetized direction of Ni electrode.
Figure 18C:
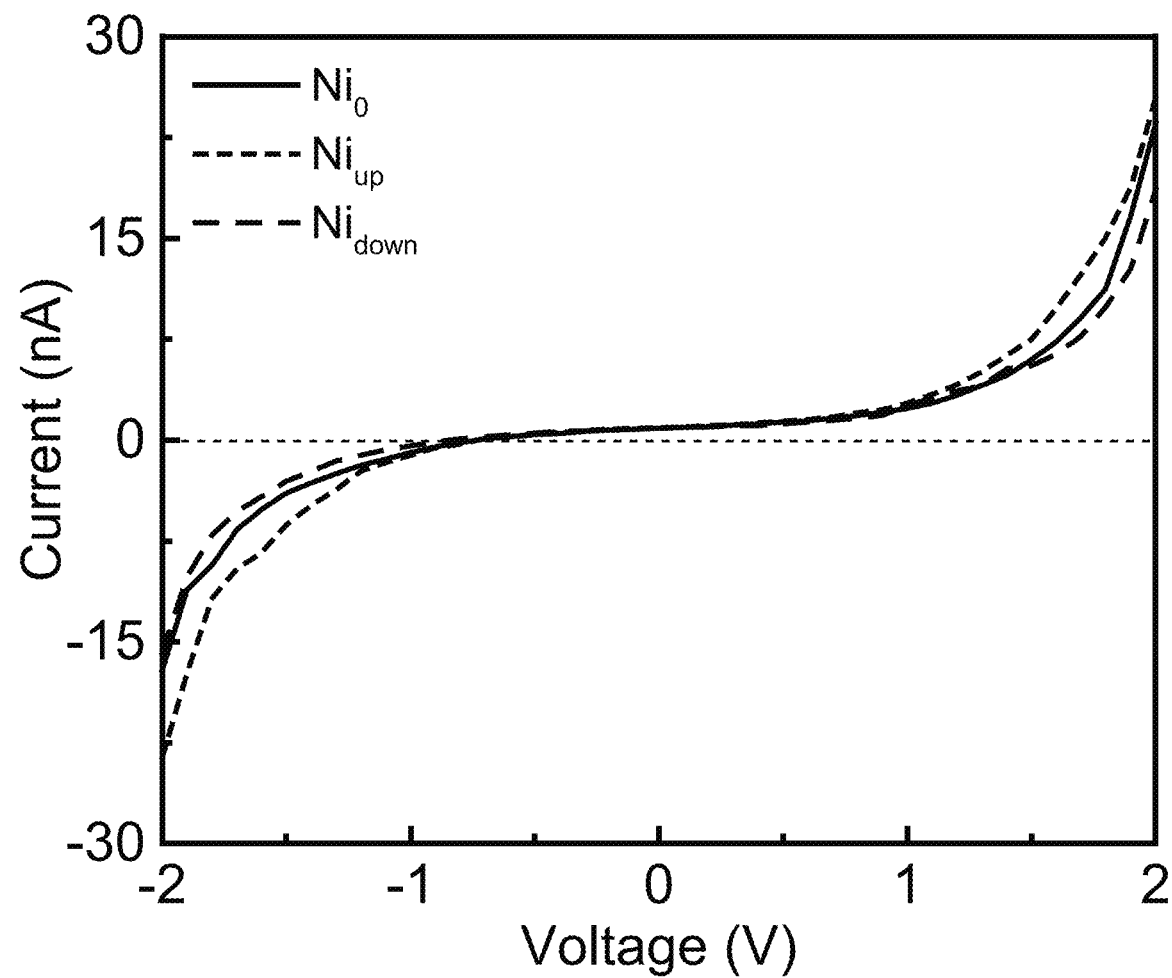
FIG. 18C illustrates average current-voltage curves measured in CISS devices based on R-MBA:Br-treated CsPbBr$_3$ NC films, according to some embodiments of the present disclosure. The current-voltage curves were measured 10 times in a same pixel under different magnetized direction of Ni electrode.
Figure 18D:
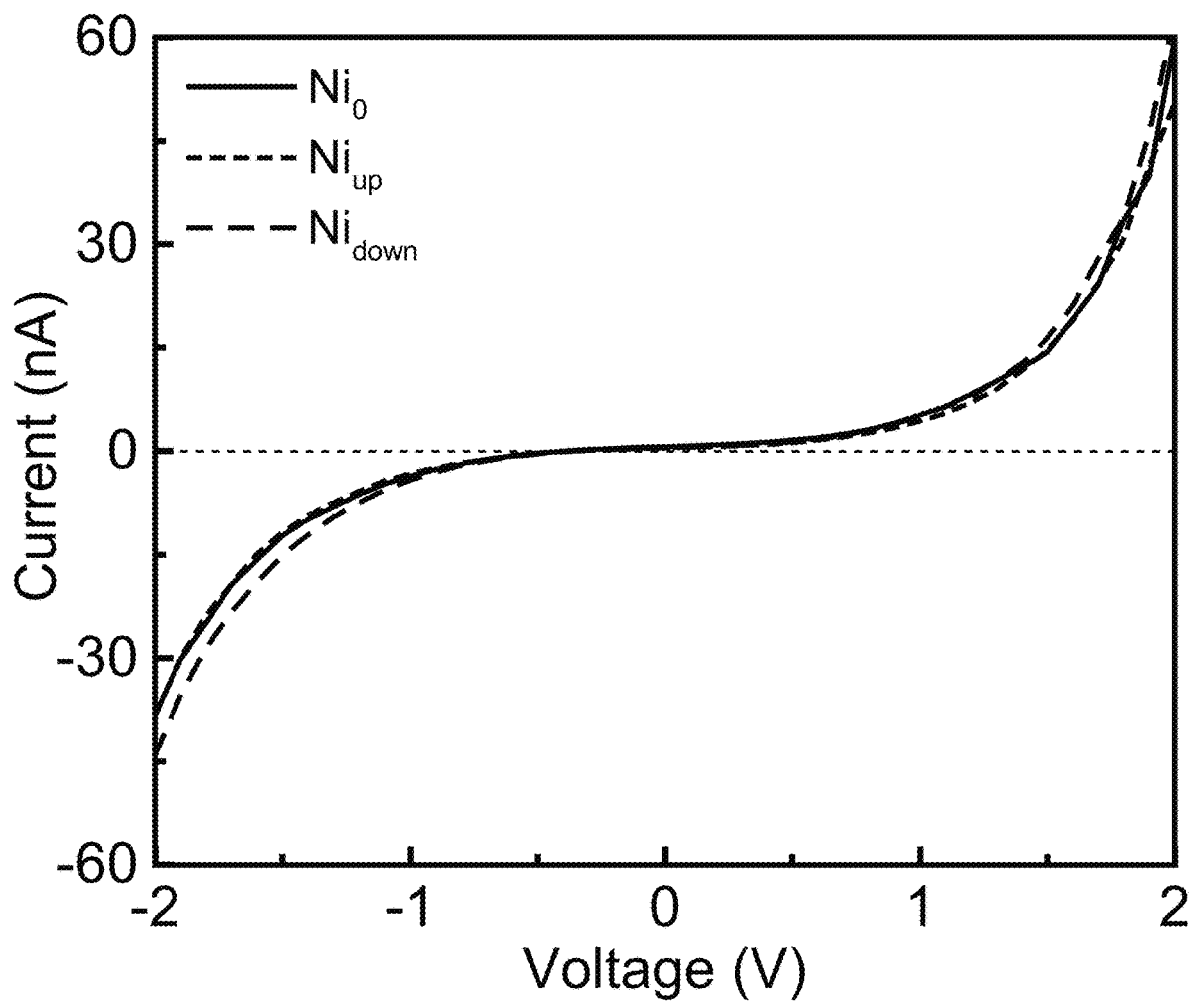
FIG. 18D illustrates average current-voltage curves measured in CISS devices based on S-MBA:Br-treated CsPbBr$_3$ NC films, according to some embodiments of the present disclosure. The current-voltage curves were measured 10 times in a same pixel under different magnetized direction of Ni electrode.

To investigate the spin filter effects in chiral colloidal CsPbBr$_3$ NC thin films, CISS devices were fabricated based on the following structure [nickel (Ni) (~50 nm)/aluminum oxide (Al$_2$O$_3$) (1.5 nm)/control or R-MBA:Br-treated/S-MBA:Br-treated CsPbBr$_3$ NC films (~50 nm)/bathocuproine (BCP) (~50 nm)/molybdenum trioxide (MoO$_3$) (~15 nm)/Al (100 nm)] (see FIG. 18A). The Ni layer was pre-magnetized by a permanent external magnet to inject charge carriers having only one spin-direction. The thin Al$_2$O$_3$ layer acts as a spin tunneling buffer layer to overcome the spin injection obstacle (i.e., conductivity mismatch) between ferromagnets and the NC semiconductor. The BCP and MoO$_3$ layers prevent the possible short-circuiting in the devices and block the injection of holes and electrons from the top Al electrode, respectively, so that pure spin-polarized current injected from pre-magnetized Ni electrode is measured. CISS devices based on control CsPbBr$_3$ NC films showed similar currents when the Ni electrode was magnetized up (1.08 µA at 2V) versus when the Ni electrode was magnetized down (1.06 µA at 2V) (see FIG. 18B). CISS devices based on R-MBA:Br-treated CsPbBr$_3$ NC films demonstrated a higher average current when the Ni electrode was magnetized up (25.5 nA at 2 V) versus when the Ni electrode was magnetized down (18.6 nA at 2V) (see FIG. 18C). On the contrary, CISS devices based on S-MBA:Br-treated CsPbBr$_3$ NC films demonstrated a lower current when the Ni electrode was magnetized up (50.4 nA at 2V) versus when the Ni electrode was magnetized down (63.3 nA at 2V) (see FIG. 18D). The degree of spin-polarized current, P$_{spin}$, was then calculated based on these currents, from $$P_{spin} = \frac{I_{up} - I_{down}}{I_{up} + I_{down}} \times 100\%$$

where I$_{up}$ and I$_{down}$ are the measured currents at 2V when the Ni electrode was pre-magnetized in the up- or down-direction, respectively. P$_{spin}$ was calculated to be 15.6% and −11.3% at 2 V for CISS devices based on R-MBA:Br-treated and S-MBA:Br-treated CsPbBr$_3$ NC films, respectively.

Figure 19A:
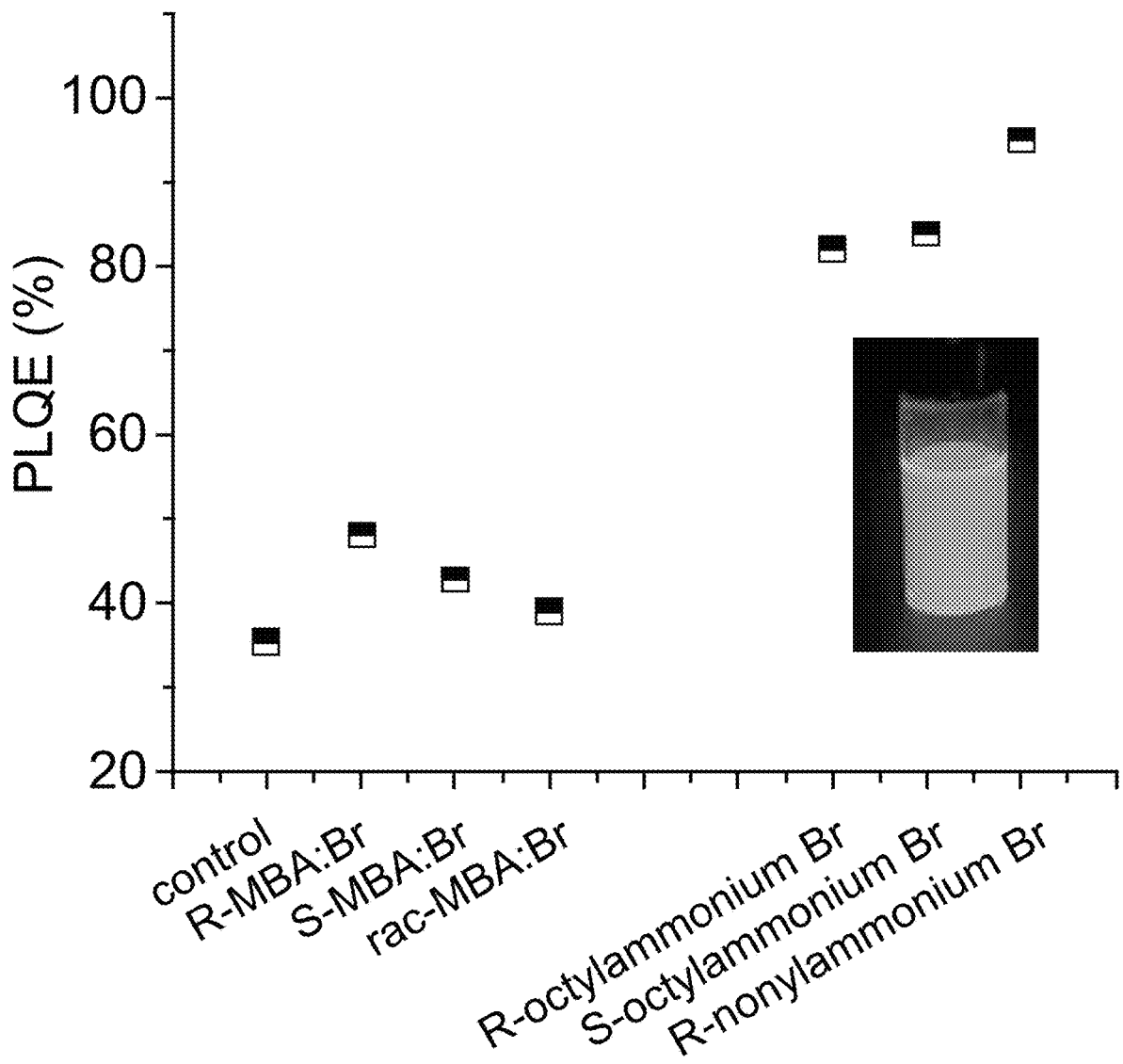
FIG. 19A illustrates PLQE of CsPbBr$_3$ NCs with different chiral ligands (R-/S-MBA:Br, R-/S-octylammonium bromide, R-nonylammonium bromide), according to some embodiments of the present disclosure.
Figure 19B:
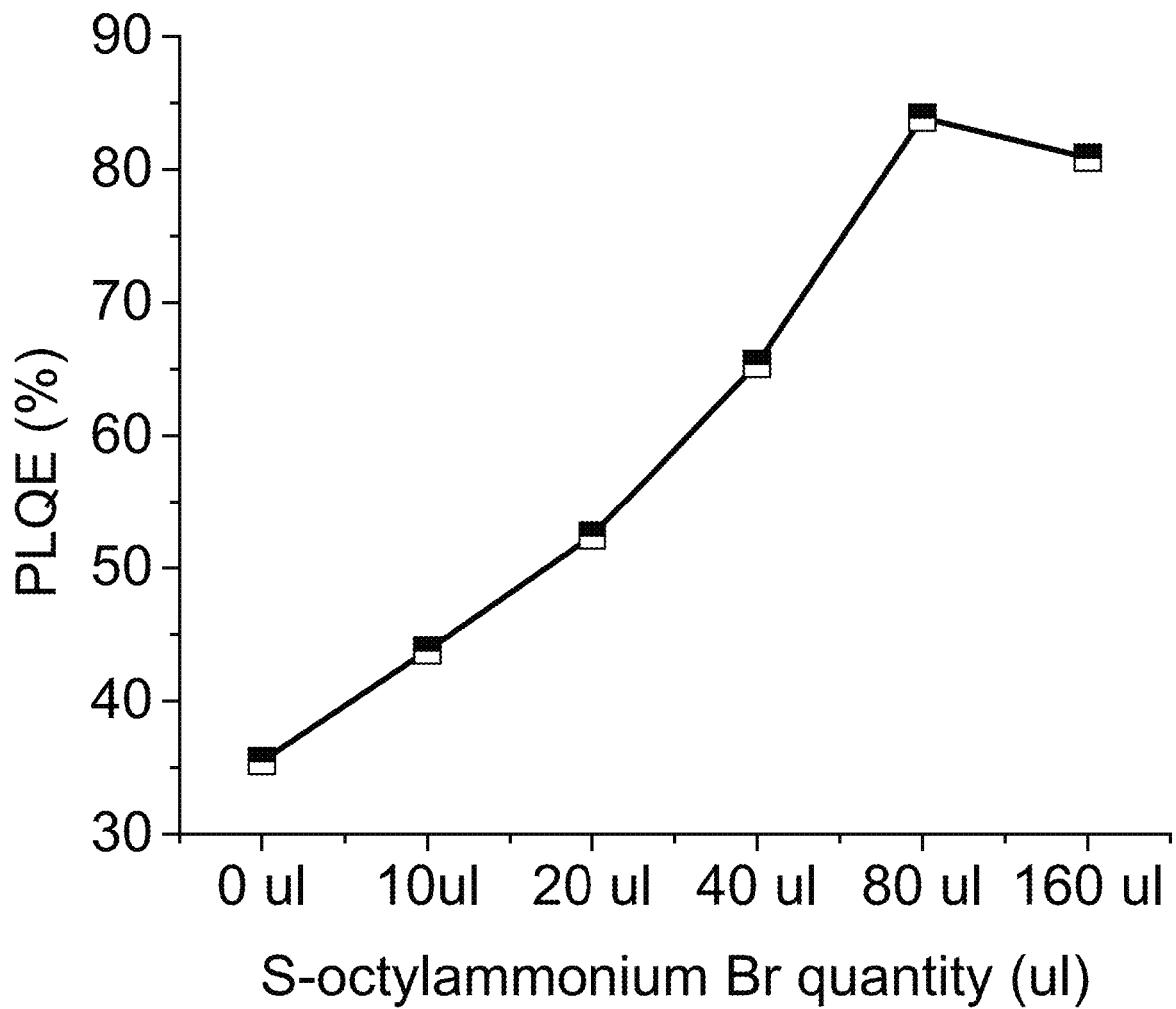
FIG. 19B illustrates PLQE of CsPbBr$_3$ NCs with different S-octylammonium bromide ligand concentrations, according to some embodiments of the present disclosure.
Figure 19C:
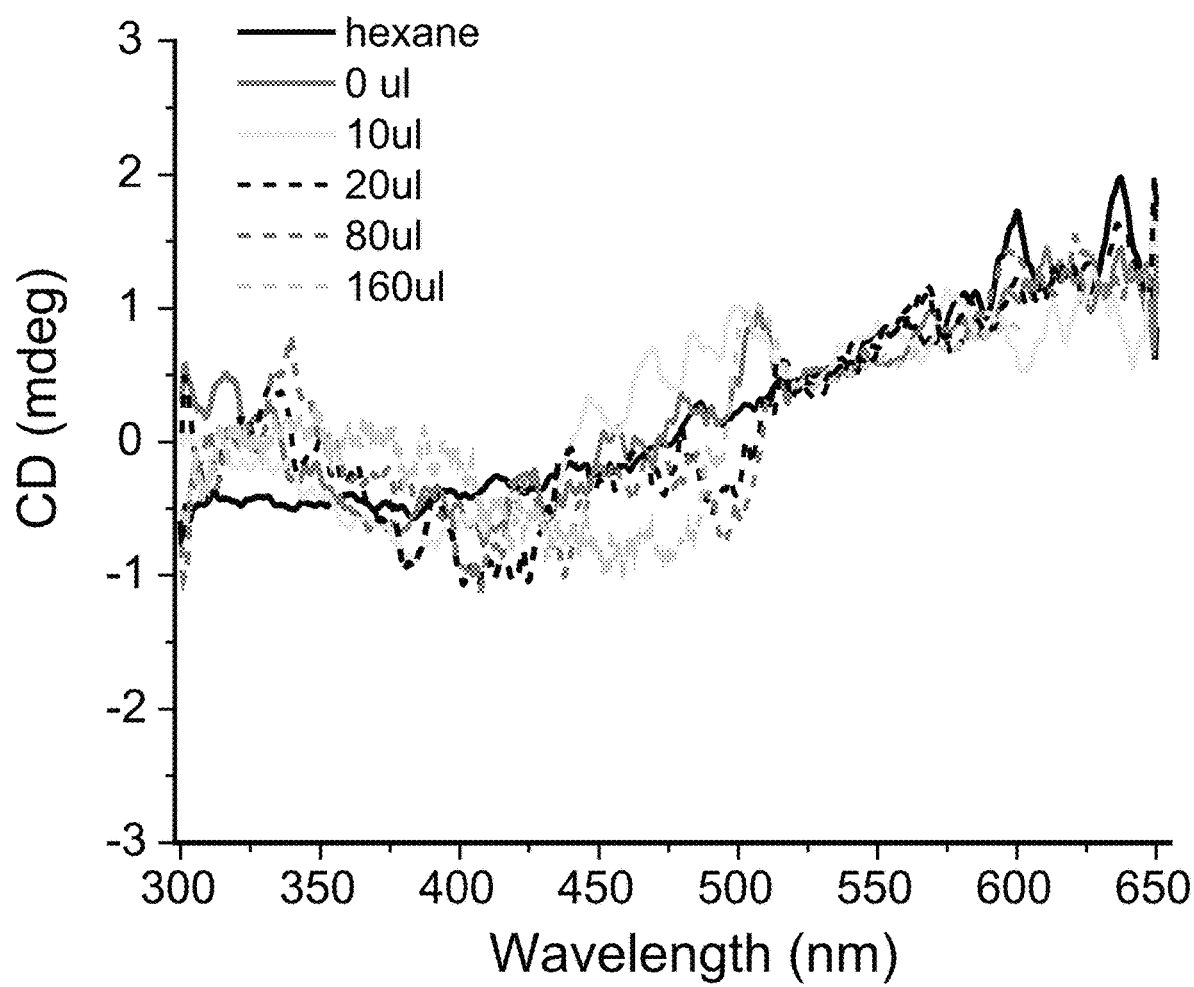
FIG. 19C illustrates CD of CsPbBr$_3$ NCs with different S-octylammonium bromide ligand concentrations, according to some embodiments of the present disclosure.
Figure 19D:
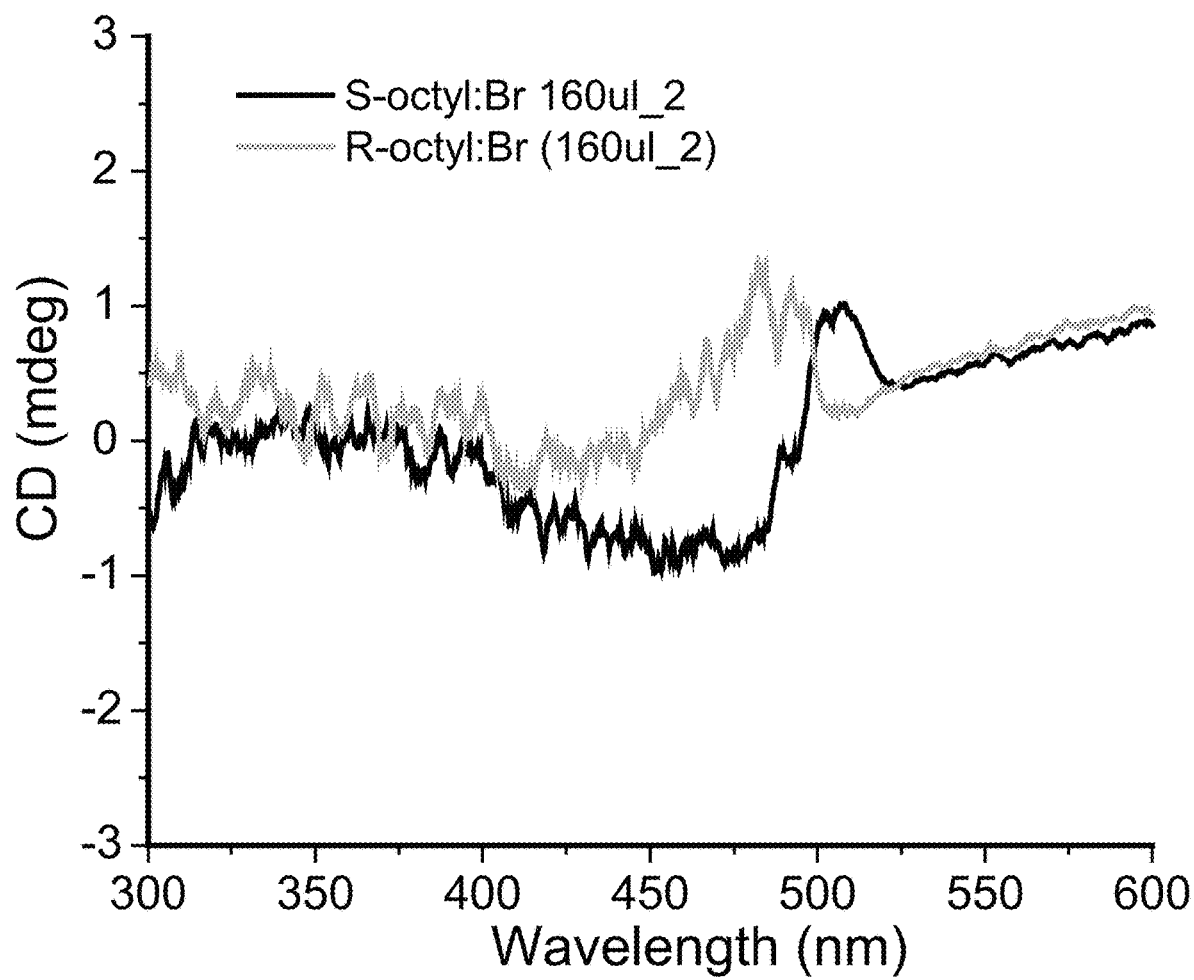
FIG. 19D illustrates CD of CsPbBr$_3$ NCs with R-/S-octylammonium bromide ligands, according to some embodiments of the present disclosure.

Chiral ligands with linear alkyl group structure such as R-octylammonium bromide, S-octylammonium bromide and R-nonylammonium bromide ligands achieved higher PLQE in CsPbBr$_3$ NCs than do R-MBA:Br and S-MBA:Br ligands because linear ligands (R-octylammonium bromide, S-octylammonium bromide, R-nonylammonium bromide) are smaller and can better attach to the NC surfaces than bulky R-MBA:Br and S-MBA:Br ligands (see FIG. 19A). With the increasing amount of S-octylammonium bromide ligands, CsPbBr$_3$ NCs showed increasing PLQE and CD spectrum peak intensity (in a minus direction) because of higher ligand concentration on the NC surfaces (see FIGS. 19B and 19C). CsPbBr$_3$ NCs with R-octylammonium bromide and S-octylammonium bromide showed opposite signals of CD spectrum (see FIG. 19D).

Methods:

Chemicals. Formamidinium acetate (FA-acetate, 99%), oleic acid (OA, technical grade 90%), oleylamine (OAm, technical grade 70%), 1-octadecene (ODE, technical grade 90%), hexane (reagent grade ≥95%), octane (anhydrous, ≥99%), methyl acetate (MeOAc, anhydrous 99.5%), ethyl acetate (EtOAc, anhydrous 99.5%), R-methylbenzylamine (98% purity), S-methybenzylamine (98% purity), hydrobromic acid (ACS reagent, 48%) and ethyl acetate (EtOAc, anhydrous, 99.8%) were purchased from Sigma Aldrich. (R)-2-octylamine (98% purity) was purchased from Alfa Aesar.

Synthesis of FA-Oleate Precursor. In a three-necked round-bottom flask, 15 mmol (1.563 g) of FA-acetate, 15 ml OA and 15 ml ODE were degassed under a vacuum at room temperature and 50° C. for 30 min, respectively. The temperature was then increased to 120° C. under N$_2$ and kept at this temperature.

Synthesis of FAPbBr$_3$ NCs. In a three-necked round-bottom flask, 0.74 mmol (0.272 g) PbBr$_2$ and 25 ml 1-ODE were degassed under vacuum at room temperature and 120° C. for 30 min, respectively. Mixtures of 12.1 mmol (4 mL) of OA and 6.05 mmol of amine ligands with different ratios of (R)-2-octylamine to OAm (1:0, 0.5:0.5, 0.25:0.75, 0:1) were preheated to 120° C., then injected into the PbBr$_2$ mixture under vacuum. After PbBr$_2$ was fully dissolved, the solution became clear. Then the temperature of the solution was reduced to 80° C. to prevent rapid growth of FAPbBr$_3$ crystals. Under N$_2$ flow, 5 mL of the FA-oleate stock solution was swiftly injected into the PbBr$_2$ mixture, which was then quenched by immersing the flask in an ice bath. After cooling to room temperature, the solution was centrifuged at 7500 rpm for 5 min to remove unreacted ligands and 1-ODE. The precipitate was dispersed in 5 mL of hexane, then centrifuged at 7500 rpm for 5 min to remove the precipitated large particles. The supernatant NC solution was stored in the refrigerator.

Synthesis of R-/S-MBA:Br. In a one-necked round-bottom flask in an ice bath, 78 mmol (10 mL) R-/S-MBA and 30 mL of ethanol were added, then 116 mmol (13.2 mL) HBr aqueous solution was added dropwise into the flask under vigorous stirring. The solution was kept stirred in an ice bath overnight. The yellowish precipitate was collected by evaporation of solvents at 70° C. for 30 min, then washed thoroughly by repeating re-dissolution in ethanol and recrystallization in diethyl ether until colorless. The white precipitate was dissolved in a small amount hot ethanol to make saturated solution, then recrystallized in a freezer; temperature drop reduced the saturation concentration of R-/S-MBA:Br in ethanol and induced recrystallization. The recrystallized precipitate was dried under vacuum overnight.

Purification and Ligand-Treatment of FAPbBr$_3$ NCs. To purify the FAPbBr$_3$ NCs, 10 mL of MeOAc was added to 5 mL of stock solution, then it was centrifuged at 7500 rpm for 5 min. The resulting precipitate was re-dispersed in 5 mL of hexane and centrifuged again at 7500 rpm for 5 min to discard the aggregated particles. To conduct the ligand-treatment of FAPbBr$_3$ NCs, saturated solution of R-/S-MBA:Br in EtOAc was prepared by sonicating 200 mg R-/S-MBA:Br in 20 mL of EtOAc, then centrifuging at 3500 rpm for 5 min. The 1 mL of saturated R-/S-MBA:Br solution was mixed with 5 mL of purified FAPbBr$_3$ NCs; the mixture was stirred mildly for 5 min at room temperature and then centrifuged at 7500 rpm for 5 min to precipitate the aggregated particles; the supernatant was collected.

Transmission Electron Microscopy Measurement. FAPbBr$_3$ NC solutions were dropped on the carbon-coated copper mesh grids (CF200-Cu, Electron Microscopy Sciences). The transmission electron microscopy experiment was performed using a JEOL-JEM 2100F operating at an acceleration voltage of 200 kV.

$^1$H NMR Spectroscopy. NMR were taken on a Bruker 400 Avance III NMR using a standard proton pulse (zg), 64 scans, 4.0 s collection times, and a 25.0 s delay between scans at 25° C.

Time-resolved photoluminescence. The samples were excited at 450 nm at a low fluence ($<<10^{15}$ s$^{-1}$) using a supercontinuum fiber laser (NKT Photonics, Super K) operating at 5 MHz as the excitation source. The emission was collected with a Hamamatsu C10910-04 streak camera.

Photoluminescence Quantum Efficiency. PLQEs of FAPbBr$_3$ NC solutions were measured using a 100-mm integrating sphere (Labsphere) integrated with the spectrometer (SpectraPro® HRS 500, Princeton Instruments). FAPbBr$_3$ NC solutions were excited using a 450-nm Xe-lamp.

Figure 16:
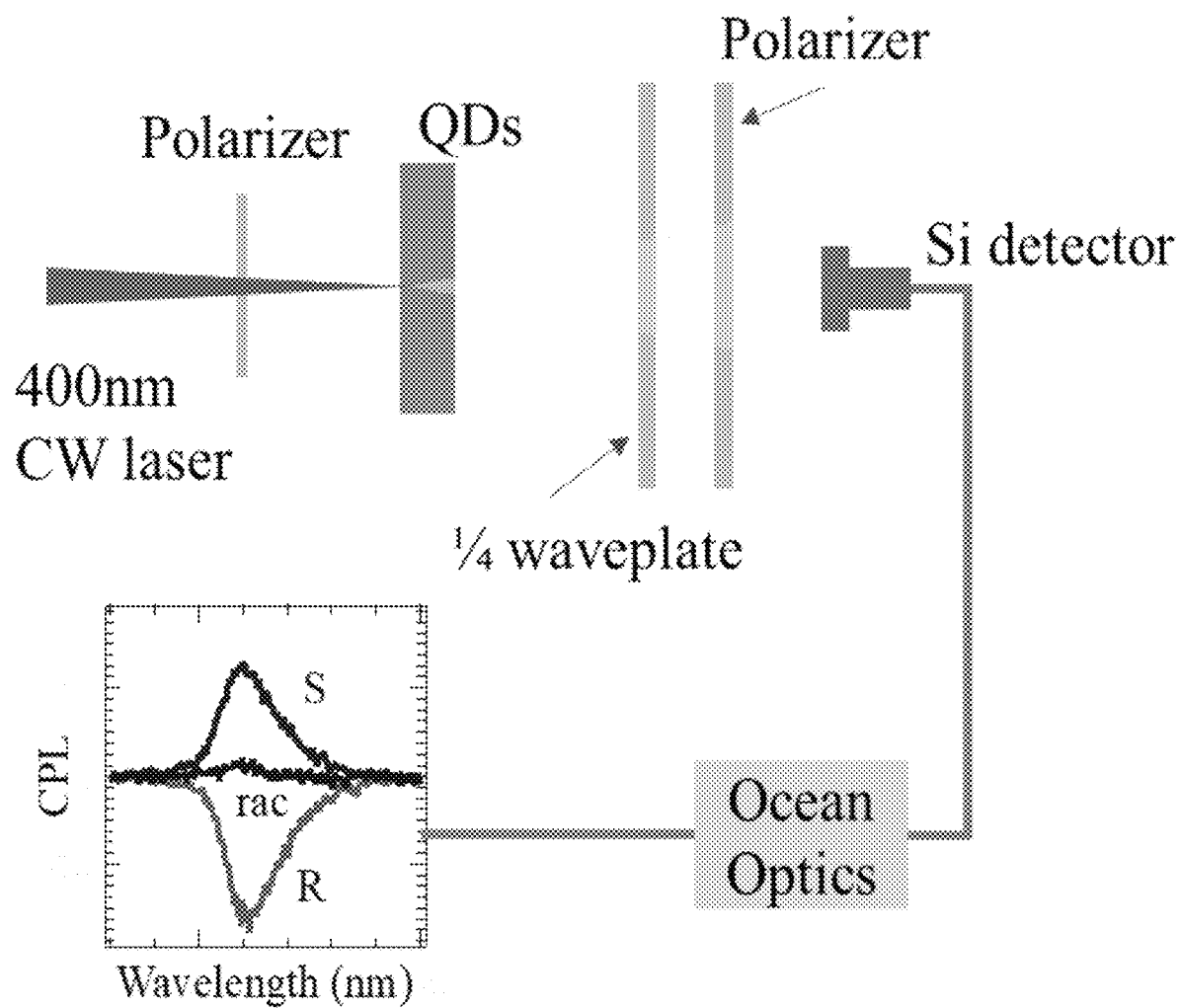
FIG. 16 illustrates a schematic of a CPL measurement system, according to some embodiments of the present disclosure.

Circularly Polarized Luminescence (CPL). FAPbBr$_3$ NCs were excited by a linearly-polarized laser at 405 nm (see FIG. 16). The PL emission was separated into $\sigma^+$ and $\sigma^-$ by rotating a broadband quarter-wave plate (400-800 nm, Thorlabs) followed by a linear polarizer. The polarized emission was collected in free space and measured using a spectrometer (MAYA 2000pro, OceanOptics). The experimental apparatus was calibrated with a depolarized light source, from which we obtained a systematic error <0.2% in measuring the circular light polarization.

Transient Absorption (TA). The transient reflection measurement is based on the Ti:sapphire laser amplifier (Continuum Integra, 800 nm, pulse duration ~100 fs, ~3 mJ/pulse and 1 kHz repetition rate) and the pump-probe transient reflection spectrometer (Helios, Ultrafast System). The fundamental laser pulse is generated by a Ti:sapphire amplifier and then split into two parts by a beam splitter. One beam is sent to an optical parametric amplifier to generate the pump pulse with tunable wavelength, and its intensity is attenuated by two neutral density filter wheels. The other part of the fundamental pulse is focused into a sapphire crystal to generate a white-light continuum (450-800 nm) that is used as the probe. The probe pulses are delayed in time with respect to the pump pulses using a motorized translation stage mounted with a retroreflecting mirror. The pump and probe are spatially overlapped on the surface of the sample. Both the pump and probe beam incident the sample normally. The size of the focused spot at the sample position for the probe and pump beams is around 200 µm and 600 µm, respectively.

Fourier-Transform Infrared (FTIR) Spectroscopy. FTIR measurements were done in an Ar glovebox on a Bruker Alpha FTIR spectrometer using a diffuse reflectance infrared Fourier transform spectrometer (DRIFTS) attachment with a resolution of 4 cm$^{-1}$. Background measurements were taken on blank substrates and subsequent sample measurements were taken as an average of 24 scans. Spectra were baseline-corrected using the concave rubber-band correction method. Background measurements were taken on air and subsequent sample measurements were taken as an average of 24 scans.

Circular Dichroism (CD) Spectroscopy. CD measurements were carried out using a Jasco J-715 spectropolarimeter with the samples suspended as a film on a 0.5 mm quartz plate placed in the beam path or as a liquid suspension in a 1 mm path length quartz cuvette. The spectra obtained were single scans. The CD spectra of different constructs was monitored from 300-650 nm.

EXAMPLES

Example 1. A composition comprising: a nanocrystalline core comprising a perovskite having an outer surface; and a chiral molecule comprising a functional group, wherein: the functional group is bonded to a first portion of the outer surface, and the composition is capable of circularly polarized luminescence (CPL).

Example 2. The composition of Example 1, wherein the composition is capable of absorbing circularly-polarized light.

Example 3. The composition of either Example 1 or Example 2, wherein the perovskite comprises at least one of a zero-dimensional perovskite, a two-dimensional perovskite, or a three-dimensional perovskite.

Example 4. The composition of any one of Examples 1-3, wherein: the perovskite comprises at least one of ABX$_3$, AB$_2$X$_5$, A$_2$BX$_4$, A$_3$BX$_5$, A$_3$BX$_6$, A$_3$B$_2$X$_9$, A$_3$B$_2$X$_5$, or A$_{n-1}$B$_n$X$_{3n+1}$, A comprises a first cation, B comprises a second cation, X comprises an anion, and 1≤n≤6.

Example 5. The composition of any one of Examples 1-4, wherein the first cation comprises at least one of formamidinium (FA), methylammonium (MA), cesium, dimethylammonium, or phenylethylammonium.

Example 6. The composition of any one of Examples 1-5, wherein the first cation comprises at least one of an organic ammonium (CH$_3$NH$_3$, C$_x$H$_{2x+1}$NH$_3$, RNH$_3$, CF$_3$NH$_3$, C$_x$F$_{2x+1}$NH$_3$), an organic amidinium, or an alkali metal, R is an alkyl group, and x is an integer equal to or greater than 1.

Example 7. The composition of any one of Examples 1-6, wherein: the organic ammonium comprises at least one of CH$_3$NH$_3$, C$_x$H$_{2x+1}$NH$_3$, RNH$_3$, CF$_3$NH$_3$, C$_x$F$_{2x+1}$NH$_3$, and x is an integer equal to or greater than 1.

Example 8. The composition of any one of Examples 1-7, wherein: the organic amidinium comprises at least one of CH(NH$_2$)$_2$, (C$_x$H$_{2x+1}$)C(NH$_2$)$_2$, R(NH$_2$)$_2$, CF(NH$_2$)$_2$, or (C$_x$F$_{2x+1}$)C(NH$_2$)$_2$, and x is an integer equal to or greater than 1.

Example 9. The composition of any one of Examples 1-8, wherein the alkali metal comprises at least one of Na, K, Rb, Cs, or Fr.

Example 10. The composition of any one of Examples 1-9, wherein the second cation comprises at least one of a transition metal, a post-transition metal, an alkali metal, or a lanthanide.

Example 11. The composition of any one of Examples 1-10, wherein the second cation comprises at least one of tin, lead, bismuth, manganese, cadmium, scandium, yttrium, europium, gallium, indium, antimony, polonium, or germanium.

Example 12. The composition of any one of Examples 1-11, wherein the anion comprises a first halide.

Example 13. The composition of any one of Examples 1-12, wherein: the perovskite comprises at least one of FAPb(X$_y$X'$_z$X"$_{1-y-z}$)$_3$, CsPb(X$_y$X'$_z$X"$_{1-y-z}$)$_3$, MAPb(X$_y$X'$_z$X"$_{1-y-z}$)$_3$, or Cs$_{1-u-v}$MA$_u$FA$_v$Pb(X$_y$X'$_z$X"$_{1-y-z}$)$_3$, wherein: X comprises at least one of iodide, bromide, or chloride, X' comprises at least one of iodide, bromide, or chloride and is different than X, X" comprises at least one of iodide, bromide, or chloride and is different than X and X', $0 \leq z \leq 1$, $0 \leq y \leq 1$, $0 \leq u \leq 1$, and $0 \leq v \leq 1$.

Example 14. A composition comprising: a nanocrystalline core comprising a perovskite having an outer surface; and a chiral molecule comprising a functional group and a second group, wherein: the perovskite comprises at least one of FAPb(X$_y$X'$_z$X"$_{1-y-z}$)$_3$, CsPb(X$_y$X'$_z$X"$_{1-y-z}$)$_3$, MAPb(X$_y$X'$_z$X"$_{1-y-z}$)$_3$, or Cs$_{1-u-v}$MA$_u$FA$_v$Pb(X$_y$X'$_z$X"$_{1-y-z}$)$_3$, X at least one of comprises iodide, bromide, or chloride, X' at least one of comprises iodide, bromide, or chloride and is different than X, X" at least one of comprises iodide, bromide, or chloride and is different than X and X', $0 \leq z \leq 1$, $0 \leq y \leq 1$, $0 \leq u \leq 1$, $0 \leq v \leq 1$, the functional group comprises at least one of an amine group, and ammonium group, a sulfate group, a phosphate group, a carboxylate group, an alkyl halide, a sulfuric acid group, a phosphoric acid group, or a carboxylic acid group, the second group comprises a hydrocarbon having between 3 and 30 carbon atoms, the functional group is bonded to a first portion of the outer surface, and the composition is capable of circularly polarized luminescence (CPL).

Example 15. The composition of Example 14, wherein the nanocrystalline core has a characteristic length between about 1 nm and about 1000 nm.

Example 16. The composition either Example 14 or Example 15, where the characteristic length is between about 1 nm and about 100 nm.

Example 17. The composition of any one of Examples 14-16, where the characteristic length is between about 1 nm and about 50 nm.

Example 18. The composition of any one of Examples 14-17, wherein the CPL has an average luminescence dissymmetry g-factor between about 1.0 and about 0.0001 in a wavelength range between about 400 nm and about 1000 nm.

Example 19. The composition of any one of Examples 14-18, where the average luminescence dissymmetry g-factor is between about 1.1 nm and about 0.001 in a wavelength range between about 400 nm and about 800 nm.

Example 20. The composition of any one of Examples 14-19, wherein the chiral molecule is present on the outer surface at a concentration between about 1 molecule/nm$^2$ and about 10 molecules/nm$^2$.

Example 21. The composition of any one of Examples 14-20, wherein the nanocrystalline core has a shape comprising at least one of a cube, a rod, a wire, or a plate.

Example 22. The composition of any one of Examples 14-21, wherein the plate has a thickness between about 0.1 nm and about 5 nm.

Example 23. The composition of any one of Examples 14-22, wherein the functional group is bonded to the first portion of the outer surface by at least one of an ionic bond, a covalent bond, electrostatic interaction, van der Waals forces, or a hydrogen bond.

Example 24. The composition of any one of Examples 14-23, wherein the chiral molecule is bonded to the first portion of the outer surface by at least one of a Z-type ligand interaction, an X-type ligand interaction, or an L-type ligand interaction.

Example 25. The composition of any one of Examples 14-24, wherein the hydrocarbon comprises at least one of a straight chained functional group, a branched functional group, or a ringed functional group.

Example 26. The composition of any one of Examples 14-25, wherein the hydrocarbon is saturated.

Example 27. The composition of any one of Examples 14-26, wherein the hydrocarbon is unsaturated.

Example 28. The composition of any one of Examples 14-27, wherein the hydrocarbon comprises an aromatic ring.

Example 29. The composition of any one of Examples 14-28, wherein the aromatic ring comprises benzene.

Example 30. The composition of any one of Examples 14-29, wherein the chiral molecule comprises at least one of an amino acid (R)-2-octylamine, (S)-2-octylamine, R-methylbenzylammonium, S-methylbenzyleammonium, R-cysteine, S-cysteine, L-canavanine, L-canavanine sulfate salt, L-leucine, L-proline, N-acetyl-D-penicillamine, L-cysteine hydrochloride monohydrate, (R)-(−)-sec-butylamine, (S)-(+)-sec-butylamine, (R)-(−)-2-amino-3-methylbutane, (S)-(+)-2-amino-3-methylbutane, (S)-(+)-3,3-dimethyl-2-butylamine, (R)-(−)-3,3-dimethyl-2-butylamine, (S)-(+)-1-cyclohexylethylamine, (R)-(−)-1-cyclohexylethylamine, R-ethylbenzylamine, S-ethylbenzylamine, sulfobetaine, phosphocholine, (S)-(−)-1-(1-naphthyl)ethylamine, (S)-(+)-1,2,3,4-tetrahydro-1-naphthylamine, (S)-1,2,3,4-tetrahydro-3-isoquinolinecarboxylic acid, (S)-(+)-3-amino-1-boc-piperidine, (S)-(−)-1-(4-bromophenyl)ethylamine, (S)-(+)-1-aminoindan, (S)-1-cyclopropylethylamine, (S)-(−)-3-cyclohexene-1-carboxylic acid, (S)-(−)-1-(2-naphthyl)ethylamine, (S)-1-(2-fluorophenyl)ethylamine, (S)-(−)-1-amino-2-(methoxymethyl)pyrrolidine, (R)-(+)-bornylamine, (S)-1-m-tolylethanamine, (S)-(+)-1-methoxy-2-propylamine, (S)-(+)-1-methyl-3-phenylpropylamine, (S)-(+)-1-amino-2-propanol, (S)-1,4-benzodioxane-2-carboxylic acid, (S)-1,2,3,4-tetrahydro-1-naphthoic acid, (R)-1,2,3,4-tetrahydro-1-naphthoic acid, (R)-(−)-1,2,3,4-tetrahydro-1-naphthylamine, (R)-(+)-1,2-dithiolane-3-pentanoic acid, (S)-1-boc-4-oxopiperidine-2-carboxylic acid, penicillamine, glutathione, oligopeptide, or L-cystathionine.

Example 31. The composition of any one of Examples 14-30, further comprising a second halide interacting with at least one of the outer surface or the chiral molecule.

Example 32. The composition of any one of Examples 14-31, wherein the second halide comprises at least one of bromide, chloride, or iodide.

Example 33. The composition of any one of Examples 14-32, further comprising: a non-chiral molecule, wherein: the non-chiral molecule is bonded to a second portion of the outer surface.

Example 34. The composition of any one of Examples 14-33, wherein the non-chiral molecule comprises at least one of oleylammonium, oleate, a zwitterion, an alkyl halide, a primary alcohol, a secondary alcohol, a tertiary alcohol, an alkylamine, a p-substituted aniline, a phenyl ammonium, a fluorine ammonium, a carboxylic acid, acetic acid, 5-aminosalicylic acid, acrylic acid, L-aspentic acid, 6-bromohexanoic acid, bromoacetic acid, dichloroacetic acid, ethylenediaminetetraacetic acid, isobutyric acid, itaconic acid, maleic acid, r-maleimidobutyric acid, L-malic acid, 4-nitrobenzoic acid, 1-pyrenecarboxylic acid, or oleic acid.

Example 35. The composition of any one of Examples 14-34, wherein the achiral molecule is present on the outer surface at a concentration between about 1 molecule/nm$^2$ and about 10 molecules/nm$^2$.

Example 36. The composition of any one of Examples 14-35, wherein the alkyl halide comprises an acyclic alkyl having a structure of $C_nH_{2n+1}$.

Example 37. The composition of any one of Examples 14-36, wherein the carboxylic acid comprises 4,4'-azobis(4-cyanovaleric acid).

Example 38. The composition of any one of Examples 114-37, wherein the zwitterion comprises sulfobetaine.

Example 39. A device comprising: a first layer comprising a composition; and a second layer comprising a conducting material, wherein: the first layer and the second layer are in physical contact and positioned substantially parallel to each other; the composition comprises: a nanocrystalline core comprising a perovskite and having an outer surface; and a chiral molecule comprising a functional group, wherein: the functional group is bonded to a first portion of the outer surface, and the composition is capable of absorbing circularly polarized luminescence (CPL).

Example 40. The device of Examples 39, wherein: the conducting material comprises at least one of a single-walled carbon nanotube, graphene, $MoS_2$, $MoSe_2$, $WS_2$ and $WSe_2$, hexagonal boron nitride (h-BN), $MX_2$ materials where M comprises at least one of Mo, W, Nb, Re, Ni, or V, and X comprises at least one of S, Se, or Te.

Example 41. A device comprising: a first layer comprising a composition; and a magnetized electrode layer, wherein: the first layer and the magnetized electrode layer are positioned substantially parallel to each other; the composition comprises: a nanocrystalline core comprising a perovskite and having an outer surface; and a chiral molecule comprising a functional group, wherein: the functional group is bonded to a first portion of the outer surface, and the composition is capable of absorbing circularly polarized luminescence (CPL).

Example 42. The device of Example 41, further comprising a spin tunneling buffer layer, wherein the spin tunneling buffer layer is positioned between the magnetized electrode layer and the first layer.

Example 43. The device of either Example 41 or Example 42, further comprising a fourth layer configured to prevent short-circuiting, wherein the first layer is positioned between the fourth layer and the spin tunneling layer.

Example 44. The device of any one of Examples 41-43, further comprising a second electrode, wherein the fourth layer is positioned between the second electrode and the first layer.

Example 45. The device of any one of Examples 41-44, wherein the magnetized electrode layer comprises at least one nickel (Ni), cobalt (Co), iron (Fe), $Fe_2O_3$, $FeOFe_2O_3$, $NiOFe_2O_3$, $CuOFe_2O_3$, $MgOFe_2O_3$, MnBi, $Nd_2Fe_{14}B$, MnSb, $MnOFe_2O_3$, $Y_3Fe_5O_{12}$, $CrO_2$, MnAs, Gd, Tb, Dy, EuO, $NpFe_2$, $NpNi_2$, or $NpCo_2$.

Example 46. The device of any one of Examples 41-45, wherein the spin tunneling buffer layer comprises at least one of $Al_2O_3$, $AlO_x$, AlGaAs, $Fe_3O_4$, MgO, or an insulating polymer.

Example 47. The device of any one of Examples 41-46, wherein fourth layer comprises at least one of molybdenum oxide, bathocuproine, $Alq_3$ (Tris(8-hydroxyquinolinato)aluminium), Balq (Bis(8-hydroxy-2-methylquinoline)-(4-phenylphenoxy)aluminum), Bebq2 (Bis(10-hydroxybenzo[h]quinolinato)beryllium). Bphen (Bathophenanthroline), TPBI (2,2',2"-(1,3,5-Benzinetriyl)-tris(1-phenyl-1-H-benzimidazole), 3-(biphenyl-4-yl)-5-(4-tertbutylphenyl)-4-phenyl-4H-1,2,4-triazole (TAZ), Tris(2,4,6-trimethyl-3-(pyridin-3-yl)phenyl)borane (3TPYMB), BP4MPy (3,3',5,5'-tetra[(M-pyridyl)-phen-3-yl]biphenyl(1009033-94-6)), Tm3PyPB (1,3,5-Tri(m-pyridin-3-ylphenyl)benzene, 1,3,5-Tris(3-pyridin-3-phenyl)benzene), Tm3PyPB (1,3,5-Tri(m-pyridin-3-ylphenyl)benzene, 1,3,5-Tris(3-pyridyl-3-phenyl) benzene), Bebq2 (Bis(10-hydroxybenzo[h]quinolinato) beryllium), Tris(4-carbazoyl-9-ylphenyl)amine (TCTA), 4,4'-Bis(N-carbazolyl)-1,1'-biphenyl (CBP), N,N'-Di(1-naphthyl)-N,N'-diphenyl-(1,1'-biphenyl)-4,4'-diamine (NPB), or 1,1-Bis[(di-4-tolylamino)phenyl]cyclohexane (TAPC).

Example 48. The device of any one of Examples 41-47, wherein the second electrode comprises at least one of aluminum, Ag, Au, Mg, or a Mg—Ag alloy.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A composition comprising:
    a nanocrystalline core comprising a perovskite having an outer surface;
    a chiral molecule comprising a functional group and a second group; and
    a halide, wherein:
    the perovskite comprises at least one of $FAPb(X_yX'_zX''_{1-y-z})_3$, $CsPb(X_yX'_zX''_{1-y-z})_3$, $MAPb(X_yX'_zX''_{1-y-z})_3$, or $Cs_{1-u-v}MA_uFA_vPb(X_yX'_zX''_{1-y-z})_3$,
    X comprises at least one of iodide, bromide, or chloride,
    X' comprises at least one of iodide, bromide, or chloride and is different than X,
    X" comprises at least one of iodide, bromide, or chloride and is different than X and X',
    $0 \le z \le 1$, $0 \le y \le 1$, $0 \le u \le 1$, $0 \le v \le 1$,
    the functional group comprises an amine group,
    the second group comprises a hydrocarbon having between 3 and 30 carbon atoms,
    the functional group is bonded to a first portion of the outer surface,
    the halide interacts with at least one of the outer surface or with the chiral molecule, and
    the composition is capable of circularly polarized luminescence (CPL).

2. The composition of claim 1, wherein the nanocrystalline core has a characteristic length between about 1 nm and about 1000 nm.

3. The composition of claim 1, wherein the CPL has an average luminescence dissymmetry g-factor between about 1.0 and about 0.0001 in a wavelength range between about 400 nm and about 1000 nm.

4. The composition of claim 1, wherein the chiral molecule is present on the outer surface at a concentration between about 1 molecule/nm$^2$ and about 10 molecules/nm$^2$.

5. The composition of claim 1, wherein the second group comprises a hydrocarbon comprising at least one of a straight chained functional group, a branched functional group, or a ringed functional group.

6. The composition of claim 1, wherein the halide comprises at least one of bromide, chloride, or iodide.

7. The composition of claim 1, wherein the nanocrystalline core has a shape comprising at least one of a cube, a rod, a wire, or a plate.

8. The composition of claim 1, wherein the chiral molecule comprises at least one of (R)-2-octylamine, (S)-2-octylamine, R-methylbenzylammonium, S-methylbenzyleammonium, R-cysteine, S-cysteine, L-canavanine, L-canavanine sulfate salt, L-leucine, L-proline, N-acetyl-D-penicillamine, L-cysteine hydrochloride monohydrate, (R)-(−)-sec-butylamine, (S)-(+)-sec-butylamine, (R)-(−)-2-amino-3-methylbutane, (S)-(+)-2-amino-3-methylbutane, (S)-(+)-3,3-dimethyl-2-butylamine, (R)-(−)-3,3-dimethyl-2-butylamine, (S)-(+)-1-cyclohexylethylamine, (R)-(−)-1-cyclohexylethylamine, R-ethylbenzylamine, S-ethylbenzylamine, sulfobetaine, phosphocholine, (S)-(−)-1-(1-naphthyl) ethylamine, (S)-(+)-1,2,3,4-tetrahydro-1-naphthylamine, (S)-1,2,3,4-tetrahydro-3-isoquinolinecarboxylic acid, (S)-(+)-3-amino-1-boc-piperidine, (S)-(−)-1-(4-bromophenyl) ethylamine, (S)-(+)-1-aminoindan, (S)-1-cyclopropylethylamine, (S)-(−)-3-cyclohexene-1-carboxylic acid, (S)-(−)-1-(2-naphthyl)ethylamine, (S)-1-(2-fluorophenyl)ethylamine, (S)-(−)-1-amino-2-(methoxymethyl)pyrrolidine, (R)-(+)-bornylamine, (S)-1-m-tolylethanamine, (S)-(+)-1-methoxy-2-propylamine, (S)-(+)-1-methyl-3-phenylpropylamine, (S)-(+)-1-amino-2-propanol, (S)-1,4-benzodioxane-2-carboxylic acid, (S)-1,2,3,4-tetrahydro-1-naphthoic acid, (R)-1,2,3,4-tetrahydro-1-naphthoic acid, (R)-(−)-1,2,3,4-tetrahydro-1-naphthylamine, (R)-(+)-1,2-dithiolane-3-pentanoic acid, (S)-1-boc-4-oxopiperidine-2-carboxylic acid, penicillamine, glutathione, oligopeptide, or L-cystathionine.

9. The composition of claim 1, further comprising:
 a non-chiral molecule, wherein:
 the non-chiral molecule is bonded to a second portion of the outer surface.

10. The composition of claim 9, wherein the non-chiral molecule is present on the outer surface at a concentration between about 1 molecule/nm$^2$ and about 10 molecules/nm$^2$.

11. The composition of claim 9, wherein the non-chiral molecule comprises at least one of oleylammonium, oleate, a zwitterion, an alkyl halide, a primary alcohol, a secondary alcohol, a tertiary alcohol, an alkylamine, a p-substituted aniline, a phenyl ammonium, a fluorine ammonium, a carboxylic acid, acetic acid, 5-aminosalicylic acid, acrylic acid, L-aspentic acid, 6-bromohexanoic acid, bromoacetic acid, dichloroacetic acid, ethylenediaminetetraacetic acid, isobutyric acid, itaconic acid, maleic acid, r-maleimidobutyric acid, L-malic acid, 4-nitrobenzoic acid, 1-pyrenecarboxylic acid, or oleic acid.

12. The composition of claim 11, wherein the alkyl halide comprises an acyclic alkyl having a structure of $C_nH_{2n+1}$.

13. The composition of claim 11, wherein the carboxylic acid comprises 4,4'-azobis(4-cyanovaleric acid).

14. The composition of claim 11, wherein the zwitterion comprises sulfobetaine.

\* \* \* \* \*